(12) United States Patent
Kato

(10) Patent No.: US 10,580,798 B2
(45) Date of Patent: Mar. 3, 2020

(54) SEMICONDUCTOR DEVICE

(71) Applicant: Semiconductor Energy Laboratory Co., Ltd., Kanagawa-ken (JP)

(72) Inventor: Kiyoshi Kato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 145 days.

(21) Appl. No.: 15/404,771

(22) Filed: Jan. 12, 2017

(65) Prior Publication Data

US 2017/0207244 A1   Jul. 20, 2017

(30) Foreign Application Priority Data

Jan. 15, 2016   (JP) .................. 2016-005991

(51) Int. Cl.
*H01L 29/786* (2006.01)
*H01L 27/12* (2006.01)
(Continued)

(52) U.S. Cl.
CPC .......... *H01L 27/1225* (2013.01); *G11C 5/145* (2013.01); *G11C 11/24* (2013.01);
(Continued)

(58) Field of Classification Search
CPC . H01L 27/1225; H01L 27/1255; H01L 29/24; H01L 27/1052; H01L 27/10805;
(Continued)

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP   1 737 044 A1   12/2006
EP   2 226 847 A2   9/2010
(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(Continued)

*Primary Examiner* — Steven H Loke
*Assistant Examiner* — Samuel Park
(74) *Attorney, Agent, or Firm* — Husch Blackwell LLP

(57) ABSTRACT

A semiconductor device that can retain data for a long time is provided. The semiconductor device includes a first transistor and a second transistor. The first transistor contains an oxide semiconductor in a channel formation region. The second transistor includes a first gate and a second gate. A gate of the first transistor is connected to a first electrode of the first transistor. The first electrode of the first transistor is connected to the second gate. A negative potential is applied to a second electrode of the first transistor. The first electrode and the second electrode of the first transistor include a first end portion and a second end portion, respectively. The first end portion and the second end portion face each other. The first end portion includes a first arc and the second end portion includes a second arc when seen from the top. The radius of curvature of the second arc is larger than that of the first arc.

12 Claims, 41 Drawing Sheets

(51) Int. Cl.
*G11C 5/14* (2006.01)
*G11C 11/401* (2006.01)
*H01L 29/423* (2006.01)
*G11C 11/24* (2006.01)
*H01L 27/105* (2006.01)
*H01L 27/108* (2006.01)
*H01L 29/04* (2006.01)
*H01L 29/24* (2006.01)
*H01L 29/49* (2006.01)
*H01L 29/66* (2006.01)
*G11C 11/412* (2006.01)
*G11C 11/404* (2006.01)
*H02M 3/07* (2006.01)

(52) U.S. Cl.
CPC ........ *G11C 11/401* (2013.01); *H01L 27/1052* (2013.01); *H01L 27/10805* (2013.01); *H01L 27/1255* (2013.01); *H01L 27/1259* (2013.01); *H01L 29/04* (2013.01); *H01L 29/24* (2013.01); *H01L 29/42384* (2013.01); *H01L 29/4908* (2013.01); *H01L 29/66969* (2013.01); *H01L 29/7869* (2013.01); *H01L 29/78648* (2013.01); *G11C 11/404* (2013.01); *G11C 11/412* (2013.01); *H02M 3/07* (2013.01); *H02M 2003/072* (2013.01)

(58) Field of Classification Search
CPC . H01L 27/1259; H01L 29/04; H01L 29/4908; H01L 29/66969; H01L 29/78648; H01L 29/7869; G11C 5/145; G11C 11/401; G11C 11/24; G11C 11/404; H02M 2003/072; H02M 3/07
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,737,109 B2 | 5/2014 | Yamazaki et al. |
| 9,024,317 B2 | 5/2015 | Endo et al. |
| 9,076,505 B2 | 7/2015 | Atsumi et al. |
| 9,385,592 B2 | 7/2016 | Watanabe et al. |
| 9,449,706 B2 | 9/2016 | Yamazaki et al. |
| 9,461,179 B2 | 10/2016 | Kobayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0134422 A1 | 5/2013 | Tsubuku |
| 2013/0140554 A1* | 6/2013 | Yamazaki ............. H01L 29/786 257/43 |
| 2013/0200366 A1 | 8/2013 | Koyama et al. |
| 2013/0200367 A1 | 8/2013 | Yamazaki et al. |
| 2013/0207101 A1* | 8/2013 | Yamazaki ......... H01L 29/41733 257/43 |
| 2013/0240872 A1 | 9/2013 | Noda |
| 2014/0361293 A1* | 12/2014 | Yamazaki ........... H01L 29/7869 257/43 |
| 2015/0171117 A1 | 6/2015 | Endo et al. |
| 2015/0372146 A1 | 12/2015 | Shishido et al. |
| 2015/0381036 A1 | 12/2015 | Watanabe et al. |
| 2016/0336068 A1 | 11/2016 | Yamazaki et al. |

(56) References Cited

U.S. PATENT DOCUMENTS

| | | |
|---|---|---|
| 2017/0005202 A1 | 1/2017 | Kobayashi et al. |
| 2017/0179294 A1 | 6/2017 | Kato et al. |
| 2017/0186749 A1 | 6/2017 | Ohshima et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-069932 A | 4/2012 |
| JP | 2012-146965 A | 8/2012 |
| JP | 2013-168631 A | 8/2013 |
| JP | 2015-164386 A | 9/2015 |
| WO | WO 2004/114391 A1 | 12/2004 |

OTHER PUBLICATIONS

Cho, D-H. et al., "21.2:Al and Sn-Doped Zinc Indium Oxide Thin Film Transistors for AMOLED Back-Plane," SID Digest '09: SID International Symposium Digest of Technical Papers, May 31, 2009, pp. 280-283.

Clark, S.J. et al., "First Principles Methods Using CASTEP," Zeitschrift fur Kristallographie, 2005, vol. 220, pp. 567-570.

Coates, D. et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M.J. et al., "Electron Microscopy of a Cholesteric Liquid Crystal and Its Blue Phase," Physical Review. A, May 1, 1984, vol. 29, No. 5, pp. 2957-2959.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E.M.C. et al., "Wide-Bandgap High-Mobility Zno Thin-Film Transistors Produced at Room Temperature," Applied Physics Letters, Sep. 27, 2004, vol, 85, No. 13, pp. 2541-2543.

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H. et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Hirao, T. et al., "Novel Top-Gate Zinc Oxide Thin-Film Transistors (ZnO TFTs) for AMLCDs," Journal of the Society for Information Display, 2007, vol. 15, No. 1, pp. 17-22.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Janotti, A. et al., "Native Point Defects in ZnO," Physical Review. B, Oct. 4, 2007, vol. 76, No. 16, pp. 165202-1-165202-22.

Janotti, A. et al., "Oxygen Vacancies in ZnO," Applied Physics Letters, 2005, vol. 87, pp. 122102-1-122102-3.

Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D-U. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H. et al., "White Stacked Electrophosphorecent Organic Light-Emitting Devices Employing MoO3 as a Charge-Generation Layer," Advanced Materials, 2006, vol. 18, No. 3, pp. 339-342.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp 1737-1740.

Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.

Kimizuka, N. et al., "Spinel,YbFe2O4, and Yb2Fe3O7 Types of Structures for Compounds in the In2O3 and Sc2O3—A2O3—BO Systems [A; Fe, Ga, Or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H-S. et al., "Observation of Blue Phases in Chiral Networks," Liquid Crystals, 1993, vol. 14, No. 3, pp. 911-916.

Kurokawa, Y. et al., "UHF RFCPUS on Flexible and Glass Substrates for Secure RFID Systems," Journal of Solid-State Circuits , 2008, vol. 43, No. 1, pp. 292-299.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Lee, H.N. et al., "Current Status of, Challenges to, and Perspective View of AM-OLED," IDW '06: Proceedings of the 13th International Display Workshops, Dec. 7, 200, pp. 663-666.

Lee, J-H. et al., "World's Largest (15-Inch) XGA AMLCD Panel Using IGZO Oxide TFT," SID Digest '08: SID International-Symposium Digest of Technical Papers, May 26, 2008, vol. 39, pp. 625-628.

Lee, M-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.

(56) References Cited

OTHER PUBLICATIONS

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "SUFTLA Flexible Microelectronics on Their Way to Business," SID Digest '07: SID International Symposium Digest of Technical Papers, 2007, vol. 38, pp. 1673-1676.

Mo, Y-G. et al., "Amorphous Oxide TFT Backplanes for Large Size AMOLED Displays," IDW '08: Proceedings of the 6th International Display Workshops, Dec. 3, 2008, pp. 581-584.

Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

Nakamura, M., "Synthesis of Homologous Compound with New Long-Period Structure," NIRIM Newsletter, Mar. 1, 1995, vol. 150, pp. 1-4.

Nomura, K. et al., "Amorphous Oxide Semiconductors for High-Performance Flexible Thin-Fllm Transistors," Japanese Journal of Applied Physics, 2006, vol. 45, No. 58, pp. 4303-4308.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995, Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3: 4.0 In. QVGA AMOLED Display Using In—Ga—Zn-Oxide TFTs With a Novel Passivation Layer," SID Digest '09: SID International Symposium Digest of Technical Papers, May 31, 2009, pp. 284-287.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn-Oxide TFT," SID Digest '09: SID International Sympdsium Digest of Technical Papers, May 31, 2009, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by Peald Grown ZnO TFT," IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Son, K-S. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C.G., "Hydrogen as a Cause of Doping in Zinc Oxide," Physical Review Letters, Jul. 31, 2000, vol. 85, No. 5, pp. 1012-1015.

* cited by examiner

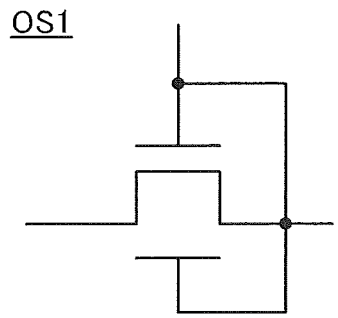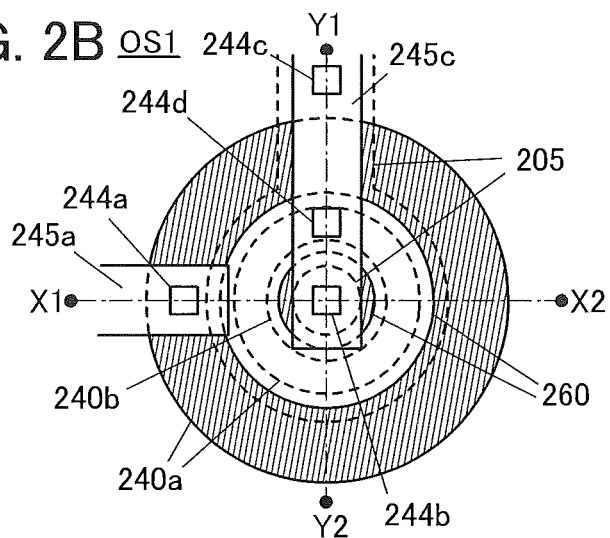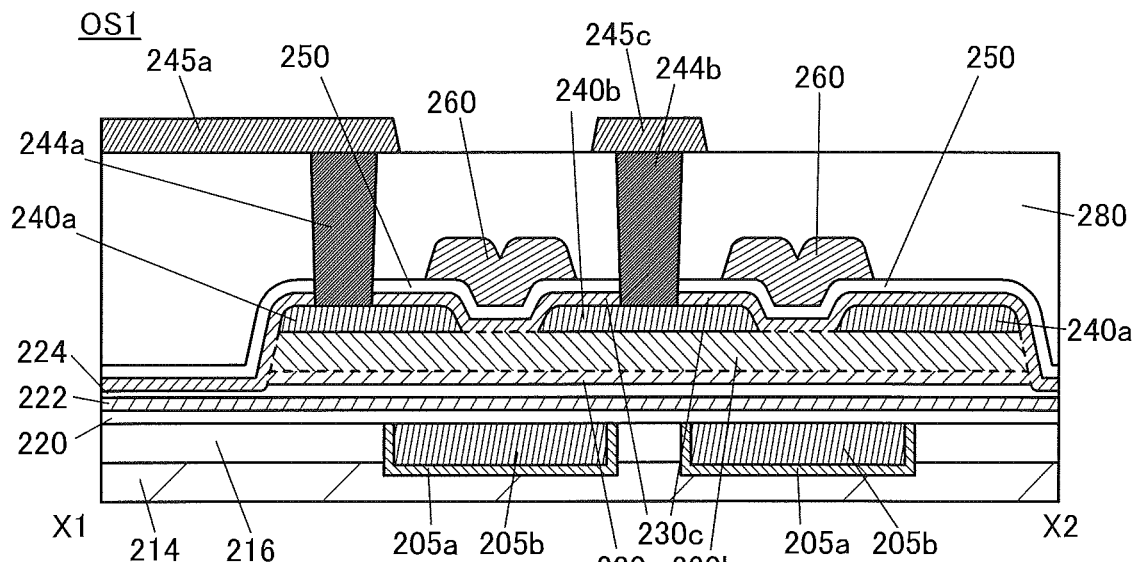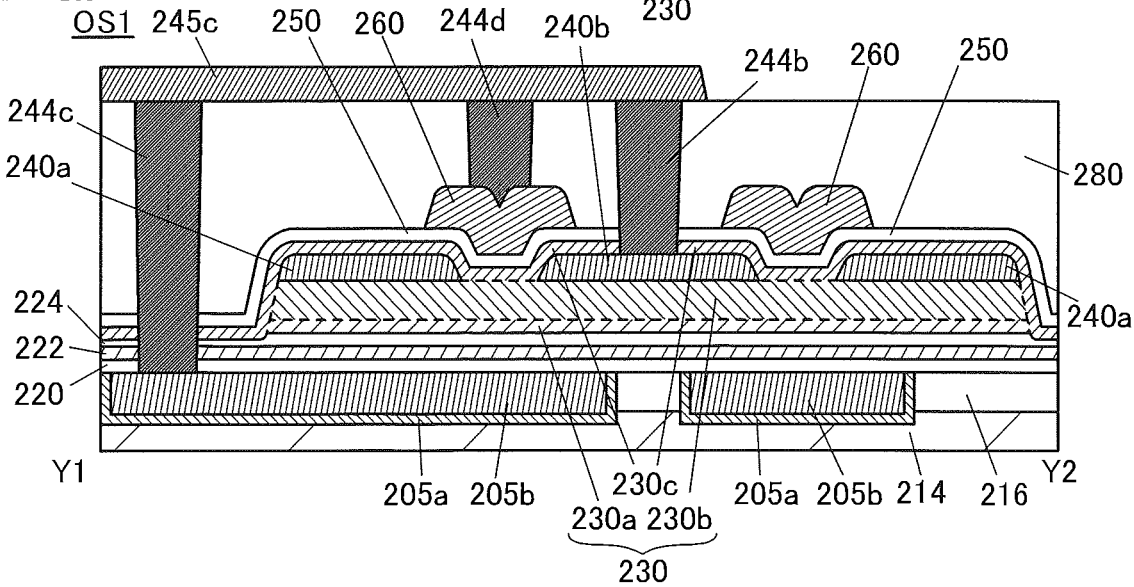

100

101

102

103

104

105

130

180

185

750 PLD

SEMICONDUCTOR DEVICE

BACKGROUND OF THE INVENTION

1. Field of the Invention

One embodiment of the present invention relates to a semiconductor device.

One embodiment of the present invention relates to an object, a method, and a manufacturing method. In addition, one embodiment of the present invention relates to a process, a machine, manufacture, and a composition of matter. One embodiment of the present invention relates to a driving method of a semiconductor device, or a manufacturing method of the semiconductor device.

In this specification and the like, a semiconductor device generally means a device that can function by utilizing semiconductor characteristics. In some cases, a memory device, a display device, an electro-optical device, a semiconductor circuit, or an electronic device includes a semiconductor device.

2. Description of the Related Art

A transistor in which an oxide semiconductor (OS) is contained in its channel formation region (hereinafter such a transistor is referred to as an OS transistor) is known. A variety of semiconductor devices including OS transistors have been proposed.

Patent Document 1 discloses an example in which an OS transistor is used in a dynamic random access memory (DRAM). The OS transistor has extremely low leakage current in an off state (off-state current); thus, a DRAM having a low refresh frequency and low power consumption can be fabricated.

Patent Document 2 discloses a nonvolatile memory including an OS transistor. Unlike flash memories, nonvolatile memories have unlimited cycling capability, can easily operate at high speed, and consume less power.

In such memories including OS transistors, an increase in the threshold voltage of the OS transistors can reduce the off-state current and thus can improve data retention characteristics of the memories. Patent Document 2 discloses an example in which an OS transistor has a second gate (also referred to as a back gate) to control the threshold voltage of the OS transistor so that the off-state current is reduced.

For long-term data retention of the memory, a constant negative potential needs to be continuously applied to the second gate of the OS transistor. Patent Documents 2 and 3 each disclose a configuration example of a circuit for driving a second gate of an OS transistor.

Patent Document 4 discloses a method in which a negative potential is generated by a charge pump and is applied to a second gate of an OS transistor.

REFERENCE

Patent Documents

[Patent Document 1] Japanese Published Patent Application No. 2013-168631
[Patent Document 2] Japanese Published Patent Application No. 2012-069932
[Patent Document 3] Japanese Published Patent Application No. 2012-146965
[Patent Document 4] Japanese Published Patent Application No. 2015-164386

SUMMARY OF THE INVENTION

An object of one embodiment of the present invention is to provide a semiconductor device capable of long-term data retention. Another object of one embodiment of the present invention is to provide a semiconductor device capable of reducing power consumption. Another object of one embodiment of the present invention is to provide a novel semiconductor device.

Note that the description of a plurality of objects does not mutually preclude their existence. One embodiment of the present invention does not necessarily achieve all the objects listed above. Objects other than those listed above are apparent from the description of the specification, drawings, and claims, and such objects could also be an object of one embodiment of the present invention.

One embodiment of the present invention is a semiconductor device including a first transistor and a second transistor. The first transistor contains an oxide semiconductor in a channel formation region. The second transistor includes a first gate and a second gate. The first gate and the second gate overlap with each other with a semiconductor layer positioned therebetween. A gate of the first transistor is electrically connected to a first electrode of the first transistor. The first electrode of the first transistor is electrically connected to the second gate. A negative potential is applied to a second electrode of the first transistor. The first electrode of the first transistor includes a first end portion. The second electrode of the first transistor includes a second end portion. The first end portion and the second end portion face each other. The first end portion includes a first arc when seen from the top. The second end portion includes a second arc when seen from the top. A radius of curvature of the second arc is larger than a radius of curvature of the first arc.

One embodiment of the present invention is a semiconductor device including a first transistor and a second transistor. The first transistor contains an oxide semiconductor in a channel formation region. The second transistor includes a first gate and a second gate. The first gate and the second gate overlap with each other with a semiconductor layer positioned therebetween. A gate of the first transistor is electrically connected to a first electrode of the first transistor. The first electrode of the first transistor is electrically connected to the second gate. A negative potential is applied to a second electrode of the first transistor. The first electrode of the first transistor includes a first end portion. The second electrode of the first transistor includes a second end portion. The first end portion and the second end portion face each other. The first end portion includes a first arc when seen from the top. The second end portion includes a second arc when seen from the top. A radius of curvature of the first arc is larger than a radius of curvature of the second arc.

One embodiment of the present invention is a semiconductor device including a first transistor, a second transistor, a third transistor, a first capacitor, a second capacitor, and a resistor. The first transistor contains an oxide semiconductor in a channel formation region. The third transistor includes a first gate and a second gate. The first gate and the second gate overlap with each other with a semiconductor layer positioned therebetween. A gate of the first transistor is electrically connected to a first electrode of the first capacitor. A first electrode of the first transistor is electrically connected to the second gate. A negative potential is applied to a second electrode of the first transistor. A gate of the second transistor is electrically connected to a first electrode of the second capacitor. The gate of the second transistor is electrically connected to a first electrode of the second transistor through the resistor. The first electrode of the second transistor is electrically connected to the second gate.

A second electrode of the second transistor is electrically connected to the gate of the first transistor. The first electrode of the first transistor includes a first end portion. The second electrode of the first transistor includes a second end portion. The first end portion and the second end portion face each other. The first end portion includes a first arc when seen from the top. The second end portion includes a second arc when seen from the top. A radius of curvature of the second arc is larger than a radius of curvature of the first arc.

One embodiment of the present invention is a semiconductor device including a first transistor, a second transistor, a third transistor, a first capacitor, a second capacitor, and a resistor. The first transistor contains an oxide semiconductor in a channel formation region. The third transistor includes a first gate and a second gate. The first gate and the second gate overlap with each other with a semiconductor layer positioned therebetween. A gate of the first transistor is electrically connected to a first electrode of the first capacitor. A first electrode of the first transistor is electrically connected to the second gate. A negative potential is applied to a second electrode of the first transistor. A gate of the second transistor is electrically connected to a first electrode of the second capacitor. The gate of the second transistor is electrically connected to a first electrode of the resistor. The first electrode of the second transistor is electrically connected to the second gate. A second electrode of the second transistor is electrically connected to the gate of the first transistor. The first electrode of the first transistor includes a first end portion. The second electrode of the first transistor includes a second end portion. The first end portion and the second end portion face each other. The first end portion includes a first arc when seen from the top. The second end portion includes a second arc when seen from the top. A radius of curvature of the first arc is larger than a radius of curvature of the second arc.

In any of the above embodiments, the first transistor preferably includes a third gate. The third gate and the gate of the first transistor overlap with each other with the oxide semiconductor positioned therebetween. The third gate preferably contains an In—Ga—Zn oxide to which nitrogen is added.

One embodiment of the present invention is a semiconductor wafer including a plurality of any of the above semiconductor devices and a separation region.

One embodiment of the present invention is an electronic device including any of the above semiconductor devices and a display device, a microphone, a speaker, an operation key, or a housing.

According to one embodiment of the present invention, a semiconductor device capable of long-term data retention can be provided. According to one embodiment of the present invention, a semiconductor device capable of reducing power consumption can be provided. According to one embodiment of the present invention, a novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIGS. 2A to 2D are a circuit diagram, a top view, and cross-sectional views illustrating a structure example of a transistor.

DETAILED DESCRIPTION OF THE INVENTION

Figure 1A:
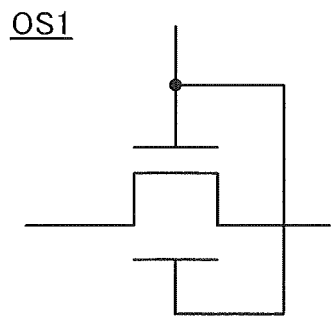
FIGS. 1A to 1D are a circuit diagram, a top view, and cross-sectional views illustrating a structure example of a transistor.

Embodiments according to the present invention will be described in detail with reference to the accompanying drawings. It will be readily appreciated by those skilled in the art that modes and details of the present invention can be modified in various ways without departing from the spirit and scope of the present invention. Therefore, the invention should not be limited to the descriptions of the embodiments below.

Note that in structures of the present invention described below, the same portions or portions having similar functions are denoted by the same reference numerals in different drawings, and a description thereof is not repeated. Further, the same hatching pattern is applied to portions having similar functions, and the portions are not denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

In this specification, the threshold voltage of a transistor is sometimes referred to as $V_{th}$. Unless otherwise specified, the on-state current in this specification refers to drain current of a transistor in an on state. Unless otherwise specified, the on state of an n-channel transistor means that the voltage between its gate and source ($V_G$) is higher than or equal to $V_{th}$, and the on state of a p-channel transistor means that $V_G$ is lower than or equal to $V_{th}$. For example, the on-state current of an n-channel transistor refers to drain current that flows when $V_G$ is higher than or equal to $V_{th}$. The on-state current of a transistor depends on a voltage $V_D$ between a drain and a source in some cases.

Unless otherwise specified, the off-state current in this specification refers to drain current of a transistor in the off state. Unless otherwise specified, the off state of an n-channel transistor means that $V_G$ is lower than $V_{th}$, and the off state of a p-channel transistor means that $V_G$ is higher than $V_{th}$. For example, the off-state current of an n-channel transistor refers to drain current that flows when $V_G$ is lower than $V_{th}$. The off-state current of a transistor depends on $V_G$ in some cases. Thus, "the off-state current of a transistor is lower than $10^{-21}$ A" may mean there is $V_G$ at which the off-state current of the transistor is lower than $10^{-21}$ A.

The off-state current of a transistor depends on $V_D$ in some cases. Unless otherwise specified, the off-state current in this specification may be off-state current at $V_D$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at $V_D$ used in a semiconductor device or the like including the transistor.

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification, a high power supply potential is referred to as an H level (or $V_{DD}$), and a low power supply potential is referred to as an L level (or GND), in some cases.

Furthermore, in the present specification, any of the embodiments described below can be combined as appropriate. In addition, in the case where a plurality of structure examples are described in one embodiment, some of the structure examples can be combined as appropriate.

(Embodiment 1)

In this embodiment, a transistor of one embodiment of the present invention and a circuit configuration of a semiconductor device including the transistor will be described.

<<Transistor OS1>>

Figure 1B:
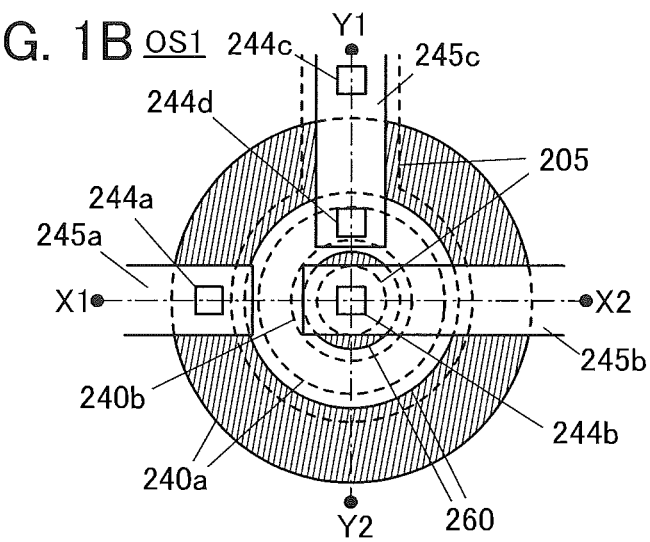
Figure 1C:
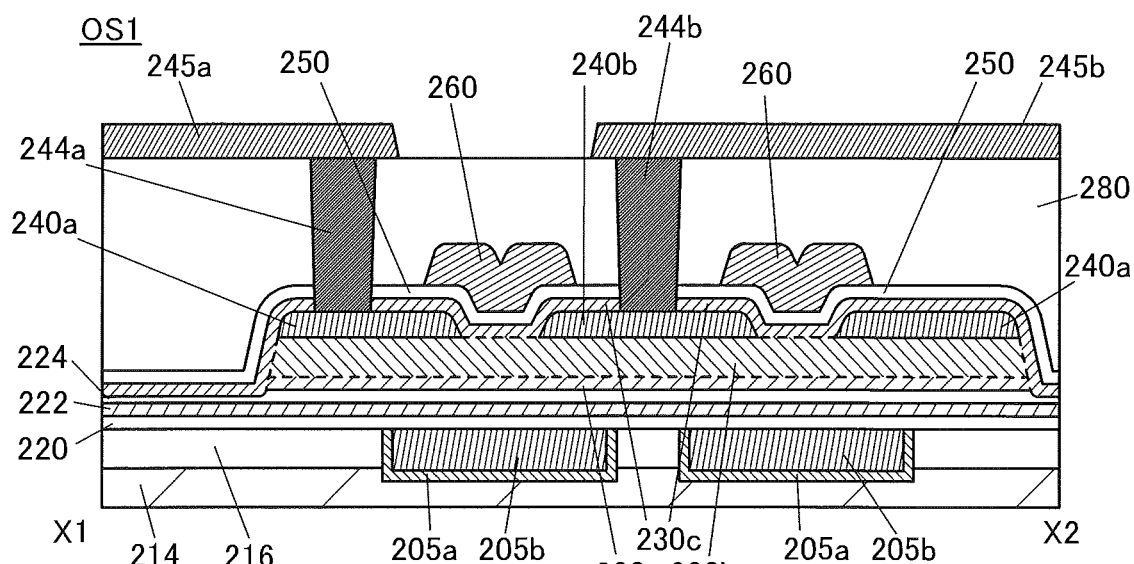
Figure 1D:
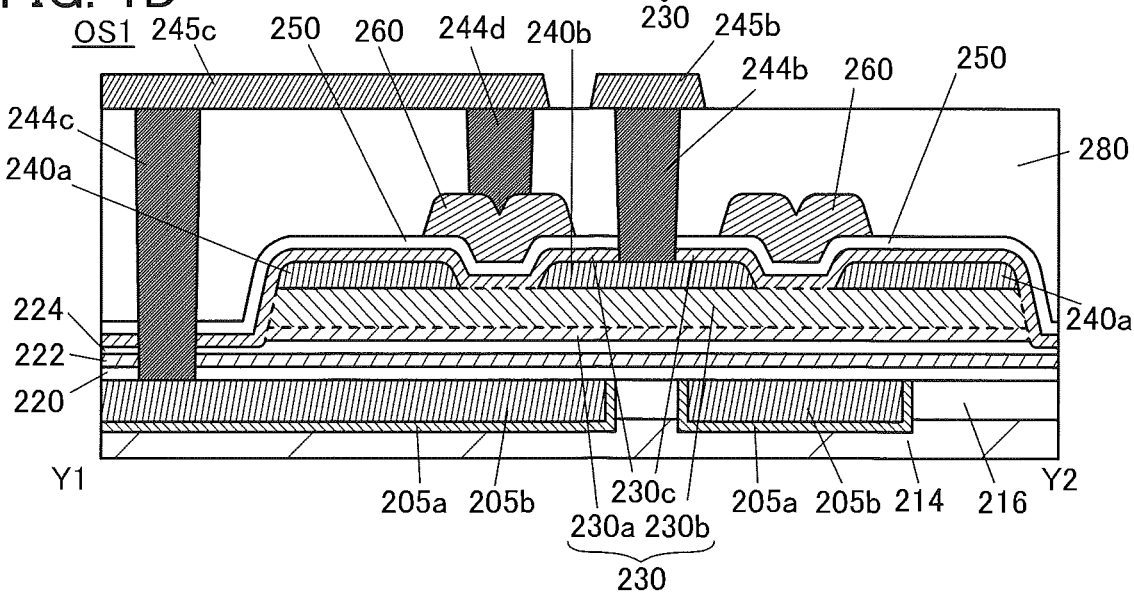

FIGS. 1A to 1D are a circuit diagram, a top view, and cross-sectional views of a transistor OS1. FIG. 1A is a circuit diagram, FIG. 1B is a top view, and FIGS. 1C and 1D are cross-sectional views. FIG. 1C is the cross-sectional view taken along dashed-dotted line X1-X2 in FIG. 1B. FIG. 1D is the cross-sectional view taken along dashed-dotted line Y1-Y2 in FIG. 1B. For simplification of the drawing, some components are not illustrated in the top view of FIG. 1B.

The transistor OS1 is an OS transistor containing an oxide semiconductor in its channel formation region. In the following description, the transistor OS1 is described as an n-channel transistor.

FIGS. 1C and 1D illustrate an example where the transistor OS1 is provided over an insulator 214 and an insulator 216.

The transistor OS1 includes a conductor 260 functioning as a first gate electrode, a conductor 205 (a conductor 205a and a conductor 205b) functioning as a second gate electrode, insulators 220, 222, 224, and 250 functioning as gate insulating layers, an oxide semiconductor 230 (an oxide semiconductor 230a, an oxide semiconductor 230b, and an oxide semiconductor 230c), a conductor 240a functioning as one of a source and a drain, a conductor 240b functioning as the other of the source and the drain, and an insulator 280.

A wiring 245a, a wiring 245b, and a wiring 245c are provided over the insulator 280. In addition, a conductor 244a, a conductor 244b, a conductor 244c, and a conductor 244d are provided for electrically connecting these wirings to the conductors 240a, 240b, 260, and 205. The conductors 244a, 244b, 244c, and 244d function as plugs.

The conductor 260 and the conductor 205 overlap with each other with the oxide semiconductor 230 positioned therebetween. The conductor 260 and the conductor 205 are electrically connected to each other.

The oxide semiconductor 230 includes the oxide semiconductor 230a, the oxide semiconductor 230b over the oxide semiconductor 230a, and the oxide semiconductor 230c over the oxide semiconductor 230b. When the transistor OS1 is turned on, current flows mainly in the oxide semiconductor 230b. This means that the oxide semiconductor 230b functions as a channel formation region. Although current sometimes flows through regions (mixed regions in some cases) which are in the oxide semiconductors 230a and 230c and in the vicinity of the interfaces with the oxide semiconductor 230b, the other regions of the oxide semiconductors 230a and 230c function as insulators in some cases.

Insulators provided near the oxide semiconductor 230 such as the insulators 224, 250, and 280 preferably contain oxygen. It is particularly preferable to use insulators containing excess oxygen (containing oxygen in excess of that in the stoichiometric composition). When such an insulator containing excess oxygen is provided near the oxide semiconductor 230, oxygen vacancies in the oxide semiconductor 230 can be can be compensated.

As illustrated in FIG. 1B, when seen from the top of the transistor OS1, the conductor 240a has a doughnut shape and the conductor 240b has a circular shape. The circular conductor 240b is positioned in the hole in the conductor 240a. The doughnut-shaped conductor 240a and the circular conductor 240b have the same center.

An end portion of the conductor 240a (a first end portion) and an end portion of the conductor 240b (a second end portion), which face each other, are described. When seen from the top of the transistor OS1, the first end portion has a first arc and the second end portion has a second arc. The radius of curvature of the first arc is larger than the radius of curvature of the second arc. The distance between the first end portion and the second end portion corresponds to the channel length of the transistor OS1. According to the above, end portions of the source electrode and the drain electrode of the transistor OS1 each has an arc.

As mentioned in Description of the Related Art, OS transistors are known to have low off-state current. However, when an end portion of a source or drain electrode of an OS transistor has a corner, an electric field concentrates at the corner and leakage current flows therethrough. This is a serious problem particularly for circuits that require extremely low leakage current, such as a voltage holding circuit described later.

Figure 40A:
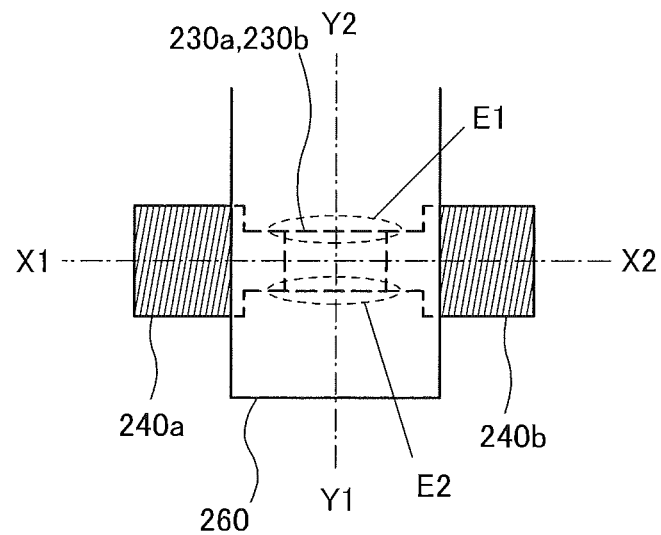
FIGS. 40A to 40C are a top view and cross-sectional views illustrating a structure example of a transistor.
Figure 40B:
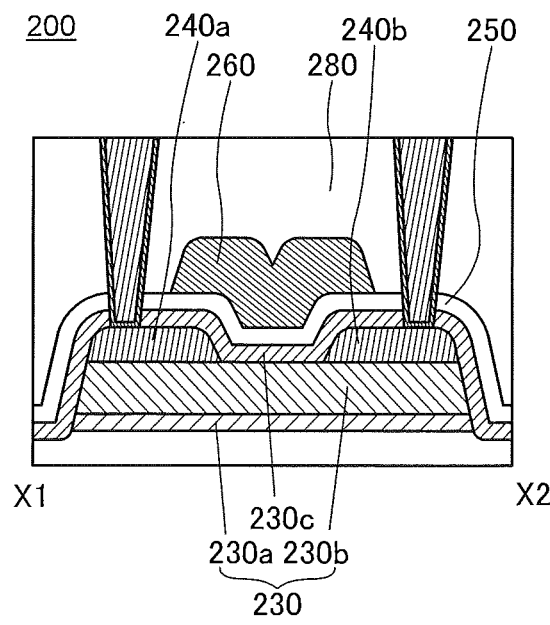
Figure 40C:
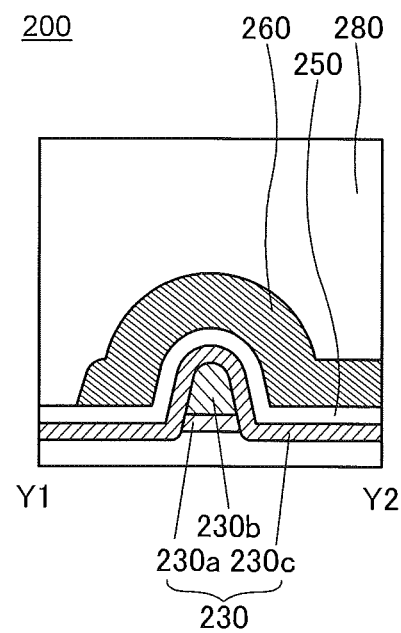

FIGS. 40A to 40C are a top view and cross-sectional views of a transistor 200. FIG. 40A is a top view. FIG. 40B is the cross-sectional view taken along dashed-dotted line X1-X2 in FIG. 40A. FIG. 40C is the cross-sectional view taken along dashed-dotted line Y1-Y2 in FIG. 40A. For simplification of the drawing, some components are not illustrated in the top view of FIG. 40A.

In the transistor 200 illustrated in FIG. 40A, a source electrode and a drain electrode face parallel to each other, and the oxide semiconductors 230a and 230b have an end portion E1 and an end portion E2 extending in the direction perpendicular to the dashed-dotted line Y1-Y2. The end portion E1 and the end portion E2 are formed by etching of the oxide semiconductors 230a and 230b, and process damage during the etching might cause the formation of an interface state between the end portion E1 and the insulator 250 or between the end portion E2 and the insulator 250. As a result, leakage current easily flows between the source electrode and the drain electrode through the end portion E1 or the end portion E2 serving as a path.

In the transistor OS1 illustrated in FIGS. 1A to 1D, the end portions of the source electrode and the drain electrode do not have a corner but have arcs; thus, the electric field concentration described above can be prevented and leakage current can be reduced.

Furthermore, in the transistor OS1 illustrated in FIGS. 1A to 1D, the oxide semiconductors 230a and 230b do not have an end portion between the source electrode and the drain electrode; thus, leakage current can be reduced.

According to the above, the transistor OS1 can be regarded to have extremely low off-state current. Thus, the transistor OS1 is suitably used for circuits that require extremely low leakage current, such as a voltage holding circuit described later.

Next, the conductor 205 and the conductor 260 functioning as gate electrodes will be described in detail.

Each of the conductor 205 and the conductor 260 can be formed using a metal containing an element selected from molybdenum, titanium, tantalum, tungsten, aluminum, copper, manganese, chromium, neodymium, and scandium; an alloy of any of the above metals, or a metal nitride containing any of the above elements as its component (e.g., titanium nitride, molybdenum nitride, or tungsten nitride).

Each of the conductor 205 and the conductor 260 can be formed using a conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added.

Each of the conductor 205 and the conductor 260 can be formed using a semiconductor typified by polycrystalline silicon doped with an impurity element such as phosphorus, or a silicide such as nickel silicide.

For example, tantalum nitride or the like that has a barrier property against hydrogen may be used for the conductor 205a, and tungsten, which has high conductivity, may be stacked thereover as the conductor 205b. This combination can prevent diffusion of hydrogen into the oxide semiconductor 230 while conductivity of a wiring is ensured. Although a two-layer structure of the conductor 205a and the conductor 205b is illustrated in FIGS. 1A to 1D, the structure of the conductor 205 is not limited thereto, and a single-layer structure or a stacked-layer structure of three or more layers may be used.

The conductor 260 may have, for example, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, or a two-layer structure in which tungsten is stacked over tungsten nitride.

The conductor 260 may have, for example, a three-layer structure in which titanium, aluminum, and titanium are stacked in this order.

The conductor 260 may have, for example, a three-layer structure in which tantalum nitride, tungsten, and tantalum nitride are stacked in this order.

The use of a conductive material with a high work function for each of the conductor 205 and the conductor 260 can increase $V_{th}$ of the transistor OS1 and reduce cutoff current (drain current when $V_G$ is 0 V). The work function of a conductive material used for the conductor 260 is preferably 4.8 eV or more, further preferably 5.0 eV or more, still further preferably 5.2 eV or more, yet still further preferably 5.4 eV or more, and yet still further preferably 5.6 eV or more. Examples of the conductive material with a high work function include Pt, Pt silicide, Ni silicide, and an In—Ga—Zn oxide to which nitrogen is added.

It is preferable to use an In—Ga—Zn oxide to which nitrogen is added for the conductor 260 because excess oxygen can be supplied from the conductor 260 to the insulator 250. Excess oxygen supplied to the insulator 250 can be then supplied to the oxide semiconductor 230 by heat treatment.

Figure 41:
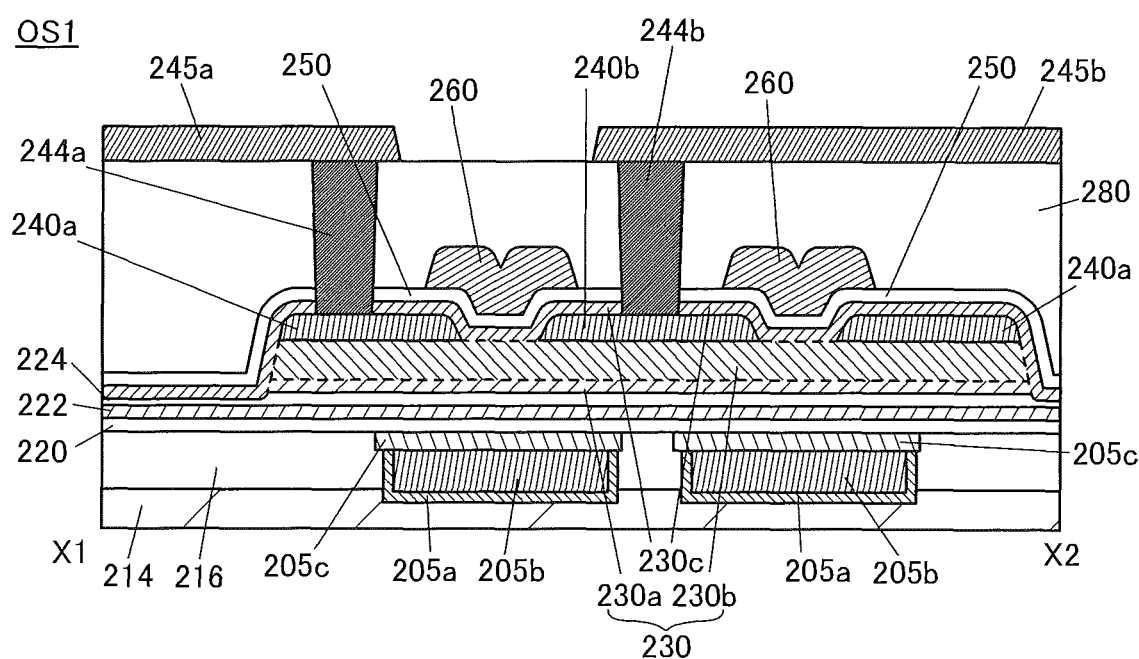
FIG. 41 is a cross-sectional view illustrating a structure example of a transistor.

An In—Ga—Zn oxide to which nitrogen is added may be provided as a conductor 205c so as to cover the conductor 205a and the conductor 205b, as illustrated in FIG. 41. With such a structure, oxygen that should be supplied from the insulator 224 to the oxide semiconductor 230 can be prevented from being absorbed by the conductors 205a and 205b.

The details of other components of the transistor OS1 will be described later in Embodiment 2.

FIGS. 2A to 2D illustrate a structure example where the conductors 260, 205, and 240b of the transistor OS1 in FIGS. 1A to 1D are electrically connected to one another. FIG. 2A is a circuit diagram, FIG. 2B is a top view, and FIGS. 2C and 2D are cross-sectional views. FIG. 2C is the cross-sectional view taken along dashed-dotted line X1-X2 in FIG. 2B. FIG. 2D is the cross-sectional view taken along dashed-dotted line Y1-Y2 in FIG. 2B. For simplification of the drawing, some components are not illustrated in the top view of FIG. 2B.

In FIGS. 2A to 2D, the conductor 240b is electrically connected to the conductor 260 through the conductor 244b, the wiring 245c, and the conductor 244d. In addition, the conductor 240b is electrically connected to the conductor 205 through the conductor 244b, the wiring 245c, and the conductor 244c. In other words, in the transistor OS1, one of a source electrode and a drain electrode is electrically connected to a first gate electrode and a second gate electrode. When electrodes are connected to each other in this manner, the transistor OS1 can function as a diode.

Figure 3A:
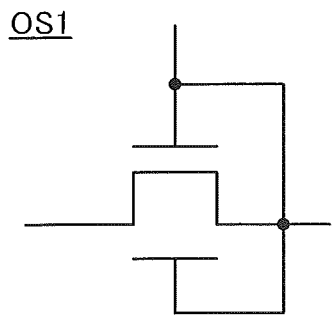
FIGS. 3A to 3D are a circuit diagram, a top view, and cross-sectional views illustrating a structure example of a transistor.
Figure 3B:
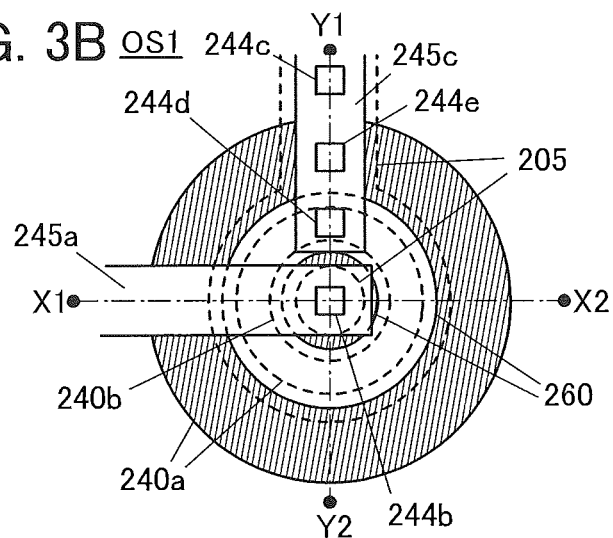
Figure 3C:
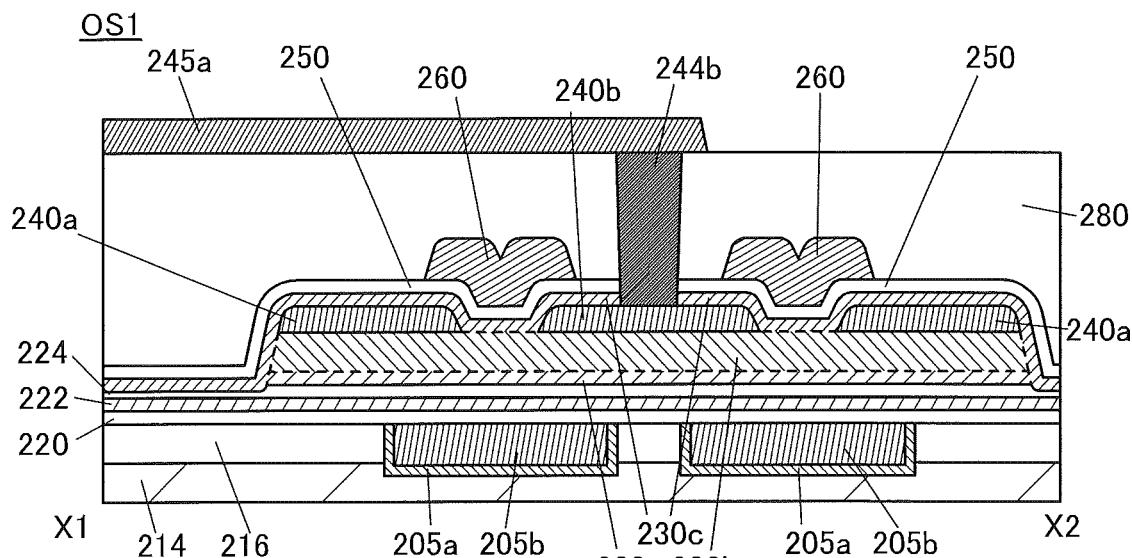
Figure 3D:
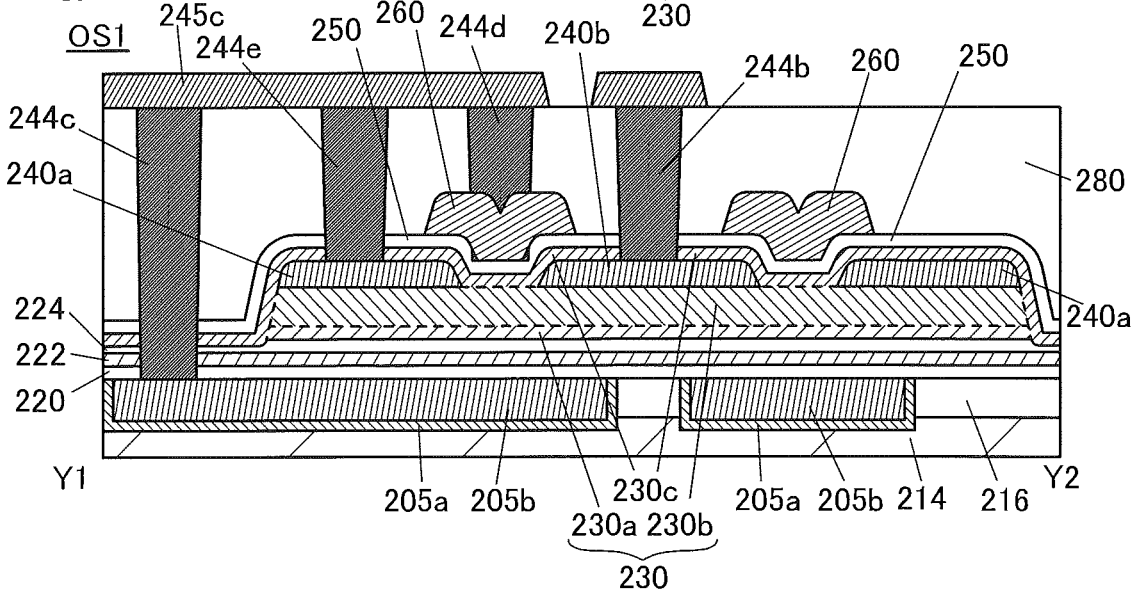

In the transistor OS1 illustrated in FIGS. 2A to 2D, instead of the conductor 240b, the conductor 240a may be electrically connected to the conductors 260 and 205. FIGS. 3A to 3D illustrate a structure example of such a case. FIG. 3A is a circuit diagram, FIG. 3B is a top view, and FIGS. 3C and 3D are cross-sectional views. FIG. 3C is the cross-sectional view taken along dashed-dotted line X1-X2 in FIG. 3B. FIG. 3D is the cross-sectional view taken along dashed-dotted line Y1-Y2 in FIG. 3B. For simplification of the drawing, some components are not illustrated in the top view of FIG. 3B.

The transistor OS1 illustrated in FIGS. 3A to 3D can function as a diode like the transistor OS1 illustrated in FIGS. 2A to 2D.

Figure 4A:
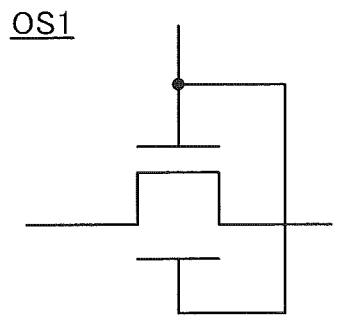
FIGS. 4A to 4D are a circuit diagram, a top view, and cross-sectional views illustrating a structure example of a transistor.
Figure 4B:
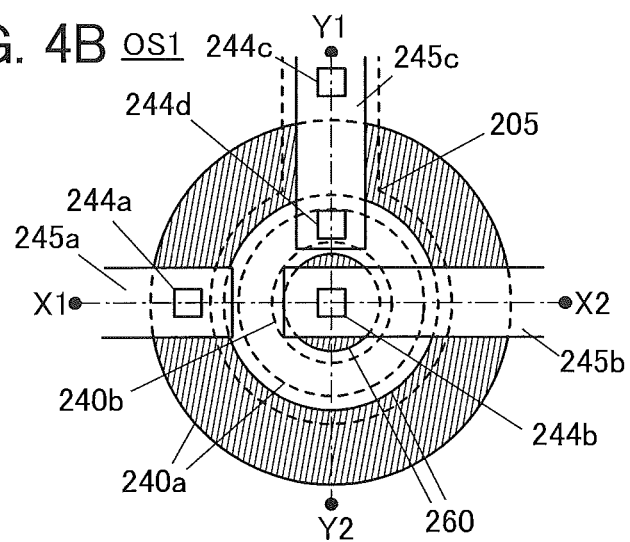
Figure 4C:
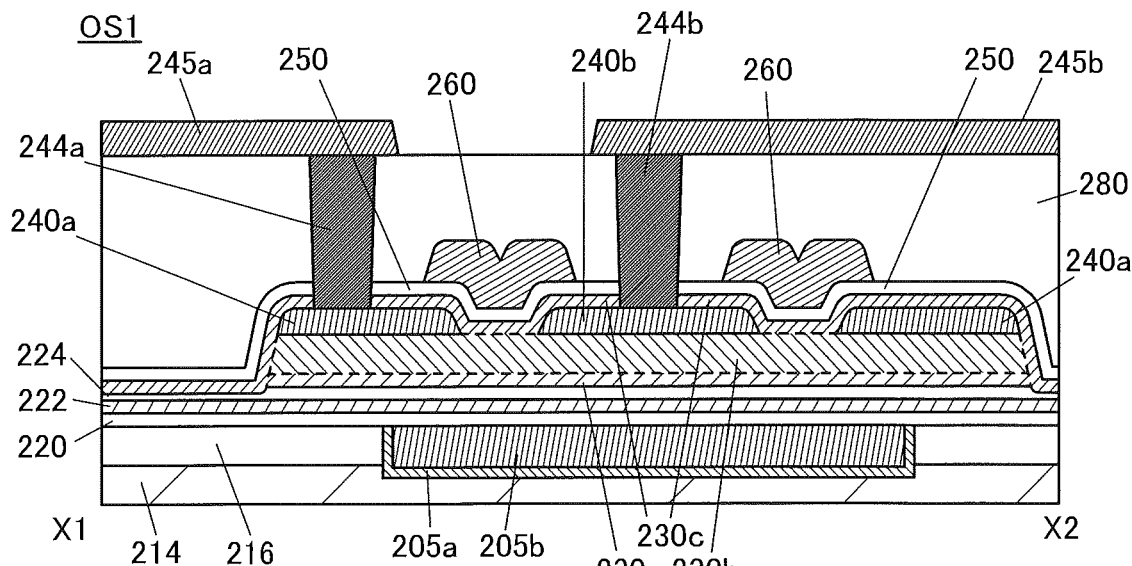
Figure 4D:
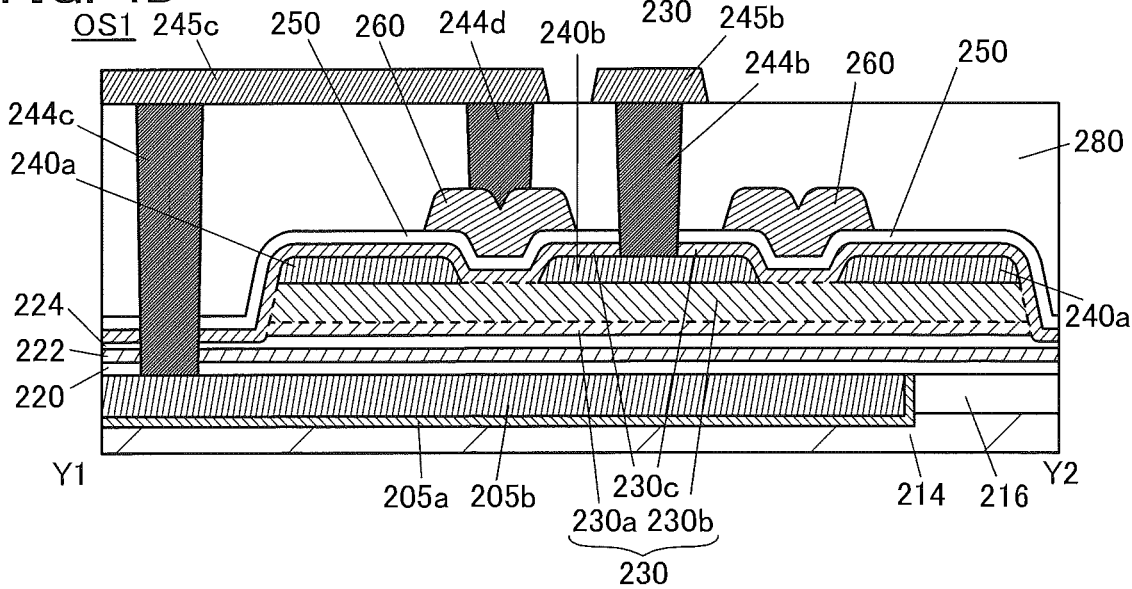

FIGS. 4A to 4D illustrate a structure example where the conductor 205 is provided so as to overlap with the entire bottom surface of the conductor 240b in FIGS. 1A to 1D. FIG. 4A is a circuit diagram, FIG. 4B is a top view, and FIGS. 4C and 4D are cross-sectional views. FIG. 4C is the cross-sectional view taken along dashed-dotted line X1-X2 in FIG. 4B. FIG. 4D is the cross-sectional view taken along dashed-dotted line Y1-Y2 in FIG. 4B. For simplification of the drawing, some components are not illustrated in the top view of FIG. 4B.

In the case where the conductor 205 is provided as illustrated in FIGS. 4A to 4D, the resistance of the oxide semiconductor 230b below the conductor 240b can be reduced when the transistor OS1 is on and can be increased when the transistor OS1 is off. As a result, the transistor OS1 can have high on-state current and low off-state current.

Figure 38A:
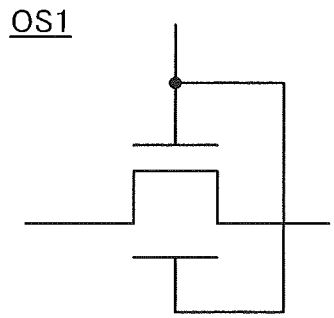
FIGS. 38A to 38D are a circuit diagram, a top view, and cross-sectional views illustrating a structure example of a transistor.
Figure 38B:
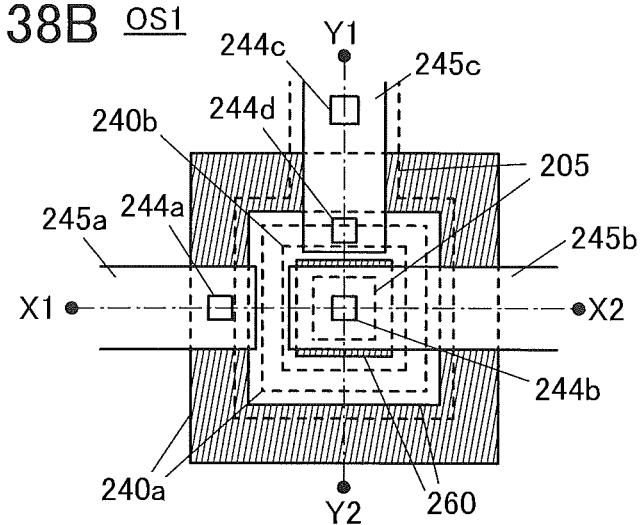
Figure 38C:
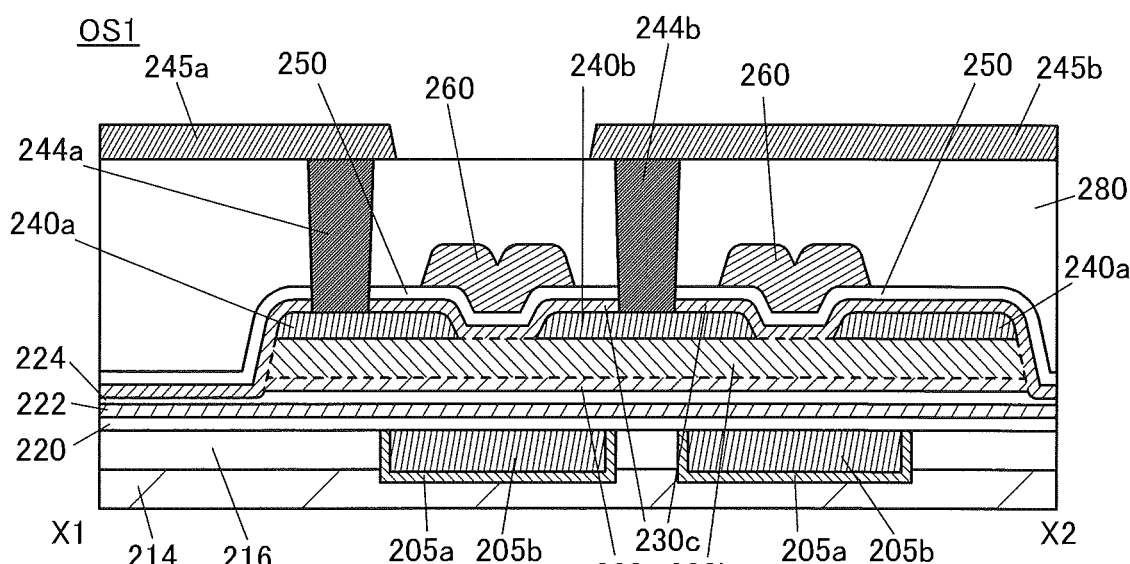
Figure 38D:
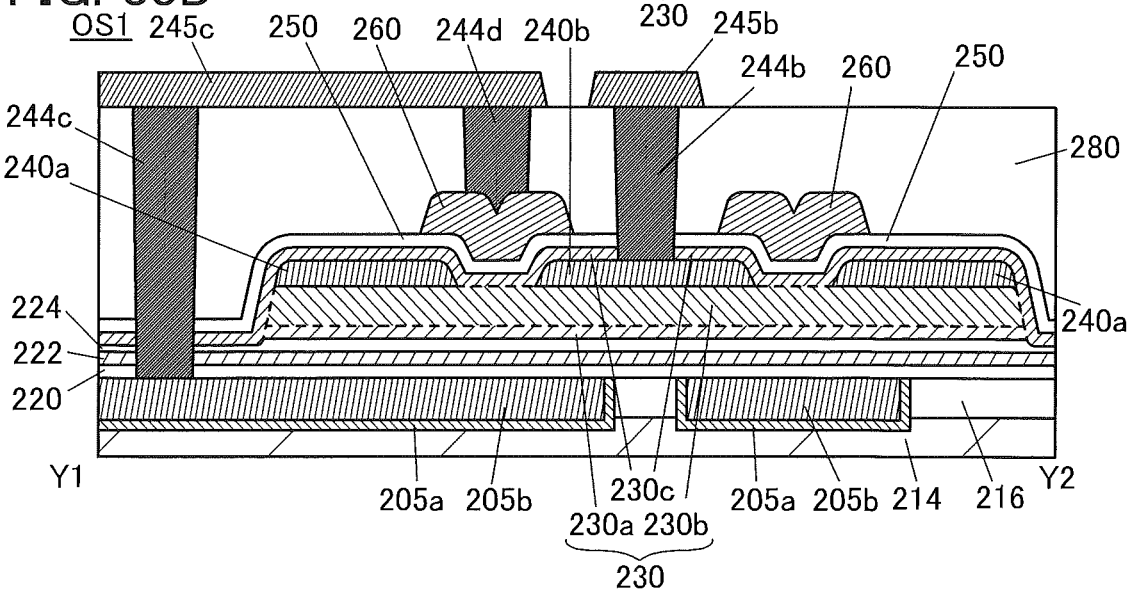

FIGS. 38A to 38D illustrate a structure example where the transistor OS1 in FIGS. 1A to 1D has a square shape. FIG. 38A is a circuit diagram, FIG. 38B is a top view, and FIGS. 38C and 38D are cross-sectional views. FIG. 38C is the cross-sectional view taken along dashed-dotted line X1-X2 in FIG. 38B. FIG. 38D is the cross-sectional view taken along dashed-dotted line Y1-Y2 in FIG. 38B. For simplification of the drawing, some components are not illustrated in the top view of FIG. 38B.

In the transistor OS1 having a square shape as illustrated in FIG. 38B, the oxide semiconductors 230a and 230b do not have end portions (the end portions E1 and E2 in FIG. 40A) between a source electrode and a drain electrode; thus, leakage current can be reduced.

Figure 39A:
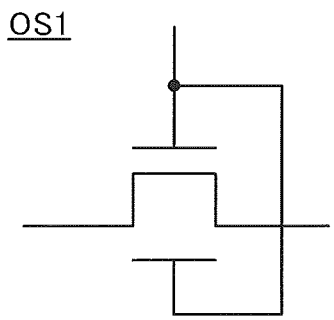
FIGS. 39A to 39D are a circuit diagram, a top view, and cross-sectional views illustrating a structure example of a transistor.
Figure 39B:
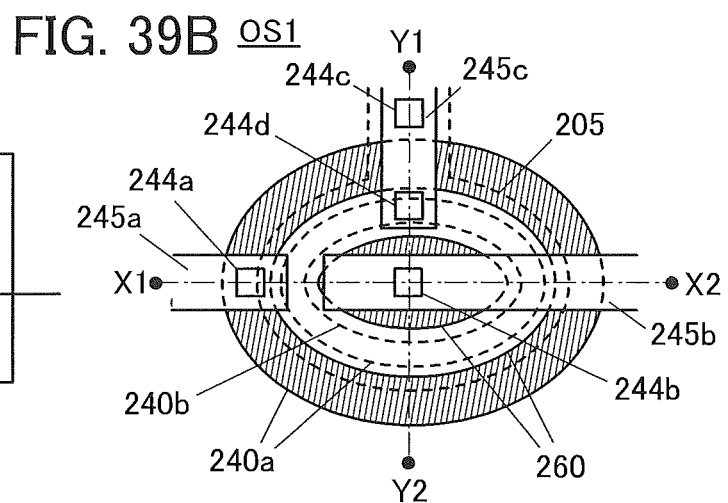
Figure 39C:
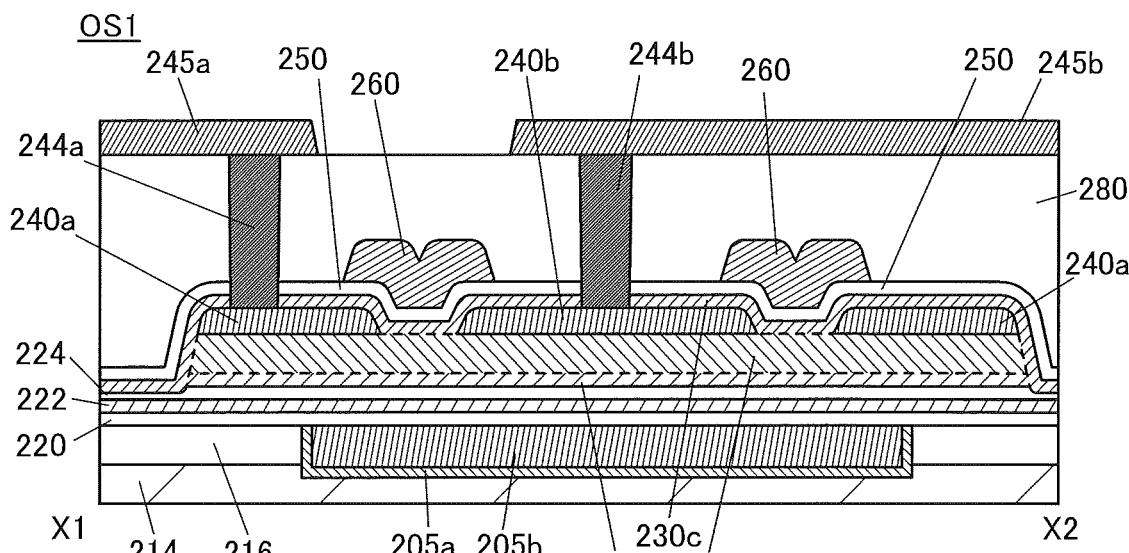
Figure 39D:
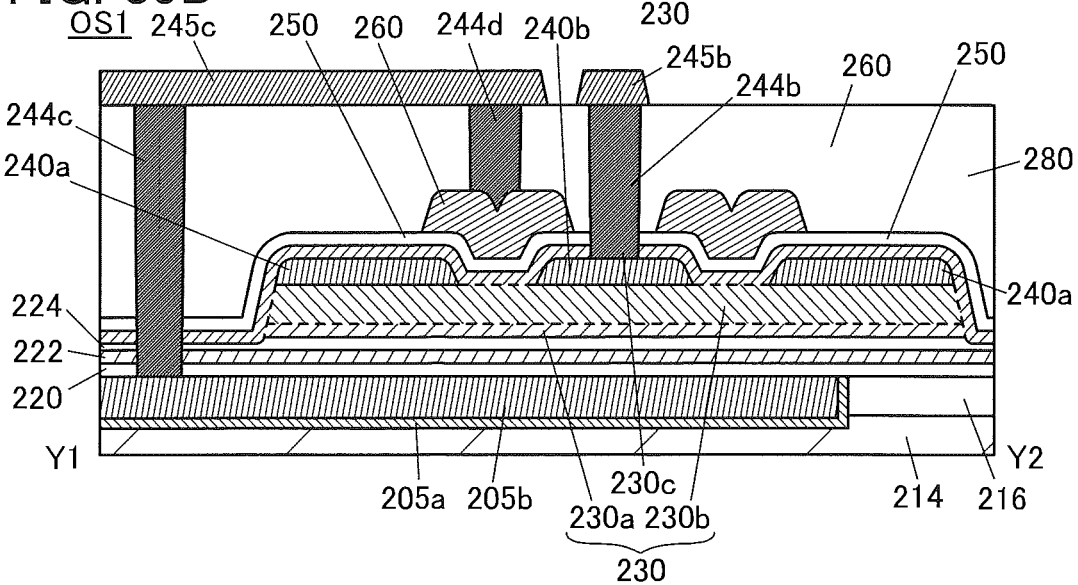

FIGS. 39A to 39D illustrate a structure example where the transistor OS1 in FIGS. 4A to 4D has an ellipsoidal shape. FIG. 39A is a circuit diagram, FIG. 39B is a top view, and FIGS. 39C and 39D are cross-sectional views. FIG. 39C is the cross-sectional view taken along dashed-dotted line X1-X2 in FIG. 39B. FIG. 39D is the cross-sectional view taken along dashed-dotted line Y1-Y2 in FIG. 39B. For simplification of the drawing, some components are not illustrated in the top view of FIG. 39B.

In the transistor OS1 having an ellipsoidal shape as illustrated in FIG. 39B, the oxide semiconductors 230a and 230b do not have end portions (the end portions E1 and E2 in FIG. 40A) between a source electrode and a drain electrode; thus, leakage current can be reduced.

The transistor OS1 does not necessarily include the conductor 205 functioning as a second gate. The transistor OS1 not including the conductor 205 can be fabricated by a simplified process.

Next, a circuit configuration of the semiconductor device to which the transistor OS1 is applied will be described.

<<Circuit 10>>

Figure 5:
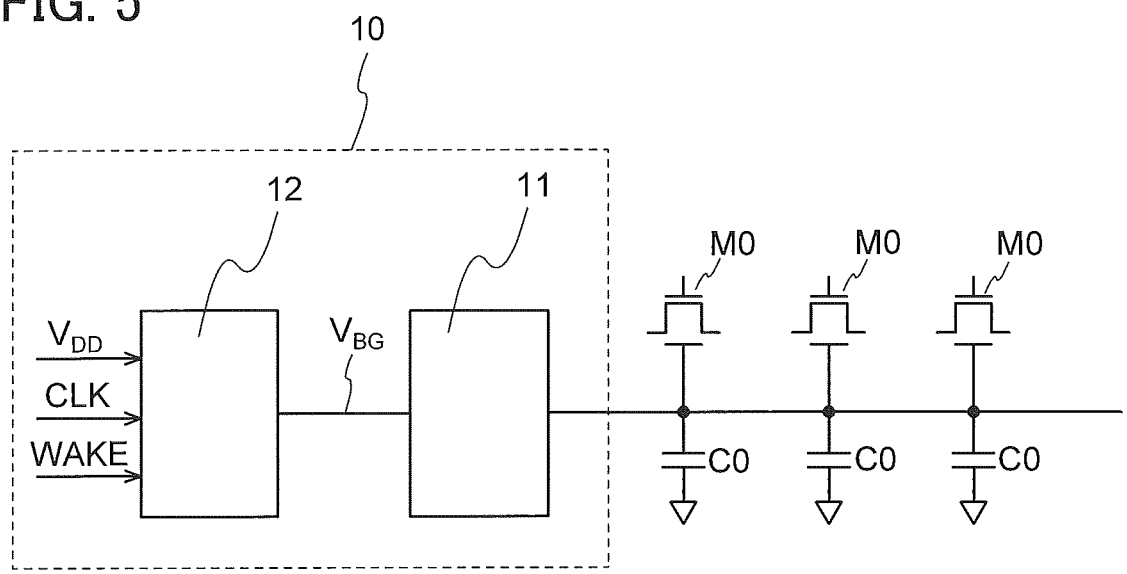
FIG. 5 is a circuit diagram illustrating a configuration example of a semiconductor device.

A circuit 10 illustrated in FIG. 5 is a semiconductor device for driving second gates of transistors M0. The circuit 10 includes a voltage generation circuit 12 and a voltage holding circuit 11.

The transistors M0 are transistors that can be used in any of a variety of circuits such as a memory circuit, an arithmetic circuit, and a pixel circuit. Although three transistors M0 are illustrated in FIG. 5, the number of the transistors M0 is not limited to three, and the circuit 10 may be connected to more transistors M0. Note that the transistors M0 are described as n-channel transistors below.

The transistors M0 each include a first gate and the second gate. Each of the second gates of the transistors M0 has a function of controlling $V_{th}$ of its respective transistor M0. Capacitors C0 correspond to wiring capacitance added to the second gates. In each of the transistors M0, the first gate and the second gate preferably overlap with each other with a semiconductor layer positioned therebetween.

The circuit 10 has a function of writing a potential to the second gates of the transistors M0 and holding the potential.

In the case where a negative potential is written to the second gates of the transistors M0 by the circuit 10, for example, $V_{th}$ of the transistors M0 can be kept high while the negative potential of the second gates is held. When $V_{th}$ of the transistors M0 is kept high, the transistors M0 can be prevented from being normally on and thus, power consumption of the whole semiconductor device including the transistors M0 can be reduced. In the case where the transistor M0 is used as a selection transistor of a memory cell, for example, charge in a capacitor functioning as storage can be held for a long time.

The voltage holding circuit 11 has a function of applying a potential $V_{BG}$ generated in the voltage generation circuit 12 to the second gates of the transistors M0 and holding the potential.

The voltage generation circuit 12 has a function of generating $V_{BG}$ from GND or $V_{DD}$. Note that $V_{DD}$, a signal CLK, and a signal WAKE are input to the voltage generation circuit 12. The signal CLK is a clock signal and is used to operate the voltage generation circuit 12. The signal WAKE has a function of controlling the input of the signal CLK to the voltage generation circuit 12. For example, when an H-level signal is applied as the signal WAKE, the signal CLK is input to the voltage generation circuit 12, and the voltage generation circuit 12 generates $V_{BG}$.

<<Voltage Holding Circuit 11>>

Next, specific configuration examples of the voltage holding circuit 11 will be described.

[Voltage Holding Circuit 11a]

Figure 6A:
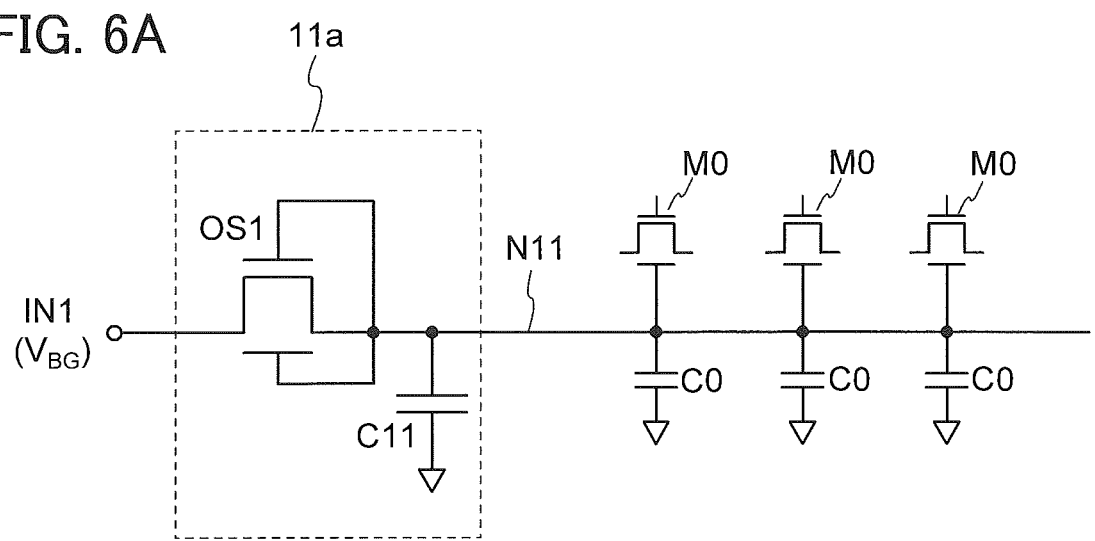
FIGS. 6A and 6B are circuit diagrams each illustrating a configuration example of a voltage holding circuit.

A voltage holding circuit 11a illustrated in FIG. 6A includes the transistor OS1 and a capacitor C11. A first electrode of the transistor OS1 is electrically connected to a first gate of the transistor OS1, a second gate of the transistor OS1, a first electrode of the capacitor C11, and a second gate of the transistor M0. A second electrode of the capacitor C11 is supplied with GND. A second electrode of the transistor OS1 is electrically connected to a terminal IN1. The terminal IN1 is electrically connected to the voltage generation circuit 12 and is supplied with the potential $V_{BG}$.

A node where the first gate of the transistor OS1, the second gate of the transistor OS1, the first electrode of the transistor OS1, the first electrode of the capacitor C11, and the second gate of the transistor M0 are connected to one another is referred to as a node N11.

Figure 6B:
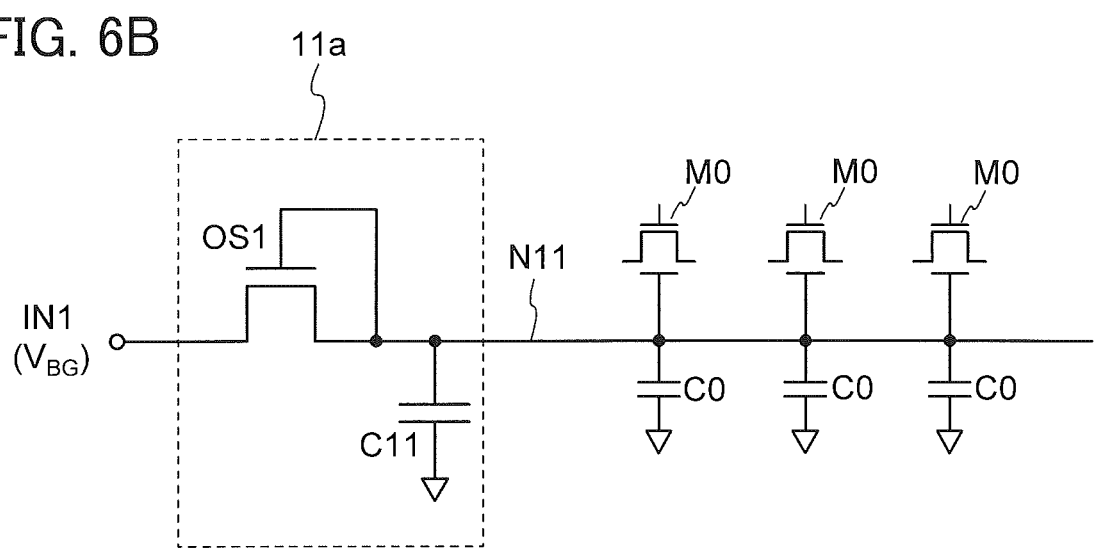

In the voltage holding circuit 11a, the transistor OS1 does not necessarily include the second gate. FIG. 6B is a circuit diagram illustrating such a case.

In the voltage holding circuit 11a, the transistor OS1 functions as a diode. The transistor OS1 has a function of writing a potential to the second gate of the transistor M0 and holding the potential.

Figure 7A:
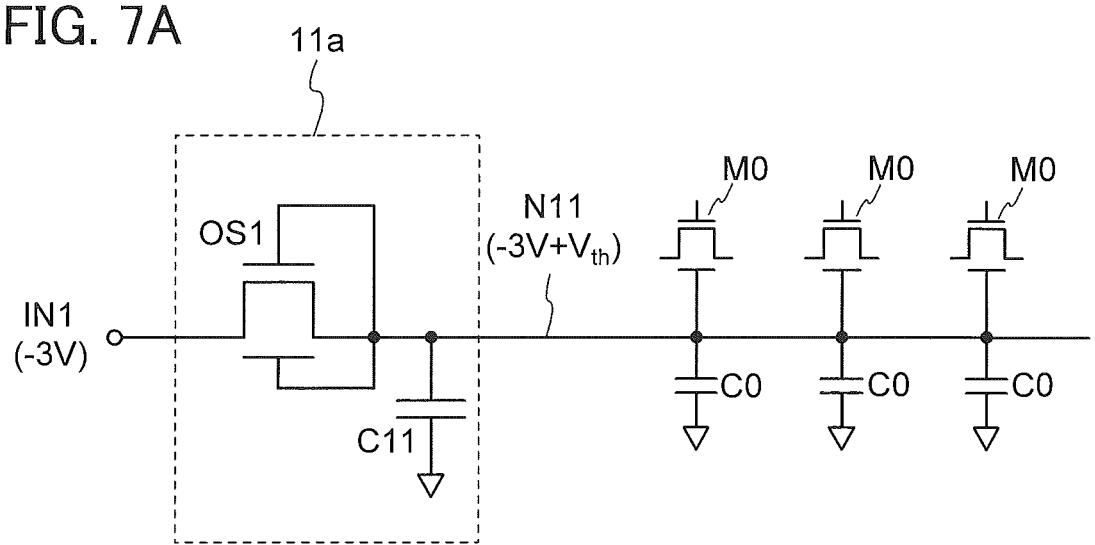
FIGS. 7A and 7B are circuit diagrams each illustrating an operation example of a voltage holding circuit.

Then, the operation of the voltage holding circuit 11a will be described with reference to FIGS. 7A and 7B.

When a negative potential ($V_{BG}$) is applied to the terminal IN1, the transistor OS1 is turned on and a potential obtained by adding $V_{BG}$ and $V_{th}$ (the threshold voltage of the transistor OS1) is written to the node N11. FIG. 7A illustrates an example where −3 V is applied to the terminal IN1.

Figure 7B:
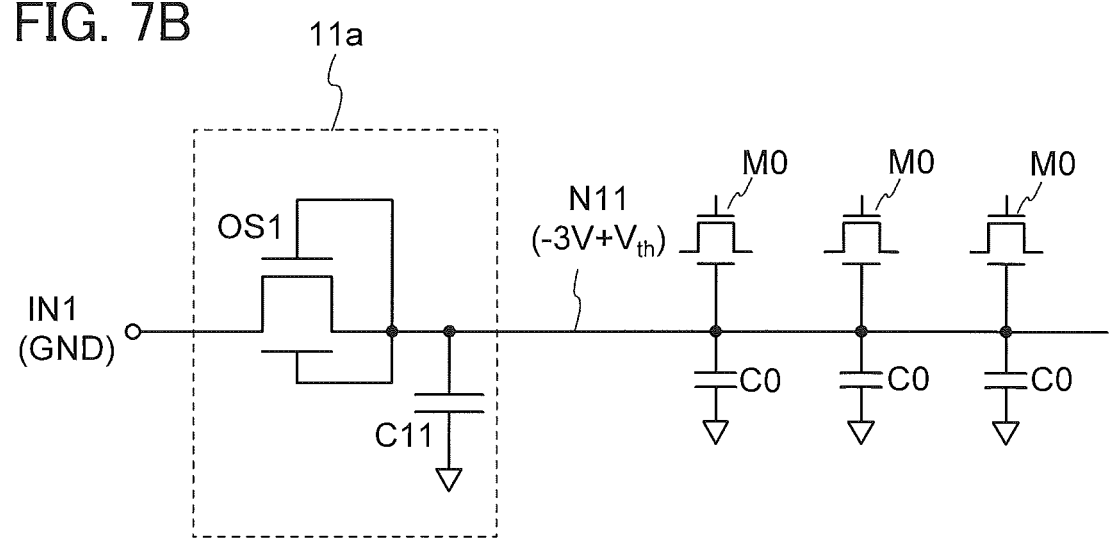

When GND is applied to the terminal IN1, $V_G$ becomes 0 V and the transistor OS1 is turned off (FIG. 7B). As a result, the negative potential written to the node N11 is held and the transistor M0 can maintain its normally-off state.

Since the off-state current of the transistor OS1 is extremely small as described above, a charge written to the node N11 can be held for a long time.

The transistor OS1 in the voltage holding circuit 11a can have the structure illustrated in FIGS. 2A to 2D or the structure illustrated in FIGS. 3A to 3D.

The transistor OS1 has a disadvantage in occupying a large area. Thus, for example, the transistor OS1 is not suitably used for a circuit that requires high integration, such as a memory cell. However, since the voltage holding circuit 11a can be formed outside a memory cell, the voltage holding circuit 11a does not require high integration. Accordingly, the area occupied by the transistor OS1 is not a problem for the voltage holding circuit 11a.

The channel length of the transistor OS1 is preferably longer than that of the transistor M0. For example, in the case where the channel length of the transistor M0 is less than 1 μm, the channel length of the transistor OS1 is greater than or equal to 1 μm, preferably greater than or equal to 3 μm, still further preferably greater than or equal to 5 μm, and yet still further preferably greater than or equal to 10 μm.

The transistor OS1 has a long channel length, whereby the transistor OS1 is not affected by a short-channel effect, and the cutoff current can be low. Furthermore, the withstand voltage between a source and a drain of the transistor OS1 can be increased. The withstand voltage between the source and the drain of the transistor OS1 is preferably high because the transistor M0 and the voltage generation circuit 12 generating a high voltage can be easily connected to each other.

For example, in the case where the transistor M0 is used in a circuit that needs to have high integration such as a memory cell, the channel length of the transistor M0 is preferably short. Meanwhile, the transistor OS1 is usually formed outside the memory cell; thus, a long channel length does not become a problem. In addition, although the on-state current of a transistor is reduced when the channel length of the transistor is increased, the transistor OS1 is mainly used in the off state, and therefore high on-state current is not required.

[Voltage Holding Circuit 11b]

Figure 8A:
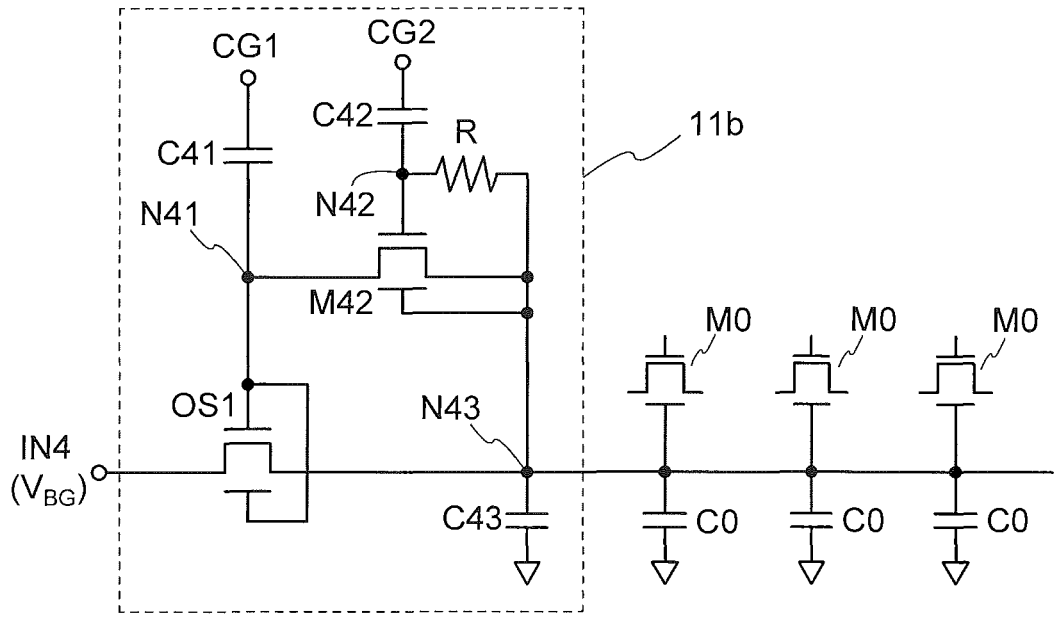
FIGS. 8A and 8B are circuit diagrams each illustrating a configuration example of a voltage holding circuit.

A voltage holding circuit 11b illustrated in FIG. 8A includes the transistor OS1, a transistor M42, a resistor R, a capacitor C41, a capacitor C42, and a capacitor C43.

A first gate and a second gate of the transistor OS1 are electrically connected to a first electrode of the capacitor C41. A first electrode of the transistor OS1 is electrically connected to a second gate of the transistor M0. A second electrode of the transistor OS1 is electrically connected to a terminal IN4. The terminal IN4 is electrically connected to the voltage generation circuit 12 and is supplied with the potential $V_{BG}$.

A first gate of the transistor M42 is electrically connected to a first electrode of the transistor M42 through the resistor R. A second gate of the transistor M42 is electrically connected to the first electrode of the transistor M42. The first electrode of the transistor M42 is electrically connected to the second gate of the transistor M0. A second electrode of the transistor M42 is electrically connected to the first gate of the transistor OS1.

A first electrode of the capacitor C43 is electrically connected to the second gate of the transistor M0. A second electrode of the capacitor C43 is supplied with GND.

A second electrode of the capacitor C41 is electrically connected to a terminal CG1. A second electrode of the capacitor C42 is electrically connected to a terminal CG2.

A node where the first gate of the transistor OS1, the second gate of the transistor OS1, the second electrode of the transistor M42, and the first electrode of the capacitor C41 are connected to one another is referred to as a node N41. A node where the first gate of the transistor M42 and a first electrode of the capacitor C42 are connected to each other is referred to as a node N42. A node where the first electrode of the transistor OS1, the second gate of the transistor M42, the first electrode of the transistor M42, and the first electrode of the capacitor C43 are connected to one another is referred to as a node N43.

In the voltage holding circuit 11b, the first electrode of the transistor OS1 may be the conductor 240a in FIGS. 1A to 1D or FIGS. 4A to 4D and the second electrode of the transistor OS1 may be the conductor 240b in FIGS. 1A to 1D or FIGS. 4A to 4D. Alternatively, in the voltage holding circuit 11b, the first electrode of the transistor OS1 may be the conductor 240b in FIGS. 1A to 1D or FIGS. 4A to 4D and the second electrode of the transistor OS1 may be the conductor 240a in FIGS. 1A to 1D or FIGS. 4A to 4D.

Figure 8B:
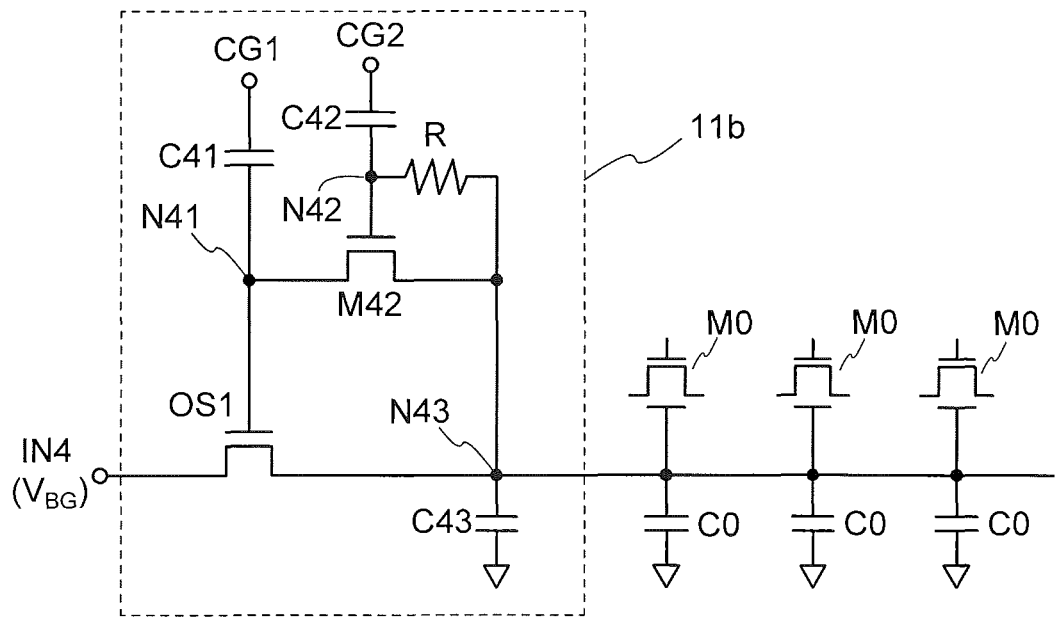

In the voltage holding circuit 11b, the transistor OS1 does not necessarily include the second gate. FIG. 8B is a circuit diagram illustrating such a case.

Next, the operation of the voltage holding circuit 11b will be described with reference to FIG. 9. Note that the transistor M42 is described as an n-channel transistor below.

Figure 9:
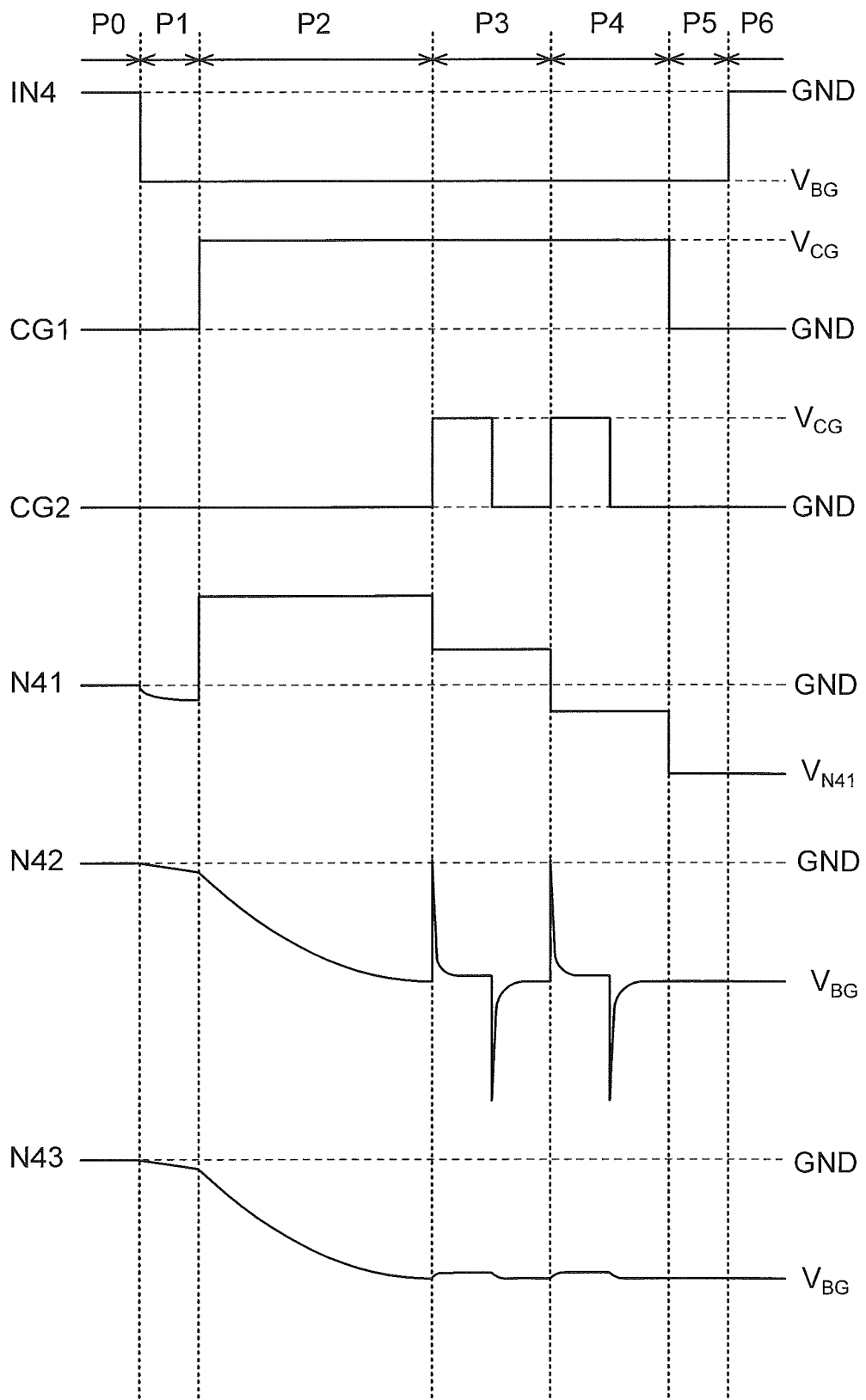
FIG. 9 is a timing chart showing an operation example of a voltage holding circuit.

FIG. 9 is a timing chart that shows the operation of the voltage holding circuit 11b. FIG. 9 shows, from the top, the potentials of the terminal IN4, the terminal CG1, the terminal CG2, the node N41, the node N42, and the node N43. The timing chart is divided into periods P0 to P6.

In the period P0, GND is applied to each of the terminals and the nodes.

In the period P1, the potential $V_{BG}$, which is a negative potential, is applied to the terminal IN4. At this time, drain current slightly flows in the transistor OS1, and the potentials of the node N43 and the node N42 are gradually decreased. The potential of the node N41 is also slightly decreased.

In the period P2, a potential $V_{CG}$ is applied to the terminal CG1. The potential $V_{CG}$ is preferably at an H level. At that time, the potential of the node N41 is increased due to capacitive coupling by the capacitor C41, and the transistor OS1 is turned on. As a result, the potentials of the node N43 and the node N42 are decreased to the potential $V_{BG}$. Because the transistor M42 is kept in an off state, the potential of the node N41 is kept at a high potential.

In the period P3, a pulse signal of the potential $V_{CG}$ is applied to the terminal CG2. The input pulse signal is transmitted to the node N42 as a differential signal. When a positive differential signal is applied to the node N42, the transistor M42 is turned on and the potential of the node N41 is decreased.

In the period P4, the pulse signal applied in the period P3 is applied again to the terminal CG2, whereby the potential of the node N41 can be further decreased.

In the period P5, the potential of the terminal CG1 is decreased to GND. At that time, the potential of the node N41 is decreased to a potential $V_{N41}$. It is preferable that $V_{N41}$ be lower than $V_{BG}$. The transistor OS1 is turned off by the reduction in the potential of the node N41.

In the period P6, GND is applied to the terminal IN4. Because the transistor OS1 is kept in an off state, the negative potential ($V_{BG}$) applied to the node N43 is held.

Since the off-state current of the transistor OS1 is extremely low as described above, a charge written to the node N43 can be held for a long time.

Unlike the voltage holding circuit 11a, the voltage holding circuit 11b is not affected by $V_{th}$ of the transistor OS1. Thus, the voltage holding circuit 11b can effectively apply a negative potential to the second gate of the transistor M0.

In the voltage holding circuit 11b, when a pulse signal is applied to the terminal CG2, the potential of the node N41 can be decreased. The number of pulse signals applied to the terminal CG2 is two (in the period P3 and the period P4) in FIG. 9; however, the number of pulse signals is not limited to this, and more pulse signals may be applied to the terminal CG2. An increase in the number of pulse signals can further reduce the potential of the node N41.

In the voltage holding circuit 11b, the potential of the node N41 can be eventually lower than that of the node N43, and $V_G$ of the transistor OS1 can be lower than 0 V. As a result, the off-state current of the transistor OS1 in the voltage holding circuit 11b can be lower than that in the voltage holding circuit 11a; thus, the voltage holding circuit 11b can hold the negative potential applied to the second gate of the transistor M0 for a longer time.

In order to accurately perform the above operation, the capacitance value of the capacitor C43 is preferably larger than that of the capacitor C42 in the voltage holding circuit 11b. The capacitance value of the capacitor C43 is preferably 5 to 20 times, and further preferably 5 to 15 times as large as the capacitance value of the capacitor C42.

In order to accurately perform the above operation, the capacitance value of the capacitor C41 is preferably larger than the gate capacitance value of the transistor OS1 in the voltage holding circuit 11b. The capacitance value of the capacitor C41 is preferably 5 to 20 times, and further preferably 5 to 15 times as large as the gate capacitance value of the transistor OS1.

In order to accurately perform the above operation, the product (time constant τ) of the capacitance value of the capacitor C42 and the resistance value of the resistor R is preferably greater than or equal to $10^{-6}$ seconds in the voltage holding circuit 11b.

The transistor OS1 has a disadvantage in occupying a large area. Thus, for example, the transistor OS1 is not suitably used for a circuit that requires high integration, such as a memory cell. However, since the voltage holding circuit 11b can be formed outside a memory cell, the voltage holding circuit 11b does not require high integration. Accordingly, the area occupied by the transistor OS1 is not a problem for the voltage holding circuit 11b.

As in the case of the voltage holding circuit 11a, the channel length of the transistor OS1 is preferably longer than that of the transistor M0 in the voltage holding circuit 11b. For example, in the case where the channel length of the transistor M0 is less than 1 μm, the channel length of the transistor OS1 is greater than or equal to 1 μm, preferably greater than or equal to 3 μm, still further preferably greater than or equal to 5 m, and yet still further preferably greater than or equal to 10 μm.

The transistor OS1 has a long channel length, whereby the transistor OS1 is not affected by a short-channel effect, and the cutoff current can be low. Furthermore, the withstand voltage between a source and a drain of the transistor OS1 can be increased. The withstand voltage between the source and the drain of the transistor OS1 is preferably high because the transistor M0 and the voltage generation circuit 12 generating a high voltage can be easily connected to each other.

The transistor M42 may be formed using a semiconductor material that is different from a semiconductor material used for the transistor OS1; alternatively, the transistor M42 and the transistor OS1 may be formed using the same semiconductor material. It is particularly preferable to form the transistor M42 and the transistor OS1 using the same semiconductor material because the manufacturing process can be simplified. The transistor OS1 may be used as the transistor M42.

As described above, the use of the voltage holding circuit 11a or 11b as the voltage holding circuit 11 enables the voltage holding circuit 11 to hold a negative potential applied to the second gate of the transistor M0 for a long time.

<<Voltage Generation Circuit 12>>

Next, details of the voltage generation circuit 12 will be described with reference to FIGS. 10A and 10B and FIGS. 11A to 11C.

Circuit diagrams in FIGS. 10A and 10B and FIGS. 11A to 11C illustrate examples of the voltage generation circuit 12.

These are step-down charge pump circuits, in each of which GND is input to an input terminal IN, and $V_{BG}$ that is a negative potential is output from an output terminal OUT. Although the number of stages of the charge pump circuit described here as an example is four, the charge pump circuit may be formed with any number of stages.

[Voltage Generation Circuit 12a]

Figure 10A:
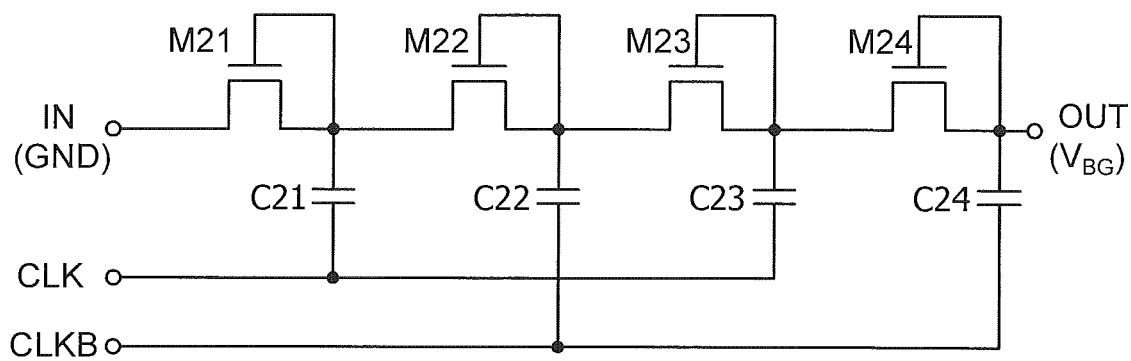
FIGS. 10A and 10B are circuit diagrams each illustrating a configuration example of a voltage generation circuit.
Figure 10B:
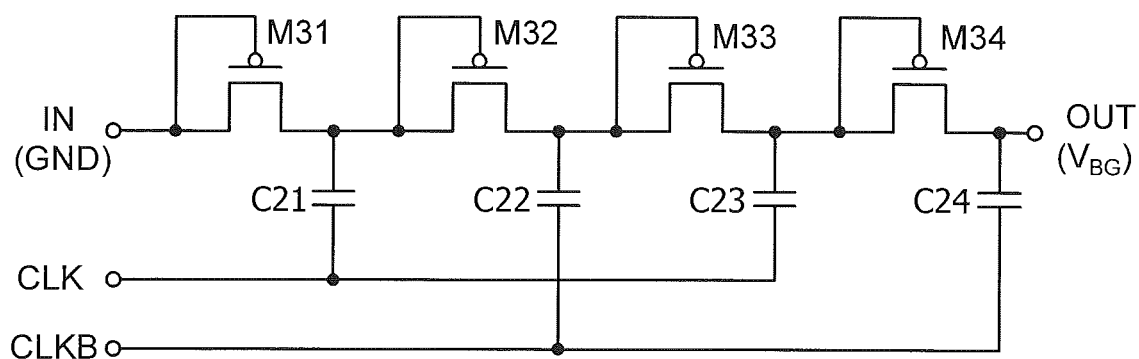

As illustrated in FIG. 10A, a voltage generation circuit 12a includes transistors M21 to M24 and capacitors C21 to C24. Note that the transistors M21 to M24 are described as n-channel transistors below.

The transistors M21 to M24 are connected in series between the input terminal IN and the output terminal OUT, and each of which has a structure in which a gate and a first electrode are connected to each other so that the transistor functions as a diode. The capacitors C21 to C24 are connected to the gates of the transistors M21 to M24, respectively.

A signal CLK is input to the first electrodes of the capacitors C21 and C23 in the odd-numbered stages, and a signal CLKB is input to the first electrodes of the capacitors C22 and C24 in the even-numbered stages. The signal CLKB is an inverted clock signal obtained by phase inversion of the signal CLK.

The voltage generation circuit 12a has a function of stepping down GND input to the input terminal IN to generate $V_{BG}$. The voltage generation circuit 12a can generate a negative potential only by supply of the signals CLK and CLKB.

The transistors M21 to M24 may be OS transistors. The OS transistors are preferably used because the reverse current of the diode-connected transistors M21 to M24 can be reduced.

[Voltage Generation Circuit 12b]

The voltage generation circuit 12 may be formed of p-channel transistors. A voltage generation circuit 12b illustrated in FIG. 10B includes transistors M31 to M34 that are p-channel transistors.

Figure 11A:
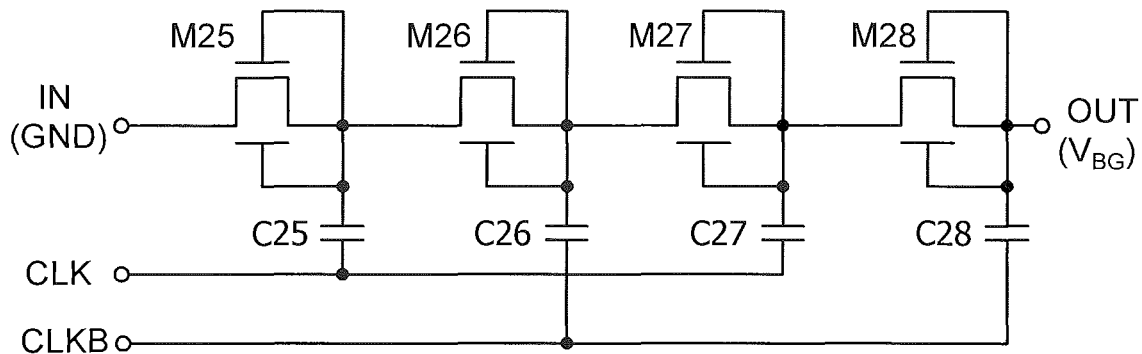
FIGS. 11A to 11C are circuit diagrams each illustrating a configuration example of a voltage generation circuit.
Figure 11B:
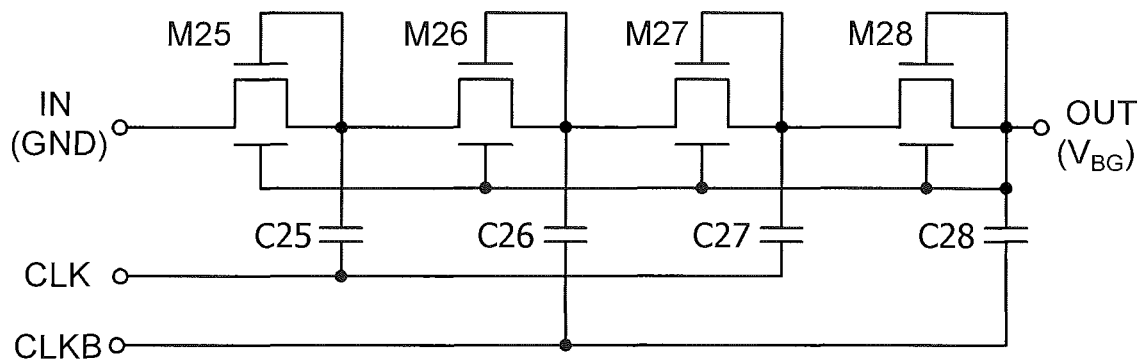
Figure 11C:
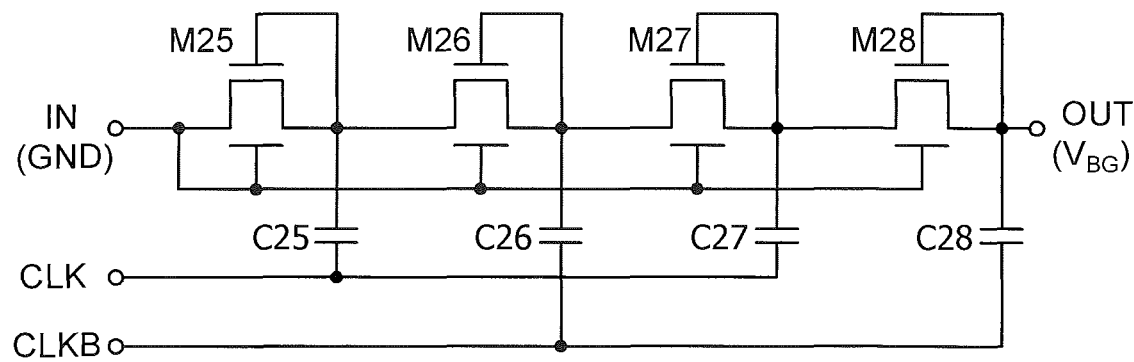

The voltage generation circuit 12 may be formed of a transistor including a first gate and a second gate. FIGS. 11A to 11C each illustrate a circuit diagram in that case.

[Voltage Generation Circuit 12c]

As illustrated in FIG. 11A, a voltage generation circuit 12c includes transistors M25 to M28 and capacitors C25 to C28. Note that the transistors M25 to M28 are described as n-channel transistors below.

The transistors M25 to M28 each include a first gate and a second gate. In each of the transistor M25 to M28, the first gate and the second gate preferably overlap with each other with a semiconductor layer therebetween.

The transistors M25 to M28 are connected in series between the input terminal IN and the output terminal OUT, and each of which has a structure in which a first gate and a first electrode are connected to each other so that the transistor functions as a diode. The capacitors C25 to C28 are connected to the first gates of the transistors M25 to M28, respectively.

A signal CLK is input to the first electrodes of the capacitors C25 and C27 in the odd-numbered stages, and a signal CLKB is input to the first electrodes of the capacitors C26 and C28 in the even-numbered stages. The signal CLKB is an inverted clock signal obtained by phase inversion of the signal CLK.

The voltage generation circuit 12c has a function of stepping down GND input to the input terminal IN to generate $V_{BG}$. The voltage generation circuit 12c can generate a negative potential only by supply of the signals CLK and CLKB.

In the voltage generation circuit 12c, the second gates of the transistors M25 to M28 are connected to the first gates of their respective transistors.

Since the same voltage is applied to the first and second gates of each of the transistors M25 to M28, the voltage generation circuit 12c has high on-state current. Consequently, the voltage can be stepped down with a small number of stages and thus, the number of stages in the voltage generation circuit 12c can be reduced. Accordingly, the voltage generation circuit 12c can be reduced in size.

[Voltage Generation Circuit 12d]

In a voltage generation circuit 12d in FIG. 11B, second gates of the transistors M25 to M28 are each connected to the output terminal OUT. The other structures are the same as those of the voltage generation circuit 12c.

The voltage generation circuit 12d puts importance on a reduction in the leakage current of the transistors M25 to M28. The second gates of the transistors M25 to M28 are connected to the output terminal OUT where the voltage is the lowest in the voltage generation circuit 12d. Since the voltage applied to the second gates of the transistors M25 to M28 is lower than that applied to sources, the transistors M25 to M28 have high $V_{th}$. Thus, reverse currents of the diode-connected transistors M25 to M28 can be reduced, preventing leakage of charges from the capacitors C25 to C28. This allows the capacitance values of the capacitors C25 to C28 to be decreased, so that the size of the voltage generation circuit 12d can be reduced.

[Voltage Generation Circuit 12e]

In a voltage generation circuit 12e in FIG. 11C, second gates of the transistors M25 to M28 are each connected to the input terminal IN. The other structures are the same as those of the voltage generation circuit 12c.

The second gates of the transistors M25 to M28 in the voltage generation circuit 12e are connected to the input terminal IN where the voltage is the highest in the voltage generation circuit 12e. That is, the voltage applied to the second gates of the transistors M25 to M28 is higher than that applied to sources. Accordingly, the transistors M25 to M28 each have low $V_{th}$ and high on-state current. Consequently, the voltage can be stepped down with a small number of stages and thus, the number of stages in the voltage generation circuit 12e can be reduced. Accordingly, the size of the voltage generation circuit 12e can be reduced, whereby power consumption can be reduced.

The transistors M25 to M28 may be OS transistors. The OS transistors are preferably used because reverse currents of the diode-connected transistors M25 to M28 can be reduced.

As described above, when the circuit 10 has any of the above-described structures, a semiconductor device capable of long-term data retention can be provided. Furthermore, a semiconductor device capable of reducing power consumption can be provided.

(Embodiment 2)

In this embodiment, components of the transistor OS1 described in Embodiment 1 and modification examples of the transistor OS1 will be described.

<<Components of Transistor OS1>>

First, the components of the transistor OS1 will be described.

[Oxide Semiconductor 230]

The oxide semiconductor 230 is formed using an In-M-Zn oxide. The element M is preferably gallium (Ga), for example. Other elements that can be used as the element M are aluminum (Al), boron (B), silicon (Si), titanium (Ti), zirconium (Zr), lanthanum (La), cerium (Ce), yttrium (Y), hafnium (Hf), tantalum (Ta), niobium (Nb), scandium (Sc), and the like.

Alternatively, an In—Ga oxide, an In—Zn oxide, a Ga—Zn oxide, or a gallium oxide may be used for the oxide semiconductor 230.

The energy level of the conduction band minimum of each of the oxide semiconductors 230a and 230c is closer to the vacuum level than that of the oxide semiconductor 230b. Typically, a difference in the energy level between the conduction band minimum of the oxide semiconductor 230b and the conduction band minimum of each of the oxide semiconductors 230a and 230c is preferably greater than or equal to 0.15 eV or greater than or equal to 0.5 eV, and less than or equal to 2 eV or less than or equal to 1 eV. That is, a difference in the electron affinity between each of the oxide semiconductors 230a and 230c and the oxide semiconductor 230b is preferably greater than or equal to 0.15 eV or greater than or equal to 0.5 eV, and less than or equal to 2 eV or less than or equal to 1 eV.

The energy gap of the oxide semiconductor 230b is preferably 2 eV or more, further preferably, 2.5 eV or more and 3.0 eV or less. The energy gap of each of the oxide semiconductors 230a and 230c is preferably 2 eV or more, further preferably, 2.5 eV or more, furthermore preferably 2.7 eV or more and 3.5 eV or less. The energy gap of each of the oxide semiconductors 230a and 230c is preferably greater than that of the oxide semiconductor 230b. For example, a difference in the energy gap between the oxide semiconductors 230a and 230b is preferably greater than or equal to 0.15 eV or greater than or equal to 0.5 eV, and less than or equal to 2 eV or less than or equal to 1 eV. Similarly, a difference in the energy gap between the oxide semiconductors 230c and 230b is preferably greater than or equal to 0.15 eV or greater than or equal to 0.5 eV, and less than or equal to 2 eV or less than or equal to 1 eV.

The thickness of each of the oxide semiconductors 230a, 230b, and 230c is greater than or equal to 3 nm and less than or equal to 200 nm, preferably greater than or equal to 3 nm and less than or equal to 100 nm, further preferably greater than or equal to 3 nm and less than or equal to 60 nm.

It is important for a transistor containing an oxide semiconductor in a channel formation region to have the carrier density of the oxide semiconductor controlled.

Examples of a factor affecting the carrier density of an oxide semiconductor include oxygen vacancy ($V_O$) and impurities in the oxide semiconductor. As the amount of oxygen vacancy in the oxide semiconductor increases, the density of defect states increases when hydrogen is bonded to the oxygen vacancy (this state is also referred to as $V_O H$). The density of defect states also increases with an increase in the amount of impurity in the oxide semiconductor. Hence, the carrier density of an oxide semiconductor can be controlled by controlling the density of defect states in the oxide semiconductor.

A state with a low impurity concentration and a low density of defect states is referred to as a highly purified intrinsic or substantially highly purified intrinsic state. A highly purified intrinsic or substantially highly purified intrinsic oxide semiconductor film has few carrier generation sources, and thus can have a low carrier density.

A highly purified intrinsic or substantially highly purified intrinsic oxide semiconductor is preferably used as each of the oxide semiconductors 230a and 230c. For example, the carrier density of each of the oxide semiconductors 230a and 230c is lower than $8 \times 10^{15}$ cm$^{-3}$, preferably lower than $1 \times 10^{11}$ cm$^{-3}$, and further preferably lower than $1 \times 10^{10}$ cm$^{-3}$, and is higher than or equal to $1 \times 10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_D$-$V_G$ characteristics of the transistor can be regarded as substantially intrinsic. Furthermore, an oxide semiconductor that has high electron affinity and thus has a narrow bandgap so as to increase the density of thermally excited electrons (carriers) can be regarded as a substantially intrinsic semiconductor. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of the oxide semiconductor 230b is preferably higher than that of the oxide semiconductor 230a and that of the oxide semiconductor 230c. The carrier density of the oxide semiconductor 230b is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^3$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

The density of defect states in a mixed layer formed at an interface between the oxide semiconductors 230a and 230b or an interface between the oxide semiconductors 230b and 230c is preferably made low. Specifically, when the oxide semiconductors 230a and 230b or the oxide semiconductors 230b and 230c contain the same element (as a main component) in addition to oxygen, a mixed layer with a low density of defect states can be formed. For example, in the case where the oxide semiconductor 230b is an In—Ga—Zn oxide, it is preferable to use an In—Ga—Zn oxide, a Ga—Zn oxide, gallium oxide, or the like as each of the oxide semiconductors 230a and 230c.

At this time, the oxide semiconductor 230b serves as a main carrier path. Since the density of defect states at the interface between the oxide semiconductors 230a and 230b and the interface between the oxide semiconductors 230b and 230c can be made low, the influence of interface scattering on carrier conduction is small, and high on-state current can be obtained.

When an electron is trapped in a trap state, the trapped electron behaves like fixed charge; thus, $V_{th}$ of the transistor is shifted in a positive direction. The oxide semiconductors 230a and 230c can make the trap state apart from the oxide semiconductor 230b. This structure can prevent the positive shift of $V_{th}$ of the transistor.

Here, preferred ranges of the atomic ratio of the In-M-Zn oxide are described with reference to FIGS. 12A to 12C. Note that the proportion of oxygen atoms is not illustrated in FIGS. 12A to 12C. The terms of the atomic ratio of indium, the element M, and zinc contained in the In-M-Zn oxide are denoted by [In], [M], and [Zn].

Note that when the In-M-Zn oxide is deposited with a sputtering apparatus, a film having an atomic ratio deviated from the atomic ratio of a target is formed. In particular, [Zn] in the film might be smaller than [Zn] in the target depending on the substrate temperature in deposition.

Figure 12A:
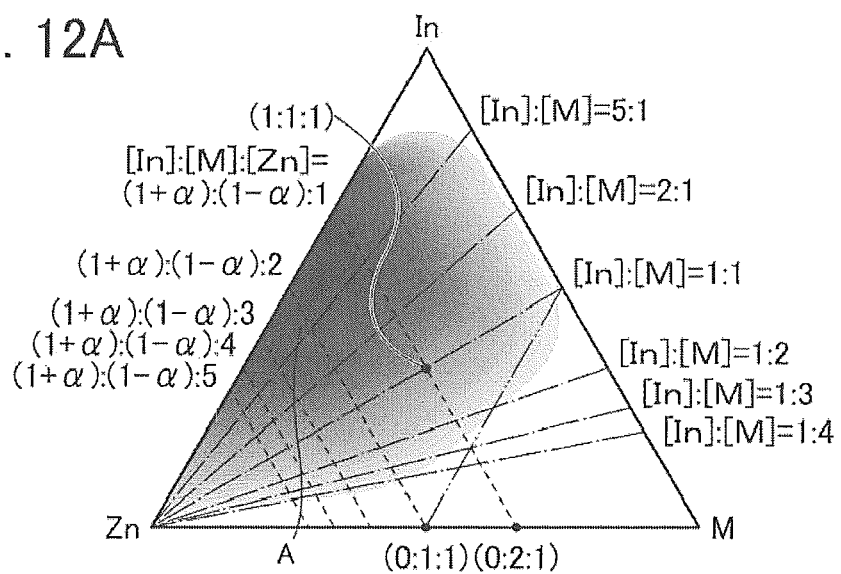
FIGS. 12A to 12C each illustrate an atomic ratio range of an oxide semiconductor.
Figure 12B:
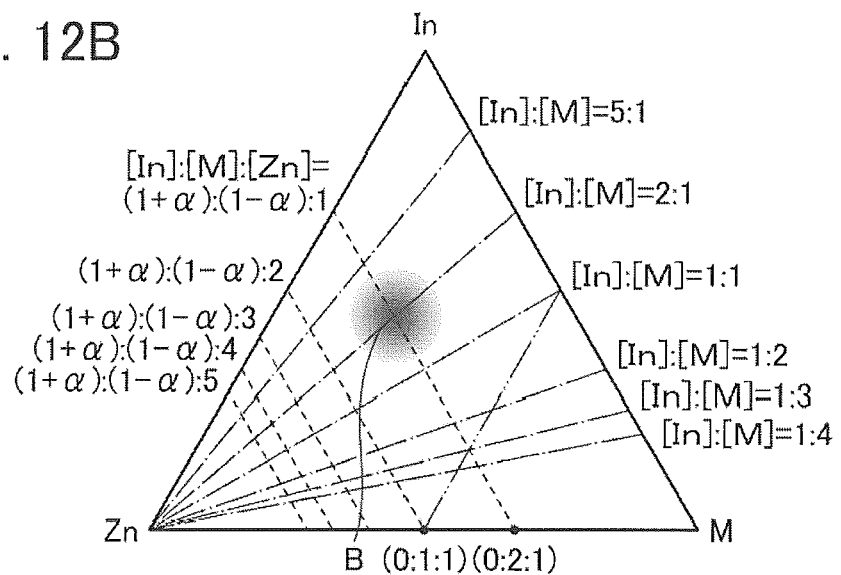
Figure 12C:
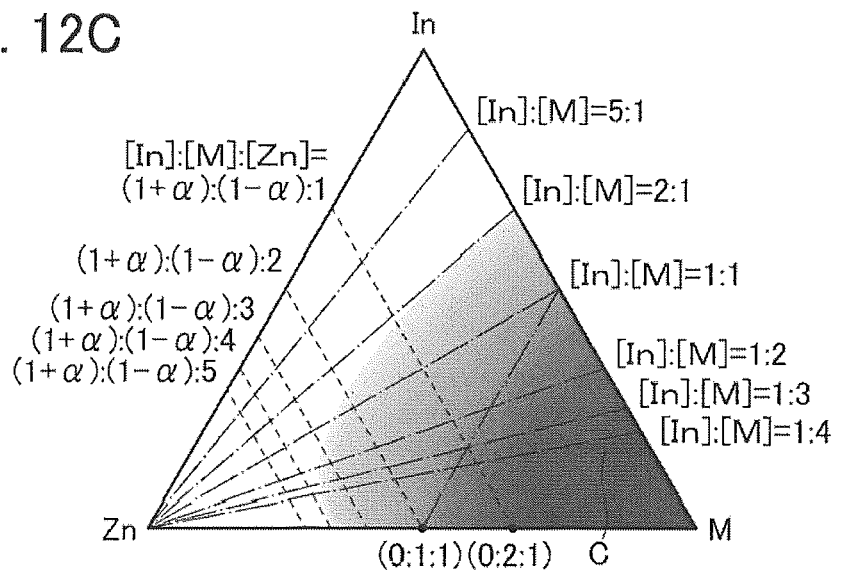

In FIGS. 12A to 12C, broken lines indicate a line where the atomic ratio [In]:[M]:[Zn] is $(1+\alpha):(1-\alpha):1$ (where $-1 \le \alpha \le 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+a):(1-\alpha):5$.

Dashed-dotted lines indicate a line where the atomic ratio [In]:[M]:[Zn] is $1:1:\beta$ (where $\beta \ge 0$), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

A dashed-double dotted line indicates a line where the atomic ratio [In]:[M]:[Zn] is $(1+\gamma):2:(1-\gamma)$, where $-1 \le \gamma \le 1$.

A plurality of phases (e.g., two phases or three phases) exist in the In-M-Zn oxide in some cases. For example, with an atomic ratio [In]:[M]:[Zn] close to 0:2:1, two phases of a spinel crystal structure and a layered crystal structure are likely to exist. In addition, with an atomic ratio [In]:[M]:[Zn] close to 1:0:0, two phases of a bixbyite crystal structure and a layered crystal structure are likely to exist. In the case where a plurality of phases exist in the In-M-Zn oxide, a grain boundary might be formed between different crystal structures.

In addition, the In-M-Zn oxide with a higher content of indium can have high carrier mobility (electron mobility). In-M-Zn oxides in a region A in FIG. 12A are likely to have layered structures with high carrier mobility and few grain boundaries.

A region B in FIG. 12B represents atomic ratios [In]:[M]:[Zn] of 4:2:3 to 4:2:4.1 and the vicinity thereof. The vicinity includes an atomic ratio [In]:[M]:[Zn] of 5:3:4. In-M-Zn oxides with atomic ratios represented by the region B have particularly high crystallinity and high carrier mobility.

When the indium content and the zinc content in an In-M-Zn oxide become lower, the carrier mobility becomes lower. Thus, with an atomic ratio [In]:[M]:[Zn] of 0:1:0 or around 0:1:0 (e.g., a region C in FIG. 12C), insulation performance becomes better.

The description of the oxide semiconductor 230 will be continued below.

It is preferable to use an oxide semiconductor with any of the atomic ratios represented by the region A in FIG. 12A for the oxide semiconductor 230b functioning as a channel formation region. It is more preferable to use an oxide semiconductor with any of the atomic ratios represented by the region B in FIG. 12B for the oxide semiconductor 230b.

For the oxide semiconductor 230a and the oxide semiconductor 230c, it is preferable to use an oxide semiconductor with any of the atomic ratios represented by the region C in FIG. 12C.

In the case where an oxide semiconductor with the atomic ratio represented by the region A in FIG. 12A is used as the oxide semiconductor 230b, it is particularly preferable to use an oxide semiconductor with [M]/[In] of greater than or equal to 1, preferably greater than or equal to 2, as each of the oxide semiconductors 230a and 230c. In addition, it is suitable to use an oxide semiconductor with sufficiently high insulation performance and [M]/([Zn]+[In]) of greater than or equal to 1 for the oxide semiconductor 230c.

The oxide semiconductor 230c has lower crystallinity than the oxide semiconductor 230b in some cases. The oxide semiconductor 230b preferably includes a CAAC-OS which will be described later. The reduction in crystallinity of the oxide semiconductor 230c makes the oxide semiconductor 230c have a higher oxygen-transmitting property, leading to easy supply of oxygen from the insulator positioned above the oxide semiconductor 230c to the oxide semiconductor 230b. Here, the oxide semiconductor 230c may be an amorphous semiconductor or amorphous-like (a-like) OS described later.

The oxide semiconductor 230a may include a CAAC-OS. Furthermore, the oxide semiconductor 230a preferably has higher crystallinity than the oxide semiconductor 230c.

[Insulator 220, 222, 224]

Each of the insulators 220 and 224 is preferably an insulator containing oxygen, such as a silicon oxide film or a silicon oxynitride film. In particular, the insulator 224 is preferably an insulator containing excess oxygen. In the case where such an insulator containing excess oxygen is provided in contact with the oxide semiconductor 230, oxygen vacancies in the oxide can be compensated. Note that the insulators 220 and 224 are not necessarily formed of the same material.

The insulator 222 preferably has a single-layer structure or a stacked-layer structure formed using an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba, Sr)TiO$_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material but may be formed of different materials.

In the case where the insulator 222 including a high-k material is provided between the insulator 220 and the insulator 224, the insulator 222 can be negatively charged. That is, the insulator 222 can function as a charge accumulation layer.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for ten milliseconds or longer, typically one minute or longer. Thus, electrons are moved from the oxide in the transistor OS1 to the conductor 205. At this time, some of the moving electrons are trapped by the electron trap states of the insulator 222.

In the transistor in which a necessary amount of electrons is trapped by the electron trap states of the insulator 222, $V_{th}$ is shifted in the positive direction. By controlling the voltage of the conductor 205, the amount of electrons to be trapped can be controlled, and thus $V_{th}$ can be controlled.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging.

Furthermore, $V_{th}$ can be controlled by appropriate adjustment of the thicknesses of the insulator 220, the insulator 222, and the insulator 224. A transistor having low leakage current in an off state can be provided. The insulator 220, the insulator 222, and the insulator 224 are preferably thin, in which case, $V_{th}$ can be easily controlled by the conductor 205. For example, each of the insulator 220, the insulator 222, and the insulator 224 has a thickness of 50 nm or less, preferably 30 nm or less, further preferably 10 nm or less, furthermore preferably 5 nm or less.

[Insulator 250]

The insulator 250 can have a single-layer structure or a stacked-layer structure using, for example, an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba, Sr)TiO$_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

Like the insulator 224, an insulator containing excess oxygen is preferably used for the insulator 250. When the insulator 250 contains excess oxygen, oxygen vacancies in the oxide semiconductor 230 can be reduced.

As the insulator 250, an insulating film formed of aluminum oxide, aluminum oxynitride, hafnium oxide, hafnium oxynitride, silicon nitride, or the like, which has barrier properties against oxygen and hydrogen, can be used. The insulator formed of such a material functions as a layer that prevents release of oxygen from the oxide semiconductor 230 or entry of an impurity such as hydrogen from the outside.

Note that the insulator 250 may have a stacked-layer structure similar to that of the insulator 220, the insulator 222, and the insulator 224. When the insulator 250 includes an insulator in which a necessary amount of electrons is trapped by electron trap states, $V_{th}$ of the transistor OS1 can be shifted in the positive direction. The transistor OS1 having the structure is a normally-off transistor that is in a non-conduction state (also referred to as an off state) even when the gate voltage is 0 V.

In addition to the insulator 250, a barrier film may be provided between the oxide semiconductor 230 and the conductor 260 in the semiconductor device illustrated in FIGS. 1A to 1D. The oxide semiconductor 230c may have a barrier property.

For example, an insulator containing excess oxygen is provided in contact with the oxide semiconductor 230 and covered by a barrier film, whereby the composition of the oxide semiconductor can be almost the same as the stoichiometric composition or can be in a supersaturated state containing more oxygen than that in the stoichiometric composition. It is also possible to prevent entry of impurities such as hydrogen into the oxide semiconductor 230.

[Conductor 240a and Conductor 240b]

One of the conductor 240a and the conductor 240b functions as a source electrode, and the other functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 240a and 240b. Although a single layer structure is illustrated, a stacked-layer structure of two or more layers may be used.

For example, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

The conductor 260 functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. Furthermore, one or both of manganese and zirconium may be used. Alternatively, a semiconductor typified by polycrystalline silicon doped with an impurity element such as phosphorus, or a silicide such as nickel silicide may be used.

For example, a two-layer structure in which a titanium film is stacked over an aluminum film may be employed. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. An alloy film or a nitride film that contains aluminum and one or more metals selected from titanium, tantalum, tungsten, molybdenum, chromium, neodymium, and scandium may be used.

[Insulator 280]

The insulator 280 is provided over the transistor OS1. The insulator 280 preferably contains excess oxygen. It is particularly preferable that an interlayer film near the oxide semiconductor 230 contain excess oxygen because oxygen vacancies in the oxide semiconductor 230 can be reduced and the reliability can be improved.

As the insulator containing excess oxygen, specifically, an oxide material that releases part of oxygen by heating is preferably used. An oxide material that releases part of oxygen by heating is an oxide film of which the amount of released oxygen converted into oxygen atoms is greater than or equal to $1.0\times10^{18}$ atoms/cm³, preferably greater than or equal to $3.0\times10^{20}$ atoms/cm³ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 covering the transistor OS1 may function as a planarization film that covers a roughness thereunder.

Next, the modification examples of the transistor OS1 will be described.

<<Modification Example 1 of Transistor OS1>>

Figure 13A:
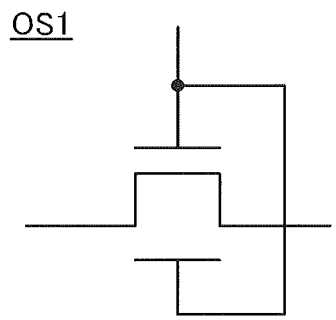
FIGS. 13A to 13D are a circuit diagram, a top view, and cross-sectional views illustrating a structure example of a transistor.
Figure 13B:
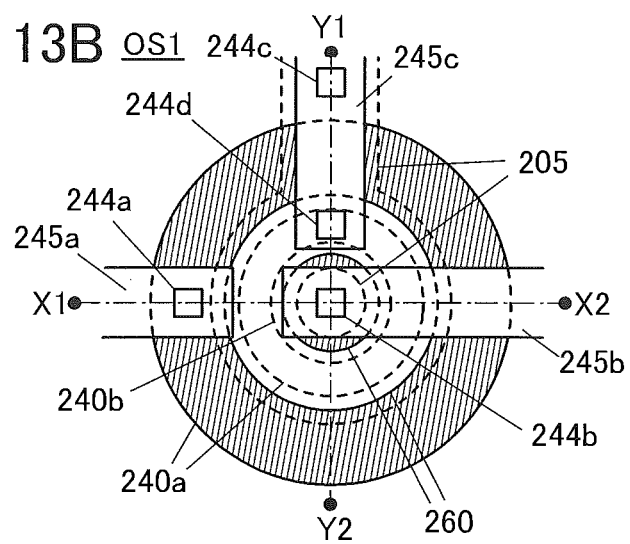
Figure 13C:
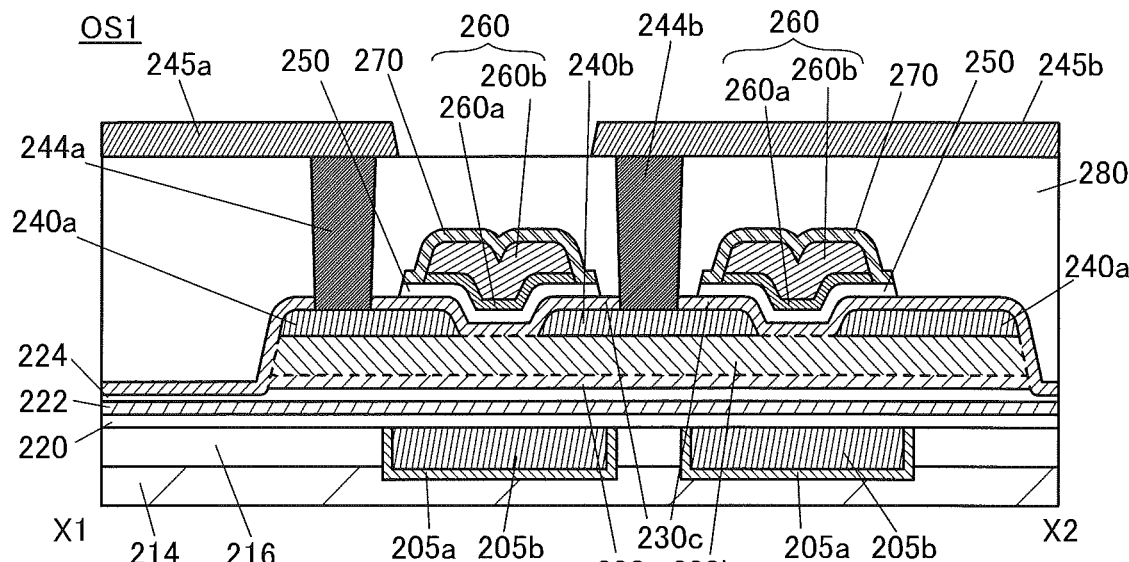
Figure 13D:
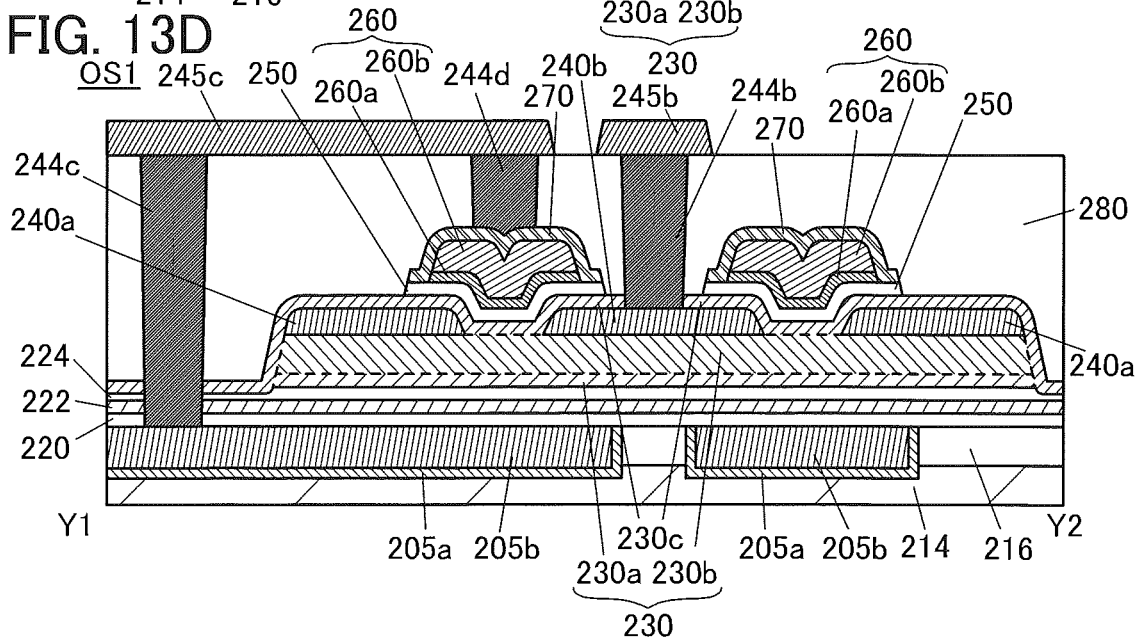

FIGS. 13A to 13D illustrate a modification example of the transistor OS1. FIG. 13A is a circuit diagram, FIG. 13B is a top view, and FIGS. 13C and 13D are cross-sectional views. FIG. 13C is the cross-sectional view taken along dashed-dotted line X1-X2 in FIG. 13B. FIG. 13D is the cross-sectional view taken along dashed-dotted line Y1-Y2 in FIG. 13B. For simplification of the drawing, some components are not illustrated in the top view of FIG. 13B.

In the structure illustrated in FIGS. 13A to 13D, the conductor 260 functioning as a gate electrode has a stacked structure of the conductors 260a and 260b. Furthermore, an insulator 270 is formed over the conductor 260 functioning as the gate electrode.

The conductor 260a is formed by a thermal CVD method, an MOCVD method, or an ALD method. In particular, the conductor 260a is preferably formed by an ALD method. By employing an ALD method or the like, plasma damage to the insulator 250 can be reduced. Furthermore, it is preferable to form the conductor 260a by an ALD method or the like, because coverage can be improved. Thus, the transistor OS1 having high reliability can be provided.

The conductor 260b is formed using a material having high conductivity such as tantalum, tungsten, copper, or aluminum.

The insulator 270 is provided to cover the conductor 260. In the case where the insulator 280 is formed using an oxide material from which oxygen is released, the insulator 270 is formed using a substance having a barrier property against oxygen to prevent the conductor 260 from being oxidized by the released oxygen.

For example, the insulator 270 can be formed using metal oxide such as aluminum oxide. The insulator 270 is formed to a thickness with which the oxidation of the conductor 260 is prevented. For example, the thickness of the insulator 270 is set greater than or equal to 1 nm and less than or equal to 10 nm, preferably greater than or equal to 3 nm and less than or equal to 7 nm.

Thus, the oxidation of the conductor 260 can be prevented, and oxygen released from the insulator 280 can be supplied to the oxide semiconductor 230 efficiently.

For the other components of the transistor OS1 illustrated in FIGS. 13A to 13D, the description of those of the transistor OS1 illustrated in FIGS. 1A to 1D can be referred to.

<<Modification Example 2 of Transistor OS1>>

Figure 14A:
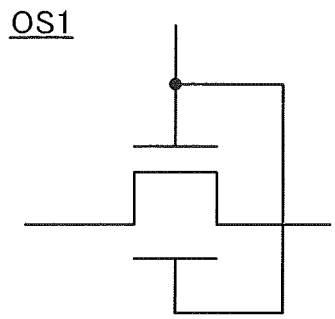
FIGS. 14A to 14D are a circuit diagram, a top view, and cross-sectional views illustrating a structure example of a transistor.
Figure 14B:
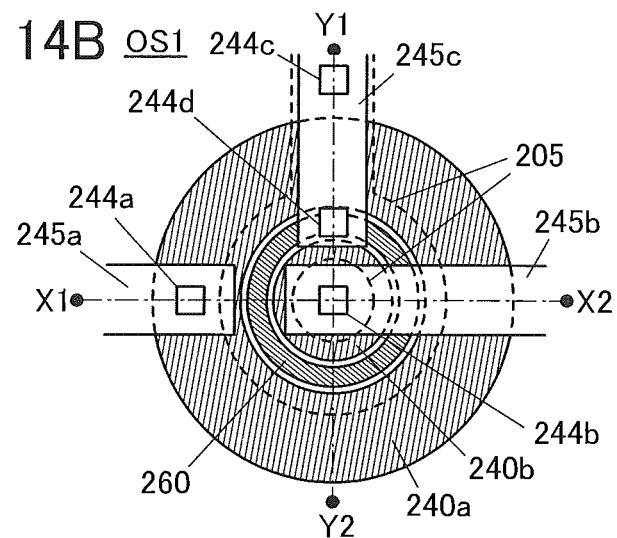
Figure 14C:
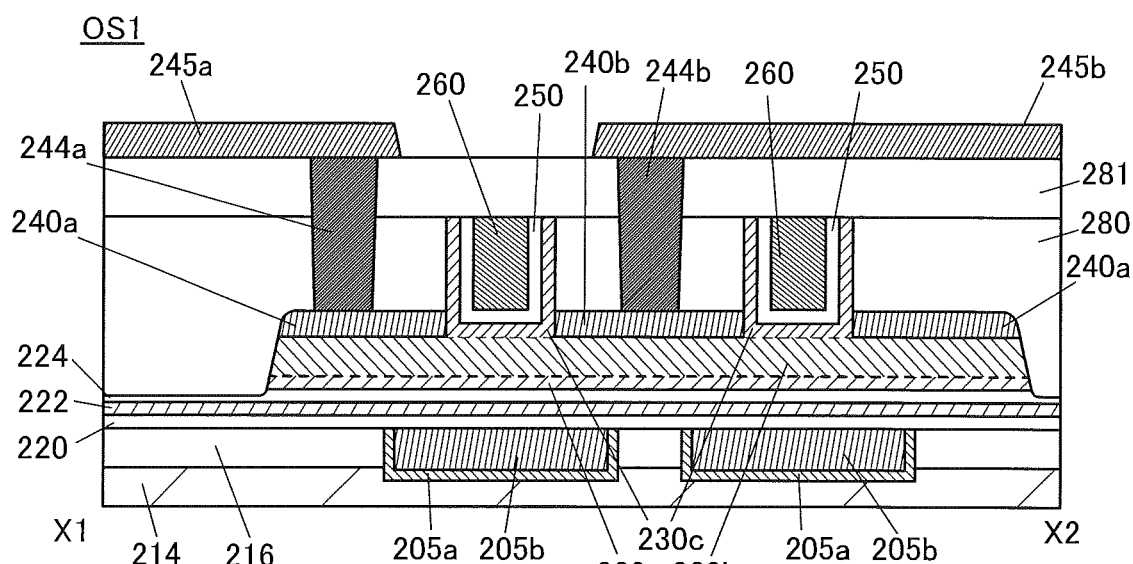
Figure 14D:
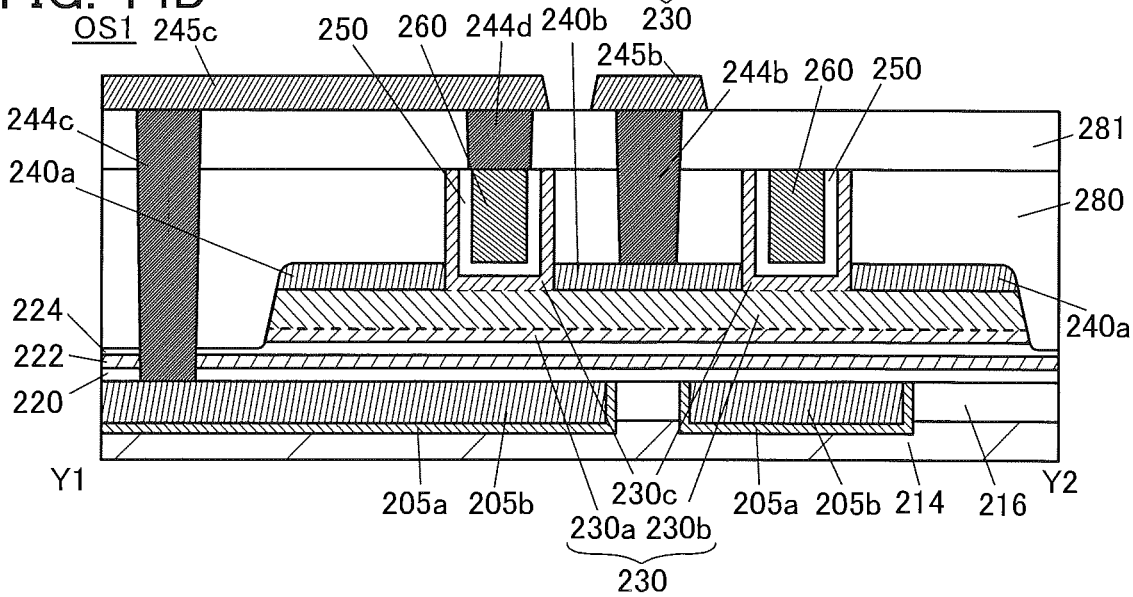

FIGS. 14A to 14D illustrate a modification example of the transistor OS1. FIG. 14A is a circuit diagram, FIG. 14B is a top view, and FIGS. 14C and 14D are cross-sectional views. FIG. 14C is the cross-sectional view taken along dashed-dotted line X1-X2 in FIG. 14B. FIG. 14D is the cross-sectional view taken along dashed-dotted line Y1-Y2 in FIG. 14B. For simplification of the drawing, some components are not illustrated in the top view of FIG. 14B.

In the transistor OS1 illustrated in FIGS. 14A to 14D, the oxide semiconductor 230c, the insulator 250, and the conductor 260 are formed in an opening formed in the insulator 280. Furthermore, an insulator 281 is provided between the conductor 260 and the wiring 245b.

Since the transistor OS1 illustrated in FIGS. 14A to 14D has a structure in which the conductors 240a and 240b hardly overlap with the conductor 260, the parasitic capacitance added to the conductor 260 can be reduced. Thus, the transistor OS1 with a high operation frequency can be provided.

For the other components of the transistor OS1 illustrated in FIGS. 14A to 14D, the description of those of the transistor OS1 illustrated in FIGS. 1A to 1D can be referred to.

(Embodiment 3)

In this embodiment, application examples of the circuit 10 described in Embodiment 1 are described with reference to FIGS. 15A to 15F, FIG. 16, FIG. 17, FIG. 18, FIG. 19, FIG. 20, FIG. 21, FIG. 22, FIG. 23, FIG. 24, FIG. 25, FIG. 26, FIGS. 27A and 27B, and FIGS. 28A and 28B.

<<Nonvolatile Memory>>

First, an example in which the circuit 10 is used for a nonvolatile memory will be described.

[Memory Cell 100]

Figure 15A:
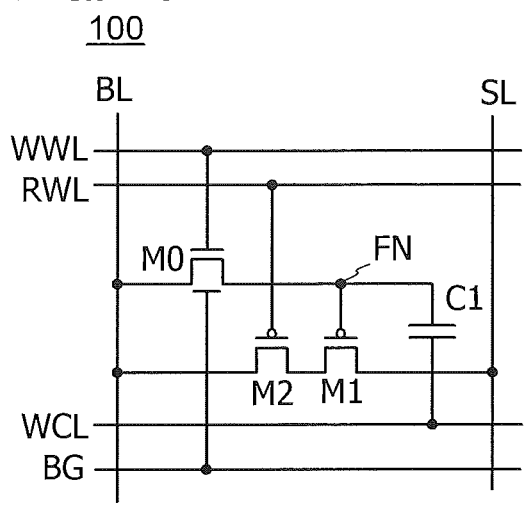
FIGS. 15A to 15F are circuit diagrams each illustrating a configuration example of a memory cell.

A memory cell 100 in FIG. 15A includes the transistor M0, a transistor M1, a transistor M2, and a capacitor C1.

The memory cell 100 is electrically connected to a wiring BL, a wiring SL, a wiring WWL, a wiring RWL, a wiring WCL, and a wiring BG.

A node where one of a source and a drain of the transistor M0, a gate of the transistor M1, and a first terminal of the capacitor C1 are electrically connected to one another is referred to as the node FN. One of a source and a drain of the transistor M1 is electrically connected to the wiring SL, and the other of the source and the drain of the transistor M1 is electrically connected to the wiring BL through the transistor M2. A gate of the transistor M2 is electrically connected to the wiring RWL.

The other of the source and the drain of the transistor M0 is electrically connected to the wiring BL. A first gate of the transistor M0 is electrically connected to the wiring WWL, and a second gate of the transistor M0 is electrically connected to the wiring BG.

A second terminal of the capacitor C1 is electrically connected to the wiring WCL.

The transistor M0 functions as a switch that controls writing of data to the node FN by being switched between a conducting state and a non-conducting state.

Note that a transistor with low cutoff current is suitable for the transistor M0. An OS transistor or a transistor including a wide-bandgap semiconductor in a channel formation region is suitable for the transistor M0.

The node FN can retain 1-bit (binary) data when the transistor M0 is turned off. The node FN can retain not only 1-bit data but also K-bit ($2^K$-valued, where K is a natural number of two or more) data.

The case where 1-bit data is retained in the node FN is described below.

Writing and reading operations of the memory cell 100 are described below with reference to FIG. 16. Note that the transistor M0 is an n-channel transistor and the transistors M1 and M2 are p-channel transistors in the following description.

Figure 16:
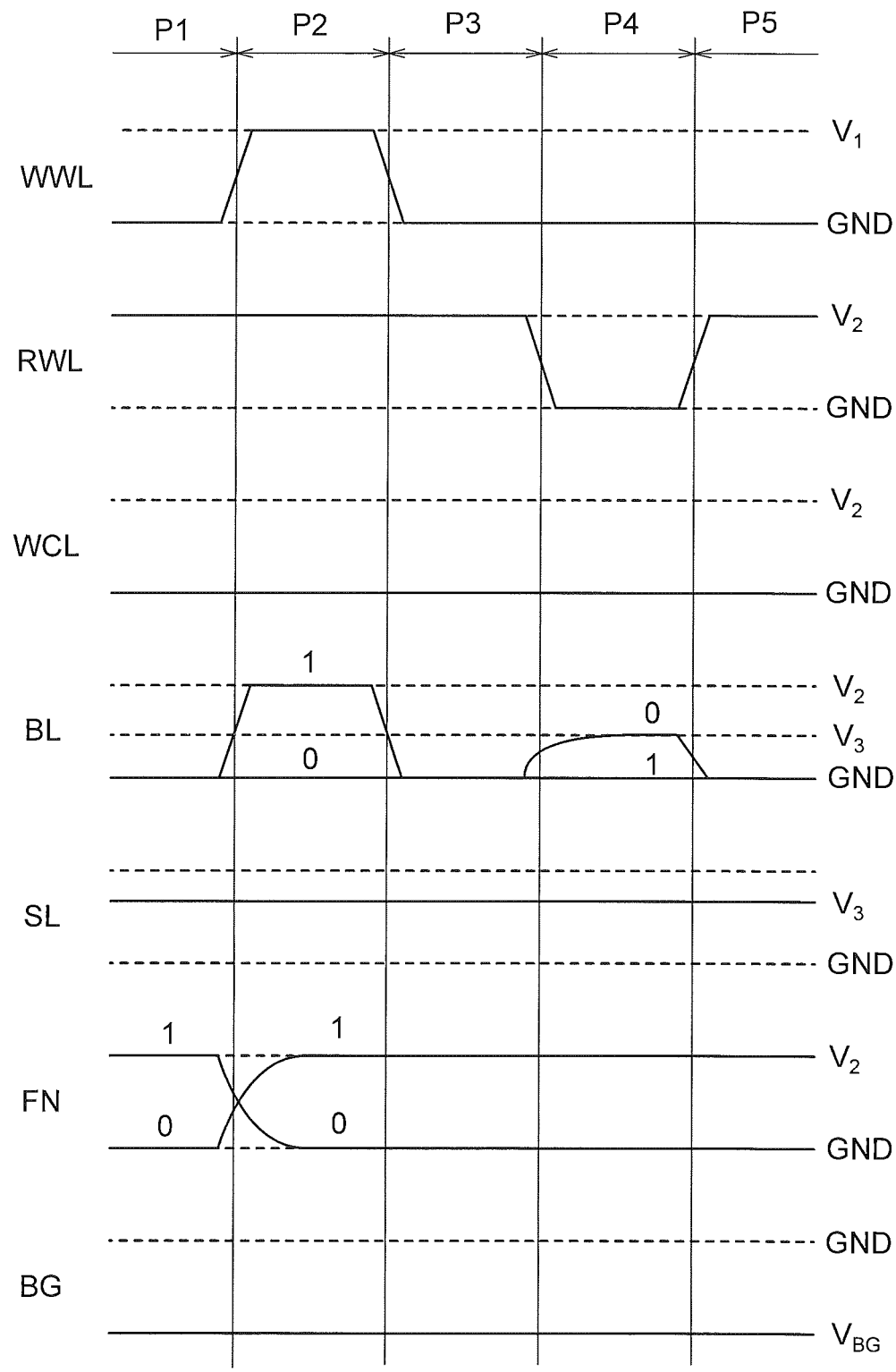
FIG. 16 is a timing chart showing an operation example of a memory cell.

FIG. 16 is a timing chart illustrating an operation example of the memory cell 100. The timing chart shows the potentials applied to, from the top, the wiring WWL, the wiring RWL, the wiring WCL, the wiring BL, the wiring SL, the node FN, and the wiring BG. The timing chart in FIG. 16 can be divided into the periods P1 to P5.

The periods P1, P3, and P5 are standby periods of the memory cell 100. The period P2 is a write period of the memory cell 100. The period P4 is a read period of the memory cell 100.

Note that in the periods P1 to P5, the wiring WCL is constantly supplied with the potential GND. The potential GND is preferably a low power supply potential or a ground potential.

Furthermore, in the periods P1 to P5, the wiring SL is constantly supplied with a potential $V_3$ and the wiring BG is constantly supplied with a potential $V_{BG}$. The potential $V_{BG}$ is preferably a negative potential. When the potential $V_{BG}$ that is a negative potential is supplied, the transistor M0 can be normally off.

Operations in the respective periods are described in order below.

First, in the period P1, the wirings WWL and BL are supplied with the potential GND and the wiring RWL is supplied with a potential $V_2$. At this time, the transistor M2 is off and no current flows between the wiring BL and the wiring SL. In order that the transistor M2 can be off, a difference between the potential $V_2$ and the potential $V_3$ ($V_2-V_3$) is preferably larger than the threshold voltage of the transistor M2.

Then, in the period P2, the wiring WWL is supplied with a potential $V_1$ and the wiring BL is supplied with the potential $V_2$ (data "1") or the potential GND (data "0"). The potential $V_1$ is preferably higher than the sum of the potential $V_2$ and the threshold voltage of the transistor M0. At this time, the transistor M0 is turned on and the data applied to the wiring BL is written in the node FN.

Next, in the period P3, the wiring WWL and the wiring BL are supplied with the potential GND. At this time, the transistor M0 is turned off and the data written in the node FN is retained.

Next, in the period P4, the wiring BL is brought into an electrically floating state and the wiring RWL is supplied with the potential GND. At this time, the transistor M2 is turned on.

If the data "1" is written in the node FN, the transistor M1 is off, so that no current flows between the wiring SL and the wiring BL and the wiring BL remains at the potential GND. In order that the transistor M1 can be off, a difference between the potential $V_2$ and the potential $V_3$ ($V_2-V_3$) is preferably larger than the threshold voltage of the transistor M1.

If the data "0" is written in the node FN, the transistor M1 is on, so that the wiring SL and the wiring BL are electrically connected and the wiring BL is charged until it has the potential $V_3$ (until the potential of the wiring BL becomes equal to that of the wiring SL). In order that the transistor M1 can be on, a difference between the potential GND and the potential $V_3$ ($-V_3$) is preferably smaller than the threshold voltage of the transistor M1. In order that the transistor M2 can be on, a difference between the potential GND and the potential $V_3$ ($-V_3$) is preferably smaller than the threshold voltage of the transistor M2.

In the period P4, the potential of the wiring BL is read to determine the data written in the node FN.

Then, in the period P5, the wiring RWL is supplied with the potential $V_2$ and the wiring BL is supplied with the potential GND, so that the data in the node FN is retained.

As described above, through the operations in the periods P1 to P5, data reading from and data writing to the memory cell 100 can be performed.

Figure 15B:
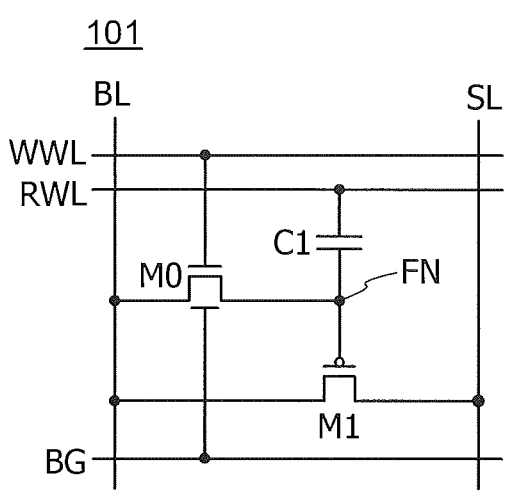

Note that in the memory cell 100 in FIG. 15A, the transistor M2 and the wiring WCL are not necessarily provided, and the second terminal of the capacitor C1 may be connected to the wiring RWL. FIG. 15B is a circuit diagram illustrating such a case. The number of transistors in a memory cell 101 in FIG. 15B is smaller than that in the memory cell 100 in FIG. 15A. Thus, the area occupied by the circuit in FIG. 15B can be reduced. As a result, the degree of integration of the memory cell can be increased.

Figure 15C:
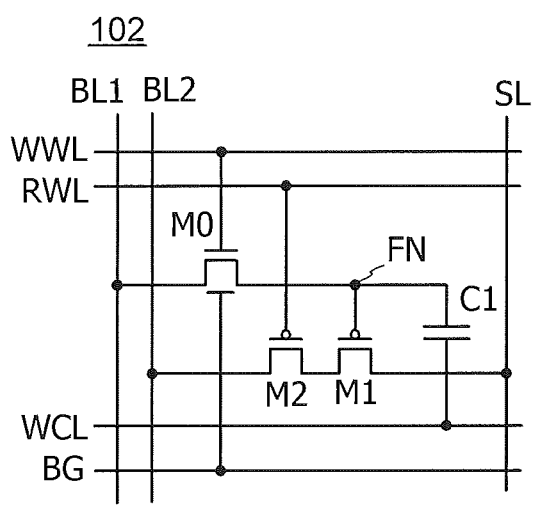

The wiring BL in the memory cell 100 illustrated in FIG. 15A may be replaced by two wirings, a wiring BL1 and a wiring BL2. FIG. 15C is a circuit diagram illustrating such a case. In a memory cell 102 illustrated in FIG. 15C, data is written to the node FN through the wiring BL1 and the transistor M0. The memory cell 102 determines data written to the node FN by reading the potential of the wiring BL2.

Figure 15D:
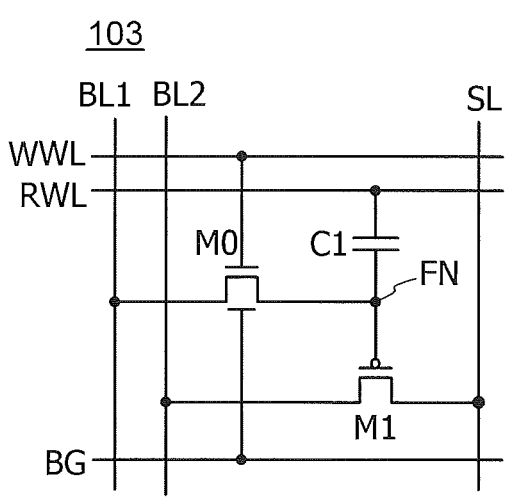

Similarly, the wiring BL in the memory cell 101 illustrated in FIG. 15B may be replaced by two wirings, the wiring BL1 and the wiring BL2. FIG. 15D is a circuit diagram illustrating such a case. In a memory cell 103 illustrated in FIG. 15D, data is written to the node FN through the wiring BL1 and the transistor M0. The memory cell 103 determines data written to the node FN by reading the potential of the wiring BL2.

As described above, the memory cell 102 and the memory cell 103 each provided with a writing wiring and a reading wiring separately can be prevented from malfunction.

Figure 15E:
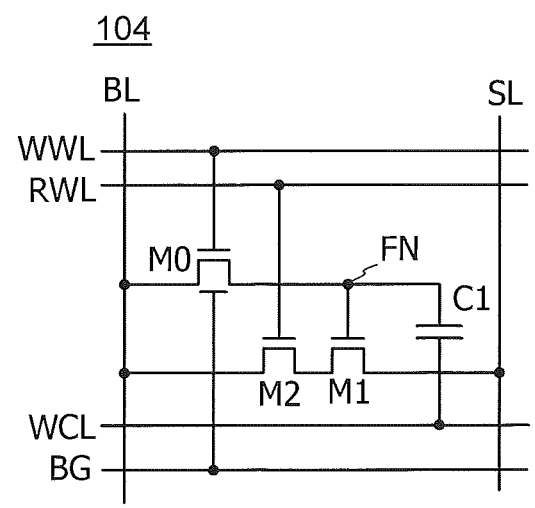

The transistors M1 and M2 in the memory cell 100 illustrated in FIG. 15A can be n-channel transistors. FIG. 15E is a circuit diagram of a memory cell 104 in such a case.

Figure 15F:
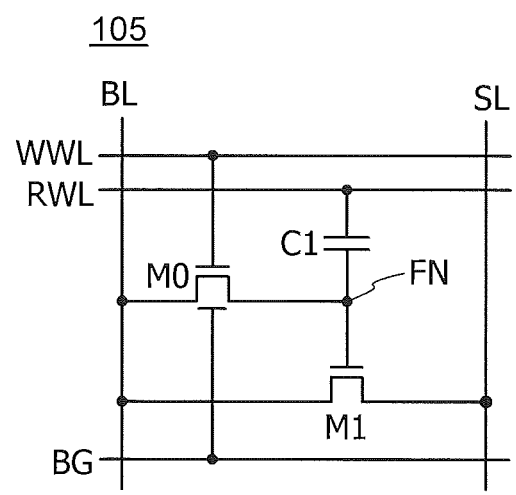

Similarly, the transistor M1 in the memory cell 101 illustrated in FIG. 15B can be an n-channel transistor. FIG. 15F is a circuit diagram of a memory cell 105 in such a case.

Unlike a flash memory, the memory cells 100 and 101 have no limitation on the number of writing. Furthermore, power consumption in writing and reading is reduced. Thus, a memory device with high reliability and low power consumption can be provided when the memory cell 100 is used for a nonvolatile memory.

[Memory Device 110]

Figure 17:
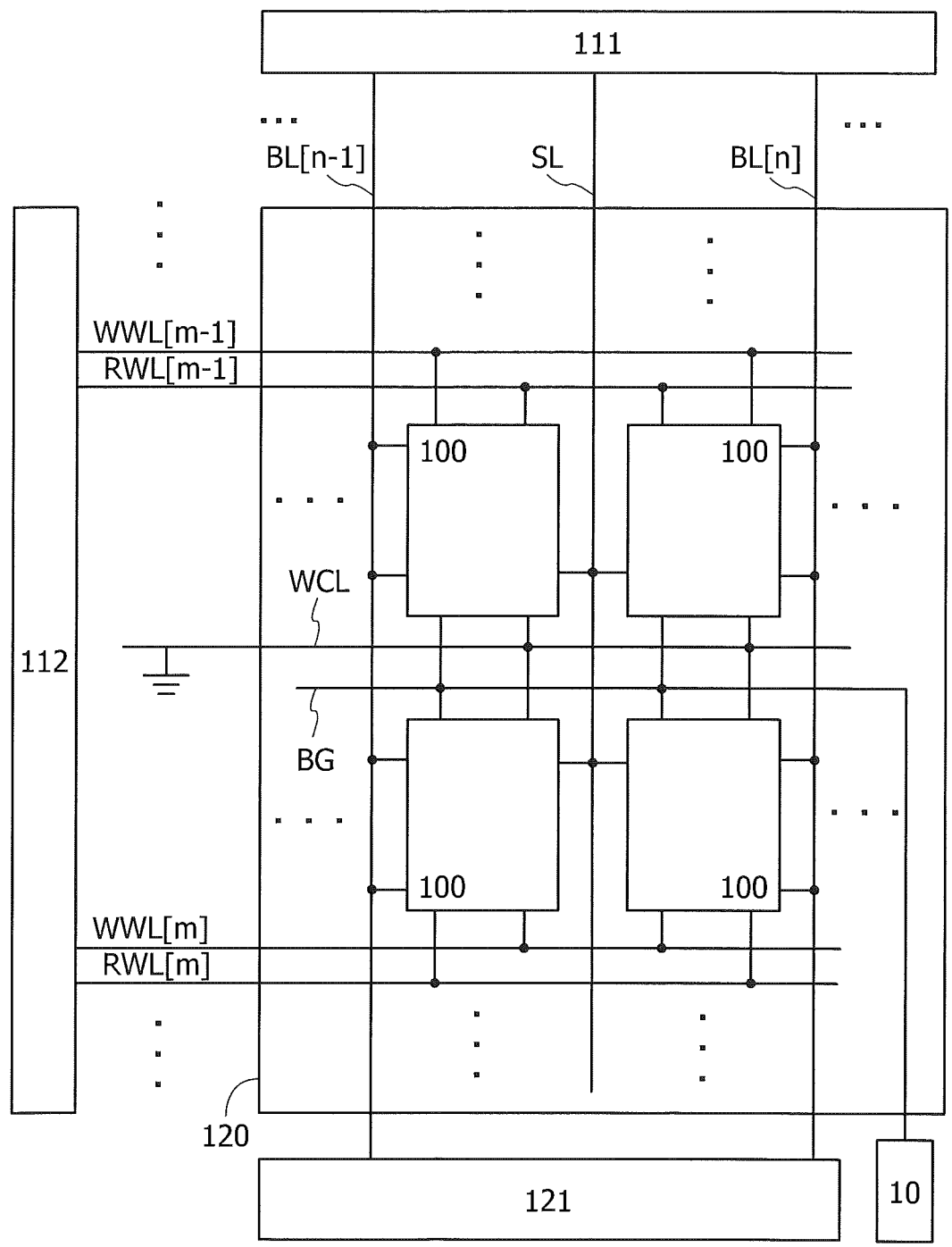
FIG. 17 is a circuit block diagram illustrating a configuration example of a memory.

A memory device 110 in FIG. 17 includes a memory cell array 120 provided with a plurality of memory cells 100, a row driver 112, a column driver 111, a reading circuit 121, and the circuit 10. The memory device 110 includes the memory cells 100 arranged in a matrix of m rows (m is a natural number of two or more) and n columns (n is a natural number of two or more).

FIG. 17 illustrates a wiring WWL[m−1] and a wiring RWL[m−1] that are connected to the memory cells 100 in the (m−1)-th row, a wiring WWL[m] and a wiring RWL[m] that are connected to the memory cells 100 in the m-th row, the wiring WCL that is connected to the memory cells 100 in the (m−1)-th and m-th rows, and the wiring BG that is connected to the memory cells 100 in the (m−1)-th and m-th rows.

In addition, FIG. 17 illustrates a wiring BL[n−1] that is connected to the memory cells 100 in the (n−1)-th column, a wiring BL[n] that is connected to the memory cells 100 in the n-th column, and the wiring SL that is connected to the memory cells 100 in the (n−1)-th and n-th columns.

In the memory cell array 120 illustrated in FIG. 17, the wirings SL, WCL, and BG are shared by adjacent memory cells. This structure reduces the area occupied by the wirings. Thus, a memory device with this structure can have high memory capacity per unit area.

Note that in FIG. 17, the memory cell 101 in FIG. 15B may be used instead of the memory cell 100. In that case, the wiring WCL can be omitted.

The row driver 112 is a circuit having a function of selectively turning on the transistors M0 and M2 in the memory cells 100 of each row. With the row driver 112, the memory cells 100 can be selected row by row, and data can be written and read to/from the selected memory cells 100 in the memory device 110.

The column driver 111 is a circuit having a function of selectively writing data in the node FN in the memory cells 100 of each column, a function of initializing the potential of the wiring BL, and a function of making the wiring BL electrically floating. Specifically, the column driver 111 is a circuit that supplies a potential corresponding to data to the wiring BL. With the column driver 111, the memory cells 100 can be selected column by column, and data can be written and read to/from the selected memory cells 100 in the memory device 110.

The reading circuit 121 is a circuit that has a function of reading out data retained in the memory cells 100 from the wiring BL and outputting it to the outside as digital data.

The circuit 10 described in Embodiment 1 is connected to the wiring BG. The circuit 10 has a function of controlling the potential of the second gate of the transistor M0 included in each memory cell connected to the wiring BG.

By the circuit 10, a negative potential can be applied to the second gate of the transistor M0 included in the memory cell 100 and can be continuously held. By the circuit 10 in the memory device 110, the cutoff current of the transistors M0 can be reduced, and data retention characteristics can be improved.

[Row Driver 112]

Figure 18:
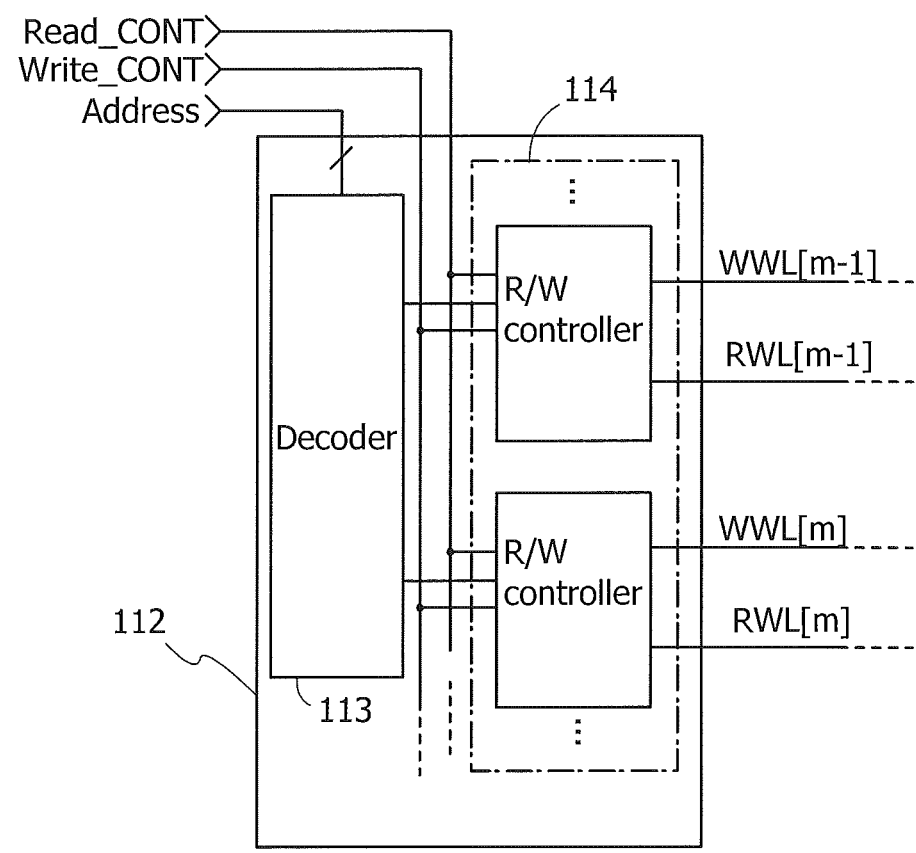
FIG. 18 is a circuit diagram illustrating a configuration example of a row driver.

FIG. 18 is a block diagram illustrating a structure example of the row driver 112 illustrated in FIG. 17.

The row driver 112 illustrated in FIG. 18 includes a decoder 113 and read/write control circuits 114. The read/write control circuits 114 are connected to the wirings WWL and the wirings RWL.

The decoder 113 is a circuit that outputs a signal for selecting any of the rows. Specifically, the decoder 113 is a circuit which receives an address signal (Address) and selects the read/write control circuit 114 of any of rows in accordance with the Address. With the decoder 113, the row driver 112 can select a given row to perform writing and reading of data.

The read/write control circuit 114 is a circuit that has a function of outputting a write signal and selectively outputting a read signal, in a row selected by the decoder 113. Specifically, the read/write control circuit 114 is a circuit that receives a write control signal Write_CONT or a read control signal Read_CONT and selectively outputs a write signal or a read signal in accordance with the signal. With the read/write control circuit 114, the row driver 112 can select and output the write signal or the read signal in the row selected by the decoder 113.

[Column Driver 111]

Figure 19:
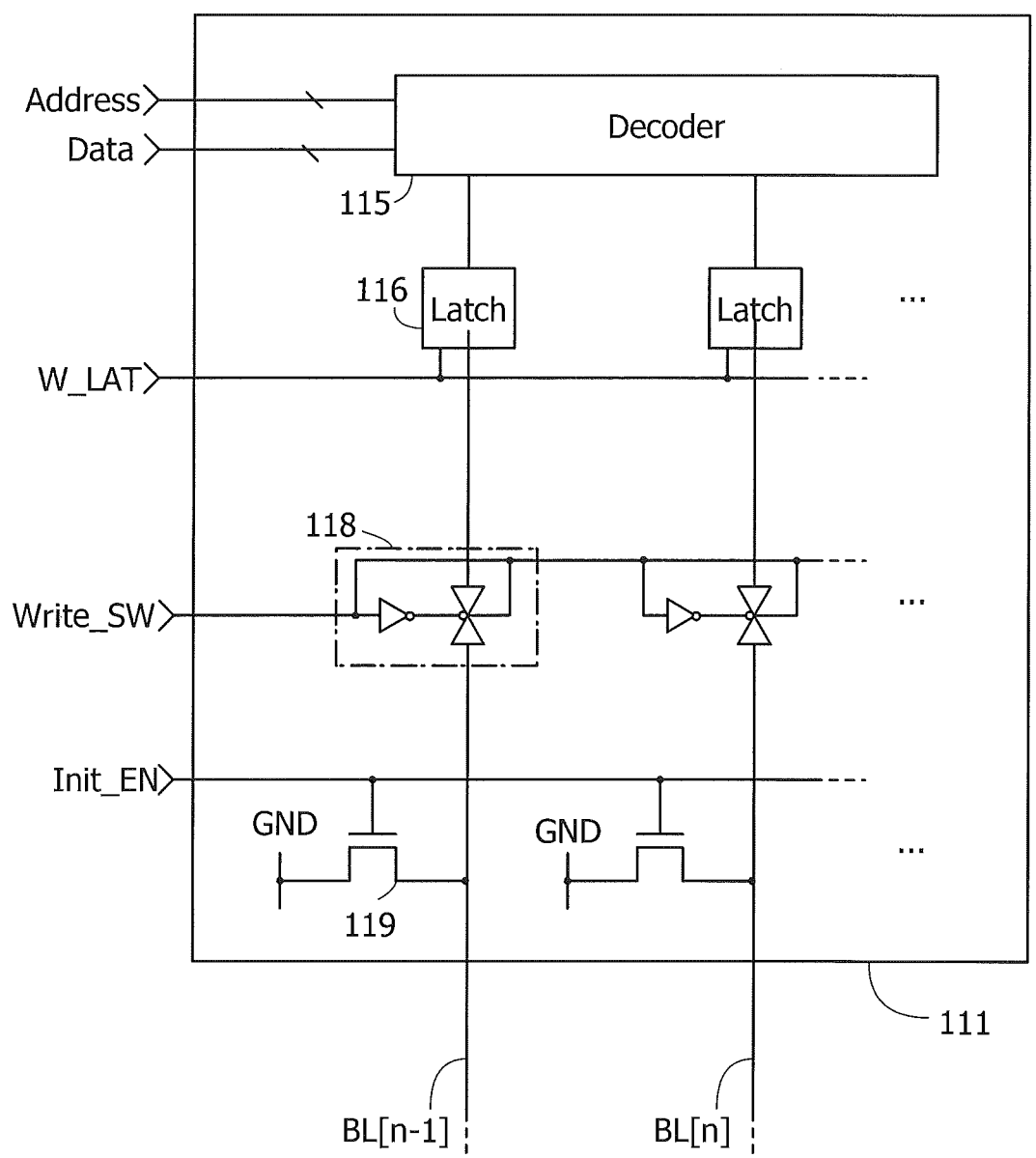
FIG. 19 is a circuit diagram illustrating a configuration example of a column river.

FIG. 19 is a block diagram illustrating a structure example of the column driver 111 in FIG. 17.

The column driver 111 in FIG. 19 includes a decoder 115, latch circuits 116, a switch circuit 118, and a transistor 119. The latch circuit 116, the switch circuit 118, and the transistor 119 are provided for every column. Furthermore, the switch circuit 118 and the transistor 119 in each column are connected to the wiring BL.

The decoder 115 is a circuit having a function of selecting a column of the wiring BL and sorting and outputting input data. Specifically, the decoder 115 receives an address signal (Address) and data (Data) and outputs the data (Data) to the latch circuit 116 of any of columns in accordance with the address signal (Address). With the decoder 115, the column driver 111 can select a given column to perform writing of data.

The latch circuit 116 is a circuit having a function of temporarily storing the input data (Data). Specifically, the latch circuit 116 is a flip-flop circuit that receives a latch signal W_LAT and outputs the data (Data) to the switch circuit 118 in accordance with the latch signal W_LAT. With the latch circuit 116, the column driver 111 can perform writing of data at given timing.

The switch circuit 118 is a circuit which has functions of supplying the input data to the wiring BL and bringing the wiring BL into an electrically floating state. Specifically, the switch circuit 118 includes an analog switch and an inverter, supplies the input data to the wiring BL in accordance with the control of a switch control signal Write_SW, and then, turning off the analog switch to bring the wiring BL into an electrically floating state. The switch circuit 118 enables the column driver 111 to keep the bit line BL in an electrically floating state after the data is supplied to the wiring BL.

The transistor 119 has a function of supplying an initialization voltage (GND) to the wiring BL and a function of bringing the wiring BL into an electrically floating state. Specifically, the transistor 119 is a switch that supplies an initialization voltage to the wiring BL in accordance with the control of an initialization control signal Init_EN, and then brings the wiring BL into an electrically floating state. The transistor 119 enables the column driver 111 to keep the wiring BL in an electrically floating state after the initialization voltage is supplied to the wiring BL.

[Read Circuit 121]

Figure 20:
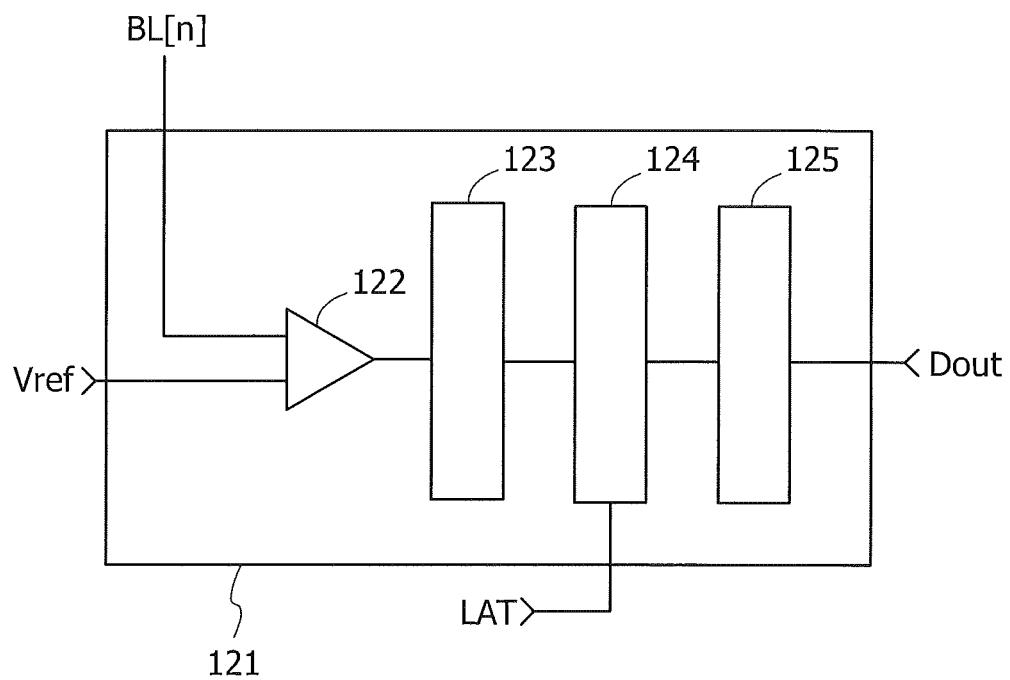
FIG. 20 is a circuit diagram illustrating a configuration example of a read circuit.

FIG. 20 is a block diagram illustrating a structure example of the reading circuit 121 illustrated in FIG. 17.

The reading circuit 121 in FIG. 20 includes a comparator 122, an encoder 123, a latch 124, and a buffer 125. The buffer 125 in each column outputs data Dout.

The comparator 122 is a circuit having a function of determining whether the potential of the wiring BL is a potential corresponding to either "0" or "1" by comparing the level of the potential of the wiring BL and the level of the potential of a reference voltage Vref.

The encoder 123 is a circuit having a function of generating a digital signal on the basis of a signal for determining the potential of the wiring BL which is output from the comparator 122. Specifically, the encoder 123 encodes an H-level or L-level signal output from the comparator 122 and generates a digital signal.

The latch 124 is a circuit having a function of temporarily storing input data of a digital value. Specifically, the latch 124 is a flip-flop circuit that receives a latch signal LAT and outputs data to the buffer 125 in accordance with the latch signal LAT. With the latch 124, the reading circuit 121 can output data at an opportune time. Note that the latch 124 can be omitted.

The buffer 125 is a circuit having a function of amplifying data output from the latch 124 and outputting the amplified data as an output signal (Dout). Specifically, the buffer 125 is a circuit which includes an even number of stages of inverter circuits. With the buffer 125, noise to a digital signal can be reduced in the circuit 121. Note that the buffer 125 can be omitted.

<<DRAM>>

Next, an example in which the circuit 10 is used for a DRAM will be described.

[Memory Cell 130]

Figure 21:
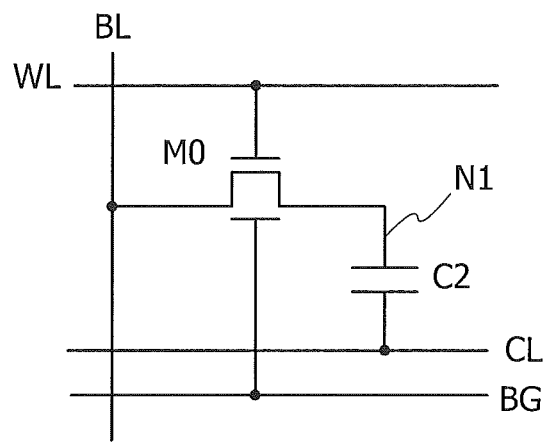
FIG. 21 is a circuit diagram illustrating a configuration example of a memory cell.

FIG. 21 illustrates a structure example of the memory cell 130. The memory cell 130 includes the transistor M0 and a capacitor C2. The first gate of the transistor M0 is electrically connected to the wiring WL, the first terminal of the transistor M0 is electrically connected to a first terminal of the capacitor C2, and the second terminal of the transistor M0 is electrically connected to the wiring BL. A second terminal of the capacitor C2 is electrically connected to a wiring CL. The second gate of the transistor M0 is electrically connected to the wiring BG. Here, a node of the first terminal of the transistor M0 and the first terminal of the capacitor C2 is denoted by the node N1.

Note that a transistor with low cutoff current is suitable for the transistor M0. An OS transistor or a transistor including a wide-bandgap semiconductor in a channel formation region is suitable for the transistor M0.

When the cutoff current of the transistor M0 is low, leakage of charge held in the node N1 can be reduced. Data stored in the memory cell 130 can be retained for a long time, and therefore the interval between refresh operations can be long. Specifically, the interval between refresh operations can be one hour or longer.

In the memory device including the memory cell 130 is used, power supply can be stopped for a long time during which data is not written or read; thus, power consumption can be reduced.

[Memory Device 131]

Figure 22:
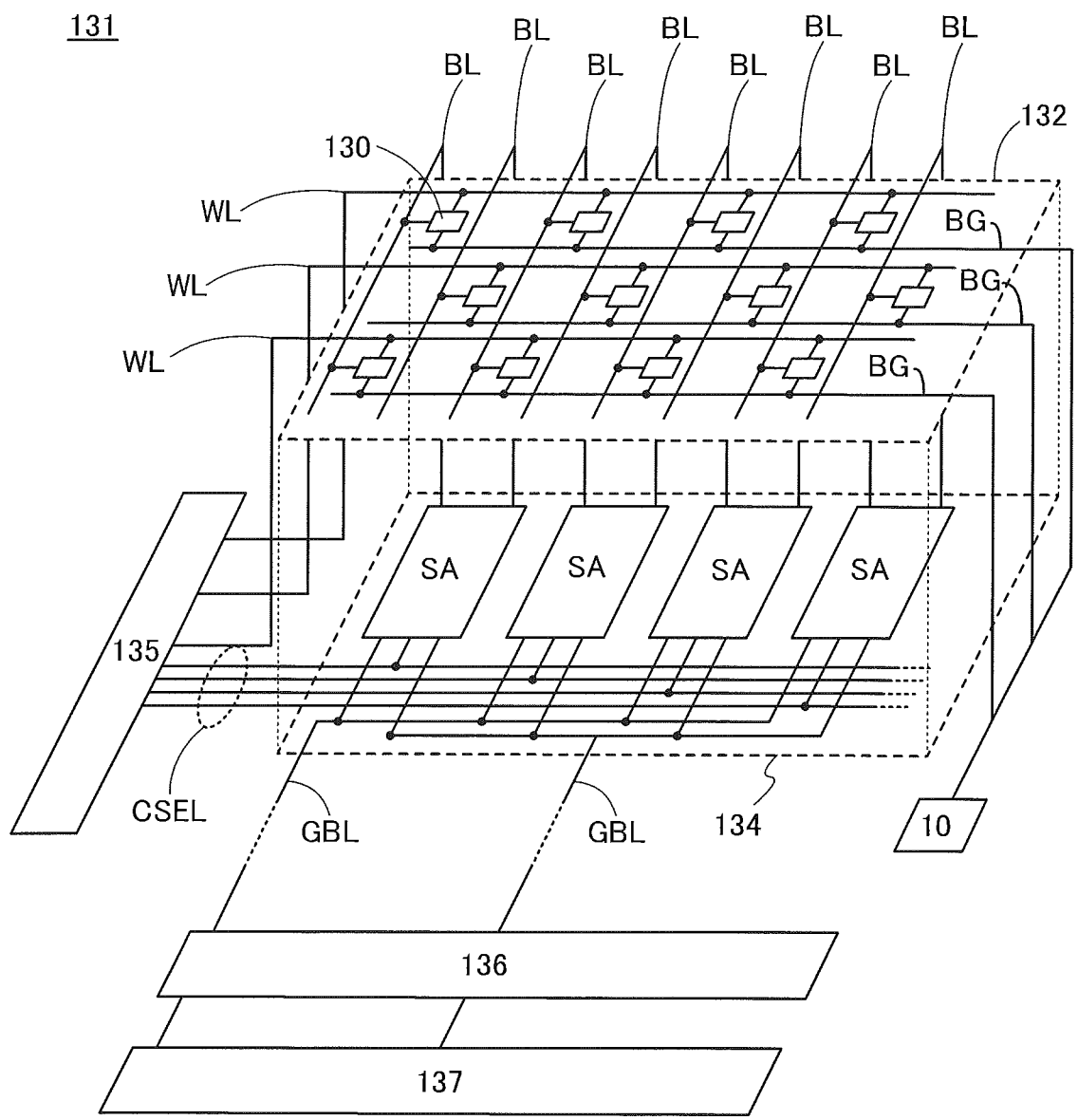
FIG. 22 is a circuit block diagram illustrating a configuration example of a memory.

A memory device 131 in FIG. 22 includes a cell array 132, a sense amplifier circuit 134, a driver circuit 135, a main amplifier 136, an input output circuit 137, and the circuit 10. The cell array 132 includes a plurality of memory cells 130. Each of the memory cells 130 is connected to the wiring WL and the wiring BL. The memory cells 130 are selected according to a potential supplied to the wiring WL, and a potential corresponding to data to be written to the memory cells 130 is supplied to the wiring BL (hereinafter, the potential is also referred to as writing potential); in this manner, data is written to the memory cells 130. Here, the case where the cell array 132 includes the memory cells 130 arranged in a matrix of i rows and j columns (i and j are natural numbers of 2 or more) is shown. Therefore, in the cell array 132, i wirings WL and j wirings BL are provided.

The sense amplifier circuit 134 is connected to the plurality of wirings BL and a plurality of wirings GBL. The sense amplifier circuit 134 has a function of amplifying a signal that is input and controlling output of the amplified signal. Specifically, the sense amplifier circuit 134 has a function of amplifying the potentials of the wirings BL (hereinafter, the potentials are also referred to as reading potentials), which correspond to data stored in the memory cells 130, and outputting them to the wirings GBL at a predetermined timing. Since the reading potentials are amplified by the sense amplifier circuit 134, data can be surely read even in the case where a potential read from the memory cell 130 is extremely low. Furthermore, since output of the amplified potentials to the wirings GBL is controlled, each of the wirings GBL can be shared.

The sense amplifier SA has a function of amplifying a difference between a reference potential and a reading potential that is supplied to the wiring BL and holding the amplified potential difference. Furthermore, the sense amplifier SA has a function of controlling the output of the amplified potential to the wiring GBL. Here, the sense amplifier SA is connected to two wirings BL and two wirings GBL.

In one embodiment of the present invention, the memory cells 130 and the sense amplifiers SA are formed in different layers. In particular, the memory cells 130 are preferably formed over the sense amplifiers SA. In addition, one or more memory cells 130 are preferably positioned so as to overlap with the sense amplifiers SA. Accordingly, the area of the memory device 131 can be smaller than that in the case where the memory cells 130 and the sense amplifiers SA are positioned in the same layer. Accordingly, the memory capacity per unit area of the memory device 131 can be increased. When all the memory cells 130 are positioned so as to overlap with the sense amplifier SA, the area of the memory device 131 can be further reduced. The memory cells 130 may be positioned so as to overlap with one sense amplifier SA; alternatively, the memory cells 130 may be positioned so as to overlap with the plurality of sense amplifiers SA.

In addition, because the memory cells 130 and the sense amplifiers SA are stacked, the length of the wirings BL electrically connecting the memory cells 130 to the sense amplifiers SA can be reduced. Consequently, the wiring resistance of the wirings BL can be low, and a reduction in the power consumption and an increase in the operation speed of the memory device 131 can be achieved. Furthermore, the areas of the capacitors provided in the memory cells 130 can be small; thus, the sizes of the memory cells 130 can be small.

The main amplifier 136 is connected to the sense amplifier circuit 134 and the input/output circuit 137. The main amplifier 136 has a function of amplifying a signal that is input. Specifically, the main amplifier 136 has a function of amplifying the potentials of the wirings GBL and outputting them to the input/output circuit 137. Note that the main amplifier 136 is not necessarily provided.

The input/output circuit 137 has a function of outputting the potentials of the wirings GBL or the potentials output from the main amplifier 136 as reading data to the outside.

The driver circuit 135 is connected to the memory cells 130 through the wirings WL. The driver circuit 135 has a function of supplying a signal for selecting the memory cells 130 in which data is written (hereinafter, the signal is also referred to as a write word signal) to the wiring WL. The driver circuit 135 can be formed using a decoder or the like.

The memory device 131 is capable of selecting a signal to be output to the outside with the use of the sense amplifiers SA and wirings CSEL. Therefore, the input/output circuit 137 does not need to select a signal with the use of a multiplexer or the like, and thus can have a simple circuit structure and a small occupied area.

Note that there is no particular limitation on the number of the wirings GBL, and the number of the wirings GBL may be a given number smaller than the number of the wirings BL (i.e., j) in the cell array 132. For example, in the case where the number of the wirings BL connected to one wiring GBL is k (k is an integer of 2 or more), the number of the wirings GBL is j/k.

The memory cells 130 are each connected to the wiring BG. The wiring BG is connected to the circuit 10 described in Embodiment 1. The circuit 10 has a function of controlling the potential of the second gate of the transistor M0 included in each memory cell connected to the wiring BG.

By the circuit 10, a negative potential can be applied to the second gates of the transistors M0 included in the memory cells 130 and can be continuously held. The memory device 131 can reduce the cutoff current of the transistors M0 by provision of the circuit 10; thus, data retention characteristics can be improved. As a result, the frequency of refresh operations in the memory cells 130 can be reduced, and power consumption of the memory device 131 can be reduced.

[Sense Amplifier SA]

Figure 23:
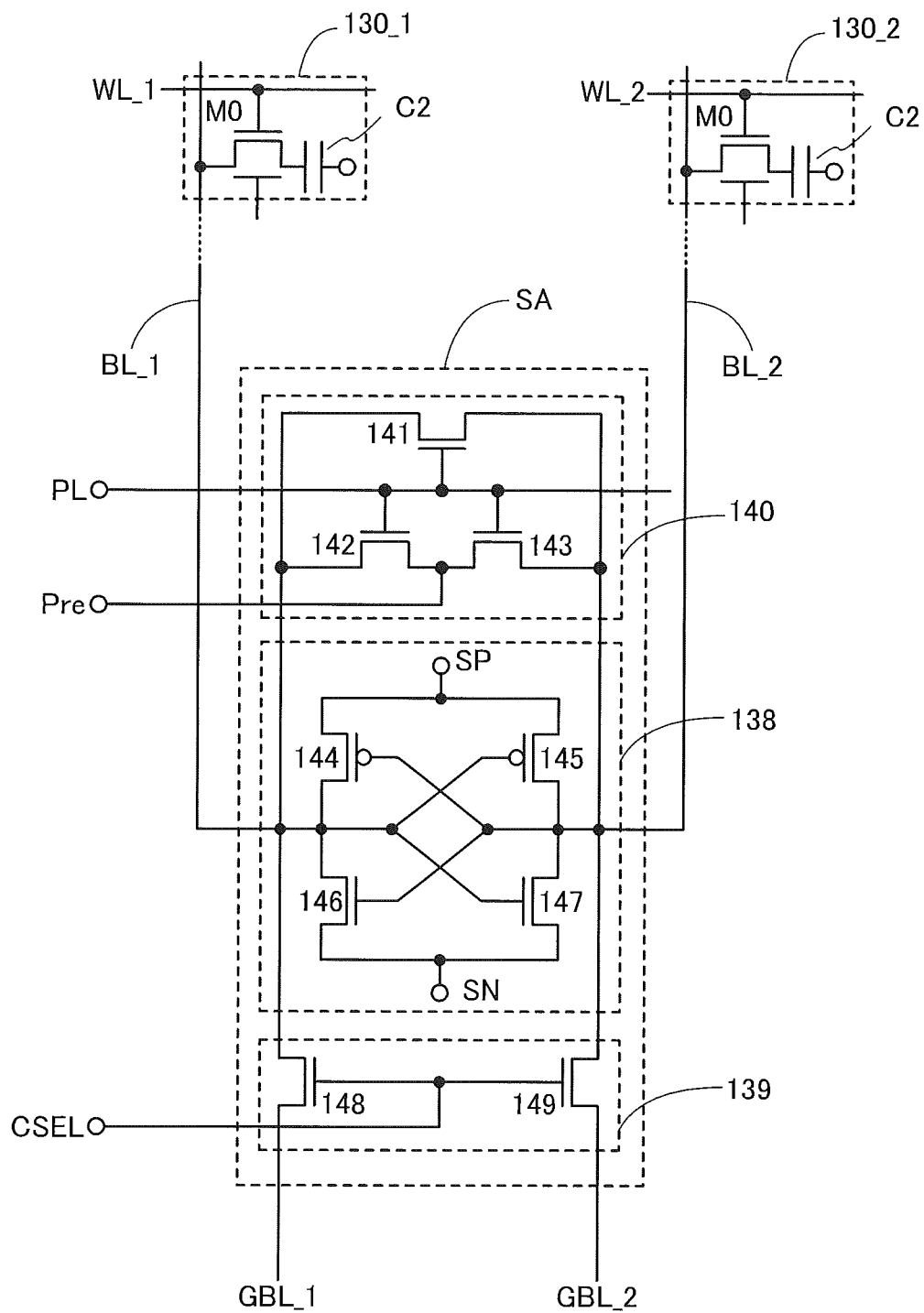
FIG. 23 is a circuit diagram illustrating a configuration example of a sense amplifier.

A specific structural example of the sense amplifier SA is described. FIG. 23 illustrates an example of a circuit structure of the memory cells 130 and the sense amplifier SA electrically connected to the memory cells 130. The memory cells 130 are connected to the sense amplifier SA through the wirings BL. In the example shown here, a memory cell 130_1 is connected to the sense amplifier SA through a wiring BL_1, and a memory cell 130_2 is connected to the sense amplifier SA through the wiring BL_2.

In the example of FIG. 23, one memory cell 130 is connected to one wiring BL; however, a plurality of memory cells 130 may be connected to one wiring BL.

The sense amplifier SA includes an amplifier circuit 138, a switch circuit 139, and a precharge circuit 140.

The amplifier circuit 138 includes p-channel transistors 144 and 145 and n-channel transistors 146 and 147. One of a source and a drain of the transistor 144 is connected to a wiring SP, and the other thereof is connected to a gate of the transistor 145, a gate of the transistor 147, and the wiring BL_1. One of a source and a drain of the transistor 146 is connected to the gate of the transistor 145, the gate of the transistor 147, and the wiring BL_1, and the other thereof is connected to a wiring SN. One of a source and a drain of the transistor 145 is connected to the wiring SP, and the other thereof is connected to a gate of the transistor 144, a gate of the transistor 146, and a wiring BL_2. One of a source and a drain of the transistor 147 is connected to the gate of the transistor 144, the gate of the transistor 146, and the wiring BL_2, and the other thereof is connected to the wiring SN. The amplifier circuit 138 has a function of amplifying the potential of the wiring BL_1 and the potential of the wiring BL_2. In FIG. 23, the sense amplifier SA including the amplifier circuit 138 functions as a latch sense amplifier.

The switch circuit 139 includes n-channel transistors 148 and 149. The transistors 148 and 149 may be p-channel transistors. One of a source and a drain of the transistor 148 is connected to the wiring BL_1, and the other thereof is connected to a wiring GBL_1. One of a source and a drain of the transistor 149 is connected to the wiring BL_2, and the other thereof is connected to a wiring GBL_2. Gates of the transistor 148 and the transistor 149 are connected to the wiring CSEL. The switch circuit 139 has a function of controlling electrical connection between the wiring BL_1 and the wiring GBL_1 and electrical connection between the wiring BL_2 and the wiring GBL_2 on the basis of a potential supplied to the wiring CSEL.

The precharge circuit 140 includes n-channel transistors 141, 142, and 143. The transistors 141 to 143 may be p-channel transistors. One of a source and a drain of the transistor 142 is connected to the wiring BL_1, and the other thereof is connected to a wiring Pre. One of a source and a drain of the transistor 143 is connected to the wiring BL_2, and the other thereof is connected to the wiring Pre. One of a source and a drain of the transistor 141 is connected to the wiring BL_1, and the other thereof is connected to the wiring BL_2. A gate of the transistor 142, a gate of the transistor 143, and a gate of the transistor 141 are connected to a wiring PL. The precharge circuit 140 has a function of initializing the potentials of the wiring BL_1 and the wiring BL_2.

Next, operation examples of the memory cells 130 and the sense amplifier SA illustrated in FIG. 23 in data reading will be described with reference to a timing chart of FIG. 24.

First, in the period T1, the transistors 141 to 143 included in the precharge circuit 140 are turned on, so that the potentials of the wirings BL_1 and BL_2 are initialized. Specifically, a high-level potential VH_PL is supplied to the wiring PL, whereby the transistors 141 to 143 in the precharge circuit 140 are turned on. Accordingly, a potential Vpre of the wiring Pre is supplied to the wirings BL_1 and BL_2. Note that the potential Vpre can be, for example, (VH_SP+VL_SN)/2.

Note that in the period T1, a low-level potential VL_CSEL is supplied to the wiring CSEL, and accordingly, the transistors 148 and 149 in the switch circuit 139 are off. A low-level potential VL_WL is supplied to the wiring WL_1, and accordingly, the transistor M0 in the memory cell 130_1 is off. The low-level potential VL_WL is also supplied to the wiring WL_2, and accordingly, the transistor M0 in the memory cell 130_2 is off (not shown in FIG. 24). The potential Vpre is supplied to the wirings SP and SN, and accordingly, the amplifier circuit 138 is off.

Then, a low-level potential VL_PL is supplied to the wiring PL to turn off the transistors 141 to 143 in the precharge circuit 140. In a period T2, the wiring WL_1 is selected. Specifically, in FIG. 24, a high-level potential VH_WL is supplied to the wiring WL_1 to select the wiring WL_1 and turn on the transistor M0 in the memory cell 130_1. With the above structure, the wiring BL_1 and the capacitor C2 are thus electrically connected to each other through the transistor M0. Since the wiring BL_1 and the capacitor C2 are electrically connected to each other, the potential of the wiring BL_1 changes according to the amount of charge held in the capacitor C2.

Figure 24:
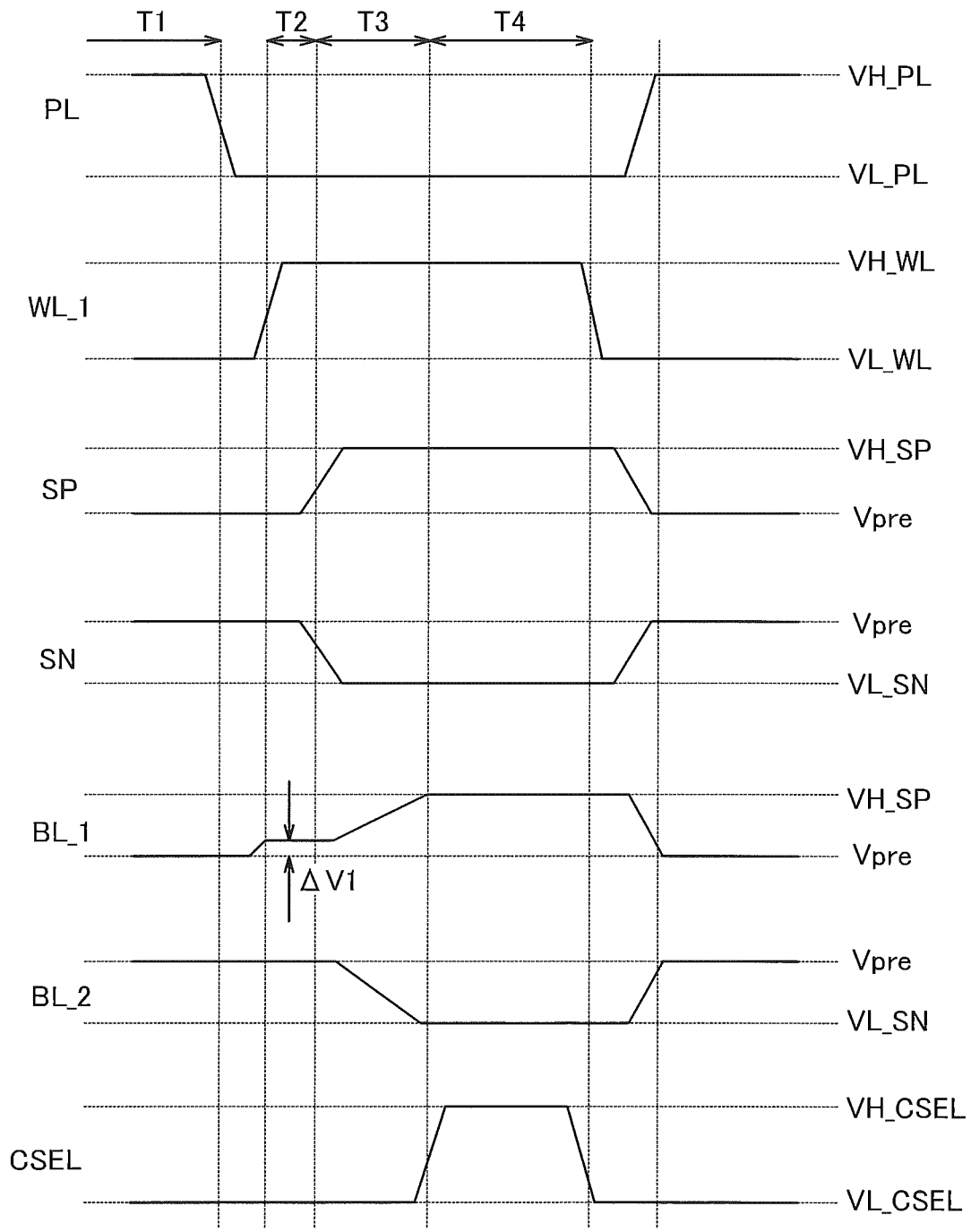
FIG. 24 is a timing chart showing an operation example of a sense amplifier.

The timing chart in FIG. 24 shows, as an example, the case where the amount of charge accumulated in the capacitor C2 is large. Specifically, in the case where the amount of charge accumulated in the capacitor C2 is large, charge is released from the capacitor C2 to the wiring BL_1, so that the potential of the wiring BL_1 rises from the potential Vpre by $\Delta V1$. In the case where the amount of charge accumulated in the capacitor C2 is small, charge flows from the wiring BL_1 into the capacitor C2, so that the potential of the wiring BL_1 falls by $\Delta V2$.

Note that in the period T2, the low-level potential VL_CSEL is kept applied to the wiring CSEL, and thus the transistors 148 and 149 in the switch circuit 139 remain off. The potential Vpre is kept applied to the wirings SP and SN, and thus the sense amplifier SA remains off.

In a period T3, the high-level potential VH_SP is applied to the wiring SP and the low-level potential VL_SN is applied to the wiring SN, whereby the amplifier circuit 138 is turned on. The amplifier circuit 138 has a function of amplifying the potential difference between the wirings BL_1 and BL_2 ($\Delta V1$ in FIG. 24). Accordingly, in the timing chart in FIG. 24, the amplifier circuit 138 is turned on, whereby the potential of the wiring BL_1 rises from the potential Vpre+$\Delta V1$ to approach the potential VH_SP of the wiring SP. The potential of the wiring BL_2 falls from the potential Vpre to approach the potential VL_SN of the wiring SN.

Note that in the case where the potential of the wiring BL_1 is Vpre-ΔV2 at the beginning of the period T3, the amplifier circuit 138 is turned on, whereby the potential of the wiring BL_1 falls from the potential Vpre-ΔV2 to approach the potential VL_SN of the wiring SN. The potential of the wiring BL_2 rises from the potential Vpre to approach the potential VH_SP of the wiring SP.

In the period T3, the low-level potential VL_PL is kept applied to the wiring PL to keep the transistors 141 to 143 in the precharge circuit 140 off. The low-level potential VL_CSEL is kept applied to the wiring CSEL, thereby keeping the transistors 148 and 149 in the switch circuit 139 off. The high-level potential VH_WL is kept applied to the wiring WL_1; thus, the transistor M0 in the memory cell 130_1 remains on. Consequently, charge corresponding to the potential VH_SP of the wiring BL_1 is accumulated in the capacitor C2 in the memory cell 130_1.

Next, in a period T4, the potential supplied to the wiring CSEL is changed to turn on the switch circuit 139. Specifically, in FIG. 24, a high-level potential VH_CSEL is applied to the wiring CSEL, so that the transistors 148 and 149 in the switch circuit 139 are turned on. Accordingly, the potential of the wiring BL_1 is supplied to the wiring GBL_1, and the potential of the wiring BL_2 is supplied to the wiring GBL_2.

In the period T4, the low-level potential VL_PL is still supplied to the wiring PL, so that the transistors 141 to 143 in the precharge circuit 140 remain off. The high-level potential VH_WL is kept supplied to the wiring WL_1; thus, the transistor M0 in the memory cell 130_1 remains on. The high-level potential VH_SP is kept supplied to the wiring SP and the low-level potential VL_SP is kept supplied to the wiring SN; thus, the amplifier circuit 138 remains on. As a result, charge corresponding to the potential VH_SP of the wiring BL_1 is accumulated in the capacitor C2 in the memory cell 130_1.

When the period T4 is over, the potential supplied to the wiring CSEL is changed to turn off the switch circuit 139. Specifically, in FIG. 24, the low-level potential VL_CSEL is supplied to the wiring CSEL, so that the transistors 148 and 149 in the switch circuit 139 are turned off.

Furthermore, when the period T4 is over, the wiring WL_1 is deselected. Specifically, in FIG. 24, the low-level potential VL_WL is supplied to the wiring WL_1, whereby the wiring WL_1 is deselected to turn off the transistor M0 in the memory cell 130_1. Through the operation, charge corresponding to the potential VH_SP of the wiring BL_1 is held in the capacitor C2; thus, data is retained in the memory cell 130_1 even after the data is read out.

Through the operation in the periods T1 to T4, data is read from the memory cell 130_1. Data in the memory cell 130_2 can be read similarly.

Note that data can be written to the memory cell 130 on the basis of the above principle. Specifically, as in the case where data is read, first, the transistors 141 to 143 in the precharge circuit 140 are temporarily turned on to initialize the potentials of the wirings BL_1 and BL_2. Then, the wiring WL_1 connected to the memory cell 130_1 to which data is to be written or the wiring WL_2 connected to the memory cell 130_2 to which data is to be written is selected to turn on the transistor M0 in the memory cell 130_1 or 130_2. The wiring BL_1 or BL_2 and the capacitor C2 are thus electrically connected to each other through the transistor M0. Then, the high-level potential VH_SP is supplied to the wiring SP and the low-level potential VL_SN is supplied to the wiring SN to turn on the amplifier circuit 138. The potential supplied to the wiring CSEL is then changed to turn on the switch circuit 139. Specifically, the high-level potential VH_CSEL is supplied to the wiring CSEL, so that the transistors 148 and 149 in the switch circuit 139 are turned on. Consequently, the wirings BL_1 and GBL_1 are electrically connected to each other and the wirings BL_2 and GBL_2 are electrically connected to each other. Writing potentials are supplied to the wirings GBL_1 and GBL_2, whereby the writing potentials are supplied to the wirings BL_1 and BL_2 through the switch circuit 139. Consequently, charge is accumulated in the capacitor C2 according to the potential of the wiring BL_1 or BL_2 and thus data is written to the memory cell 130_1 or 130_2.

Note that after the potential of the wiring GBL_1 is supplied to the wiring BL_1 and the potential of the wiring GBL_2 is supplied to the wiring BL_2, the relation in level between the potential of the wiring BL_1 and the potential of the wiring BL_2 is maintained by the amplifier circuit 138 as long as the sense amplifier SA is on even after the transistors 148 and 149 in the switch circuit 139 are turned off. Therefore, the timing of turning off the transistors 148 and 149 in the switch circuit 139 may be either before or after the wiring WL_1 is selected.

<<SRAM>>

Next, an example in which the circuit 10 is used for a static random access memory (SRAM) will be described.

[Memory Cell 150]

Figure 25:
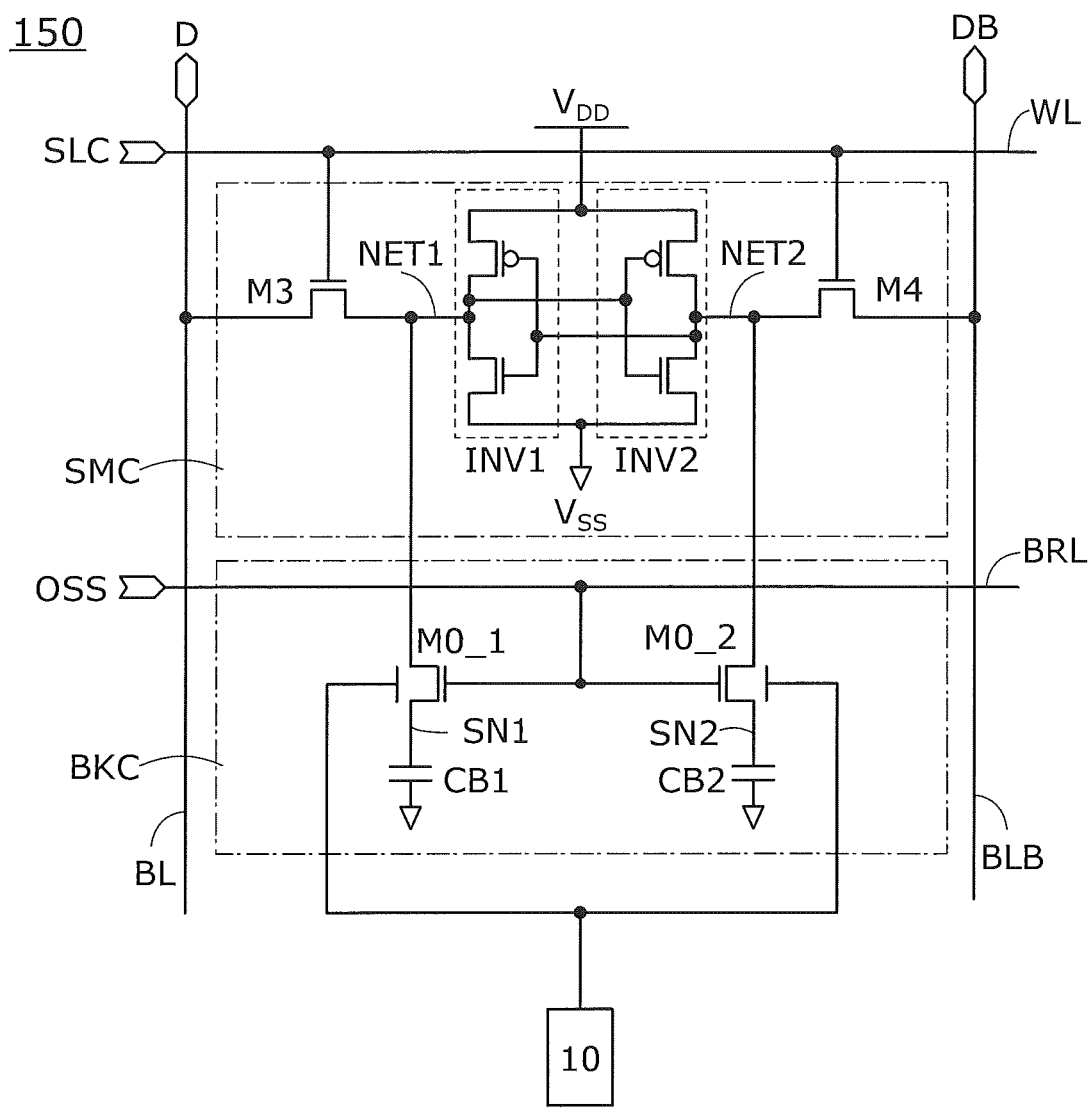
FIG. 25 is a circuit diagram illustrating a configuration example of an SRAM.

A memory cell 150 in FIG. 25 includes a circuit SMC and a circuit BKC. The circuit SMC may have a circuit structure similar to that of a standard SRAM memory cell. The circuit SMC in FIG. 25 includes an inverter INV1, an inverter INV2, a transistor M3, and a transistor M4.

The circuit BKC functions as a backup circuit of the circuit SMC. The circuit BKC includes a transistor M0_1, a transistor M0_2, a capacitor CB1, and a capacitor CB2.

Note that a transistor with low cutoff current is suitable for each of the transistors M0_1 and M0_2. An OS transistor or a transistor including a wide-bandgap semiconductor in a channel formation region is suitable for each of the transistors M0_1 and M02.

The circuit BKC includes a holding circuit including the transistor M0_1 and the capacitor CB1 and a holding circuit including the transistor M0_2 and the capacitor CB2. Data is retained in a node SN1 and a node SN2 in the holding circuits. The holding circuit including the transistor M0_1 and the capacitor CB1 is capable of backing up data of a node NET1. The holding circuit including the transistor M0_2 and the capacitor CB2 is capable of backing up data of a node NET2.

Power supply potentials $V_{DD}$ and $V_{SS}$ are supplied to the memory cell 150. The memory cell 150 is electrically connected to wirings WL, BL, BLB, and BRL. A signal SLC is input to the wiring WL. A data signal D and a data signal DB are input to the wiring BL and the wiring BLB at the time of data writing. Data is read by detecting the potentials of the wiring BL and the wiring BLB. A signal OSS is input to the wiring BRL.

Operation of the memory cell 150 will be described.

[Data Backup]

First, when the signal OSS is set to an H level, the transistors M0_1 and M0_2 are turned on and the nodes SN1 and SN2 have the same potential levels as the nodes NET1 and NET2. That is, data in the nodes NET1 and NET2 are written to the nodes SN1 and SN2, respectively.

Then, the signal OSS is set to an L level, so that the transistors M0_1 and M0_2 are turned off and data storage operation is terminated. Since the cutoff current of the transistors M0_1 and M0_2 is low, electric charge written to the nodes SN1 and SN2 are held for a long time.

[Power Off]

Then, power of the memory cell 150 is turned off. The circuit BKC keeps data even after the power is turned off.

[Data Restoring]

Power of the memory cell 150 is turned on again to set the signal OSS to an H level, whereby the data stored in the circuit BKC can be written back to the circuit SMC. That is, the memory cell 150 can be restored to the state immediately before the power is stopped.

As described above, the memory cell 150 can retain the data for a long time even when power is turned off. Thus, in the semiconductor device including the memory cell 150, power is positively turned off, so that power consumption can be reduced. For example, the memory cell 150 is used as a cache memory of a central processing unit (CPU), so that power consumption of the CPU can be reduced.

By the circuit 10, a negative potential can be applied to the second gates of the transistors M0_1 and M0_2 and can be continuously held. By the circuit 10 in the memory cell 150, the cutoff current of each of the transistors M0_1 and M0_2 can be reduced, thus, data retention characteristics can be improved. As a result, power can be turned off for a longer time in the memory cell 150, and more power can be saved.

<<Power Supply Circuit>>

A power supply circuit used for a circuit including the above nonvolatile memory, DRAM, or SRAM, will be described.

Figure 26:
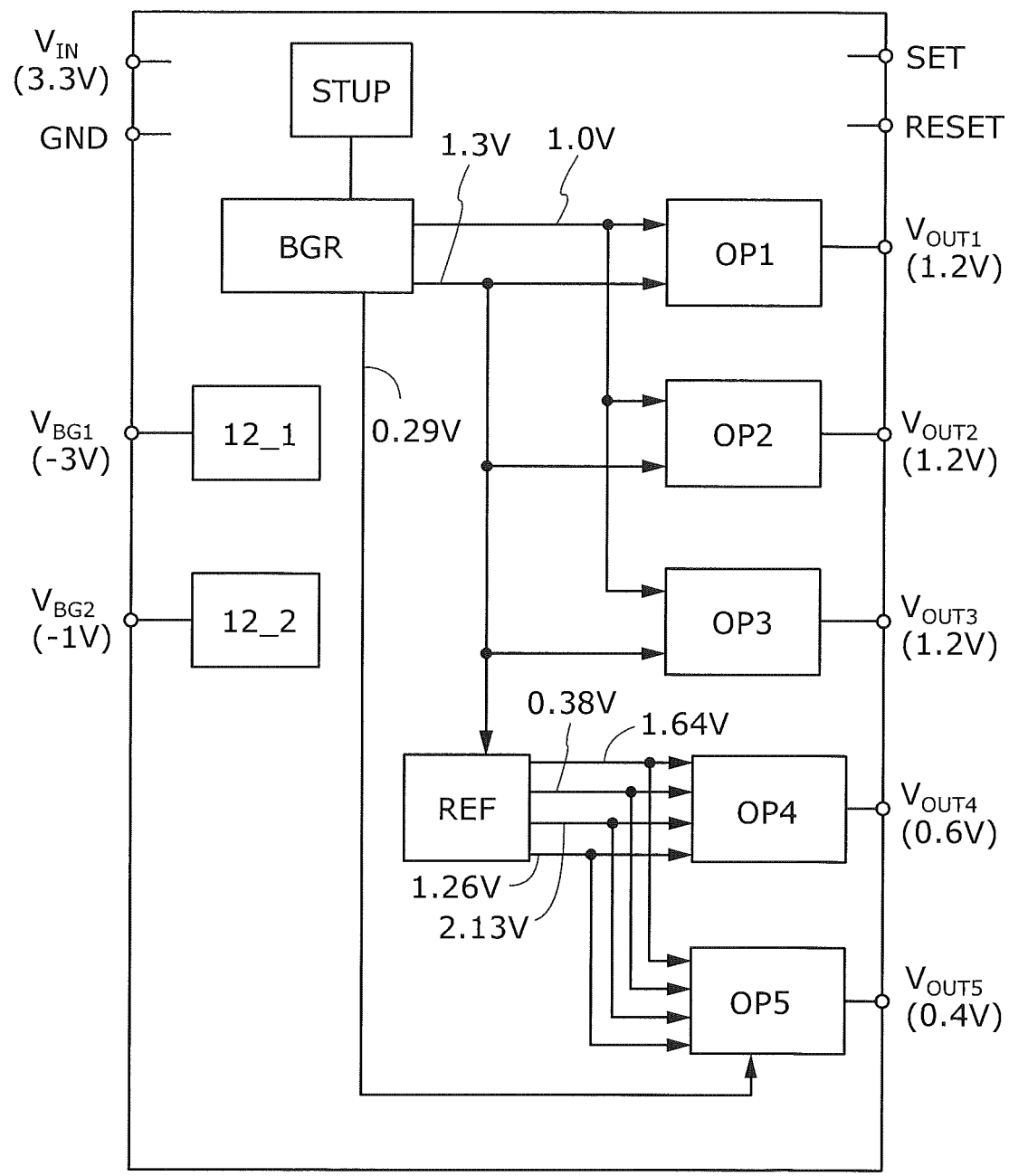
FIG. 26 is a circuit block diagram illustrating a configuration example of a power supply circuit.

FIG. 26 is a block diagram of a power supply circuit 160. The power supply circuit 160 includes a circuit STUP, a circuit BGR, a circuit REF, a circuit OP1, a circuit OP2, a circuit OP3, a circuit OP4, a circuit OP5, a circuit 12_1, and a circuit 12_2.

In the power supply circuit 160, a voltage needed for each circuit is generated from a voltage $V_{IN}$ (e.g., 3.3 V) and is supplied to each circuit.

The voltage $V_{IN}$ and GND are supplied to all the circuits in FIG. 26.

Furthermore, a signal SET and a signal RESET are input to each circuit in the power supply circuit 160. The signal SET is a signal for starting up each circuit, and the signal RESET is a signal for initializing each signal.

The circuit STUP is a startup circuit and has a function of generating a voltage to be supplied to the circuit BGR from the voltage $V_{IN}$.

The circuit BGR is a band gap reference circuit, and has a function of generating a plurality of voltages from the voltage $V_{IN}$ and supplying the voltages to the circuits OP1 to OP3, the circuit OP5, and the circuit REF. For example, the circuit BGR has a function of supplying a voltage of 1.0 V to the circuits OP1 to OP3. Alternatively, for example, the circuit BGR has a function of supplying a voltage of 1.3 V to the circuits OP1 to OP3 and the circuit REF. Alternatively, for example, the circuit BGR has a function of supplying a voltage of 0.29 V to the circuit OP5.

The circuit REF is a reference voltage generation circuit, which has a function of supplying a voltage to the circuits OP4 and OP5. For example, the circuit REF has a function of supplying a voltage of 1.64 V, 0.38 V, 2.13 V, or 1.26 V to the circuits OP4 and OP5.

The circuit OP1 is an operational amplifier, which has a function of supplying a voltage $V_{out1}$ (e.g., 1.2 V). The voltage $V_{out1}$ functions as a power supply voltage that operates a logic circuit such as a central processing unit (CPU).

The circuit OP2 is an operational amplifier, which has a function of supplying a voltage $V_{out2}$ (e.g., 1.2 V). The voltage $V_{out2}$ functions as a power supply voltage that operates a decoder of the above memory device 110 or a peripheral circuit of the above memory device 131.

The circuit OP3 is an operational amplifier, which has a function of supplying a voltage $V_{out3}$ (e.g., 1.2 V). The voltage $V_{out3}$ functions as a voltage to be supplied to the wiring SL of the above memory device 110.

The circuit OP4 is an operational amplifier, which has a function of supplying a voltage $V_{out4}$ (e.g., 0.6 V). The voltage $V_{out4}$ functions as a precharge voltage (Vpre) of the wiring BL in the memory device 131.

The circuit OP5 is an operational amplifier, which has a function of supplying a voltage $V_{out5}$ (e.g., 0.4 V). The voltage $V_{out5}$ functions as a reference voltage (Vref) in the above reading circuit 121.

The structure of the power supply circuit 160 is not limited to that illustrated in FIG. 26. A larger or smaller number of operational amplifiers may be provided as necessary.

The circuit 12_1 is a charge pump circuit, which corresponds to the voltage generation circuit 12 in Embodiment 1. The circuit 12_1 has a function of supplying a voltage $V_{BG1}$ (e.g., −3 V). The voltage $V_{BG1}$ is applied to the second gates of the transistors M0, M0_1, and M0_2.

The circuit 12_2 is a charge pump circuit, which corresponds to the voltage generation circuit 12 described in Embodiment 1. The circuit 12_2 has a function of supplying a voltage $V_{BG2}$ (e.g., −1 V). The voltage $V_{BG2}$ is applied to a second gate of a transistor used in a logic circuit, or a second gate of a transistor used in a peripheral circuit or the like of the memory device.

The power supply circuit 160 has a function of generating a negative voltage that is different from the voltage $V_{BG1}$ and the voltage $V_{BG2}$. In the case of $V_{BG1} < V_{BG2}$, the voltage $V_{BG1}$ is preferably applied to a second gate of a transistor that needs low cutoff current, such as a transistor in the memory cell. Meanwhile, the voltage $V_{BG2}$ is preferably applied to a second gate of a transistor that needs high on-state current, such as a transistor in a logic circuit or a peripheral circuit of the memory device. In such a manner, a voltage to be applied to the second gate is changed depending on the characteristics needed for the transistor, so that the semiconductor device including the power supply circuit 160 can operate at high speed with low power consumption.

The nonvolatile memory, the DRAM, the SRAM, the CPU, the power supply circuit, and the like which are described above are preferably provided in one IC chip. By provision of these circuits in one IC chip, access speed of the circuits can be improved.

<Display Device>

FIGS. 27A and 27B and FIGS. 28A and 28B illustrate examples in which the circuit 10 described in Embodiment 1 is used in a display device.

[Configuration Example 1 of Pixel]

Figure 27A:
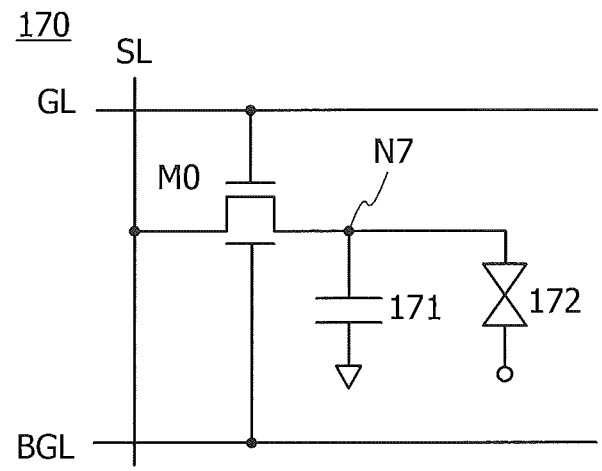
FIGS. 27A and 27B are circuit diagrams illustrating a configuration example of a display device.

FIG. 27A illustrates a structure example of a pixel 170 that can be used in the display device. The pixel 170 includes the transistor M0 including the first and second gates, a capacitor 171, a display element 172, a node N7, a wiring GL, the wiring SL, and a wiring BGL.

The first gate of the transistor M0 is electrically connected to the wiring GL; the second gate of the transistor M0 is electrically connected to the wiring BGL; one of the source and the drain of the transistor M0 is electrically connected to the wiring SL; and the other of the source and the drain of the transistor M0 is electrically connected to the node N7.

A first terminal of the capacitor 171 is electrically connected to the node N7, and a constant low potential is applied to a second terminal of the capacitor 171.

The capacitor 171 may be provided as needed. In the case where parasitic capacitance of an electrode, a wiring, or the like can be used as capacitance needed to drive the pixel 170, the capacitor 171 may be omitted.

A transistor having low off-state current is suitable for the transistor M0. An OS transistor can be used as a transistor having low off-state current.

A first terminal of the display element 172 is electrically connected to the node N7, and a constant low potential is applied to a second terminal of the display element 172. The ground potential may be applied as the low potential. A dielectric element whose optical characteristics are changed when a voltage is applied to its electrodes at opposite ends can be used as the display element 172. For example, a liquid crystal element or an element used for electronic paper or the like, such as an electrophoretic element or a twisting ball element, can be used.

The wiring GL has a function of supplying signals for controlling the on/off state of the transistor M0, and the wiring SL has a function of supplying a voltage applied to the display element 172 through the transistor M0.

Since the off-state current of the transistor M0 is extremely low, when the transistor M0 is turned off, the node N7 can hold a voltage applied immediately before turning off the transistor M0. While the voltage of the node N7 is held, the display element 172 can maintain its display state.

The pixel 170 can hold the voltage of the node N7 for a long time. Thus, the optical characteristics of the display element 172 can be unchanged even when supply of a power supply voltage is stopped. For example, even in the case where a liquid crystal element that cannot store data, such as a twisted nematic (TN) liquid crystal, is used, the element can be always maintained in a state in which a voltage is applied. Consequently, it is possible to exclude rewrite operation or reduce the frequency of rewrite operation markedly, which can result in a reduction in power consumption of the display device.

Figure 27B:
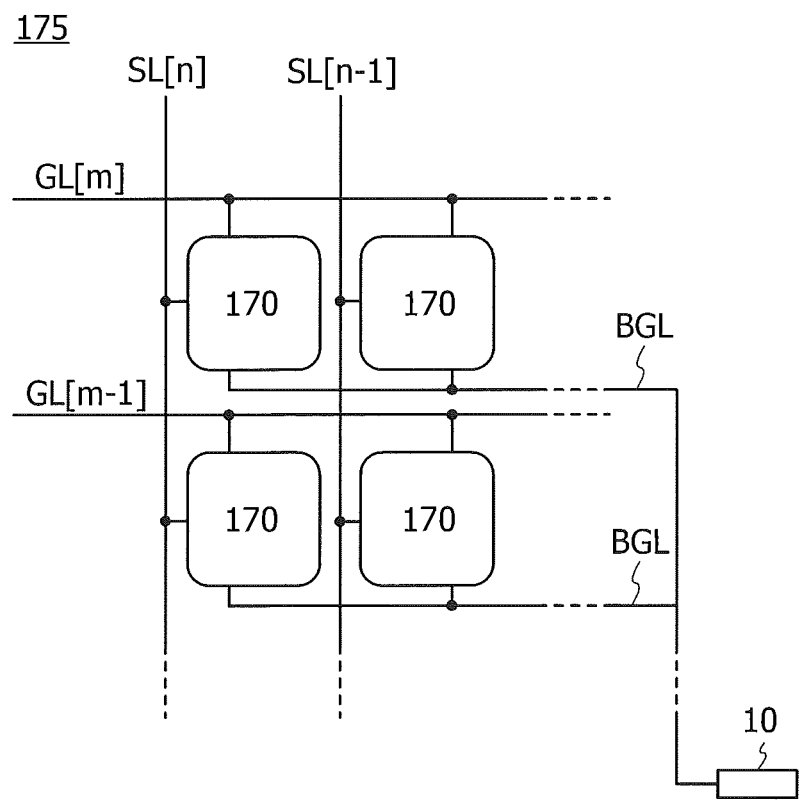

FIG. 27B illustrates the circuit structure of a display device 175 including the pixels 170 arranged in a matrix and the circuit 10 described in Embodiment 1.

The display device 175 includes the pixels 170 arranged in a matrix of m rows and n columns. The pixels 170 provided in the m-th row are electrically connected to a wiring GL[m], and the pixels 170 provided in the n-th column are electrically connected to a wiring SL[n].

The second gates of the transistors M0 included in the pixels 170 are electrically connected to the circuit 10 through the wirings BGL. In other words, the circuit 10 has a function of controlling the second gates of the transistors M0 included in all the pixels.

When the circuit 10 controls the second gate of the transistor M0, the transistor M0 can have appropriate $V_{th}$ and can be prevented from being normally on. Consequently, the off-state current of the transistor M0 can be reduced, and charge given to the node N7 can be held.

The circuit 10 can control and hold $V_{th}$ of the transistors M0 in the pixels 170 connected to the circuit 10 at optimal levels and can temporarily change the $V_{th}$ so that the transistors M0 are set as normally-on transistors. When m×n transistors connected to the circuit 10 are temporarily changed into normally-on transistors, a voltage (i.e., display images) stored in the pixels can be refreshed at the same time by one signal.

When the display device 175 has such a structure, it is possible to provide a display device capable of operating with low power consumption and low rewrite frequency. In addition, it is possible to obtain a display device including a plurality of pixels that can easily perform refresh operation. Furthermore, it is possible to obtain a display device capable of displaying an image even when supply of power is stopped.

[Configuration Example 2 of Pixel]

Figure 28A:
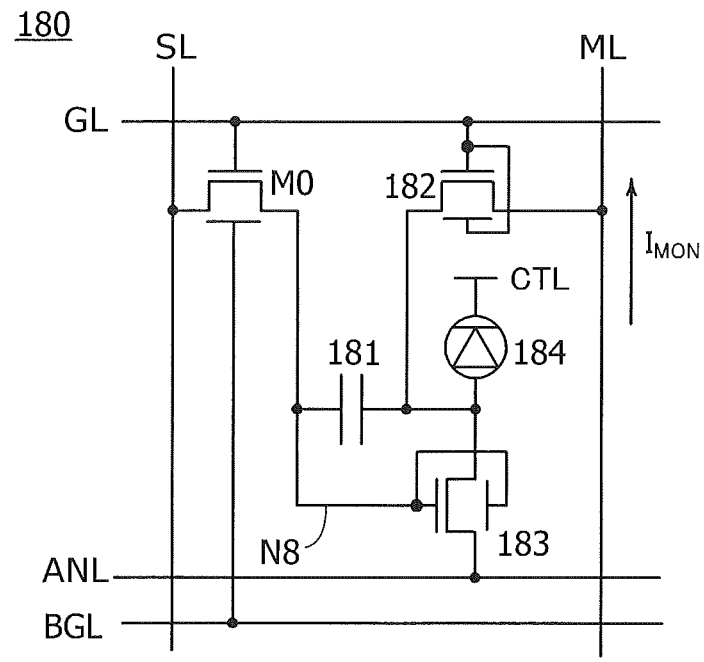
FIGS. 28A and 28B are circuit diagrams illustrating a configuration example of a display device.

FIG. 28A illustrates a structure example of a pixel 180 that can be used in the display device.

The pixel 180 is electrically connected to the wiring GL, the wiring BGL, the wiring SL, a wiring ML, a wiring CTL, and a wiring ANL. The pixel 180 includes a capacitor 181, the transistor M0, a transistor 182, a transistor 183, and a light-emitting element 184.

The light-emitting element 184 includes a pair of terminals (an anode and a cathode). As the light-emitting element 184, an element which can control the luminance with current or voltage can be used. As the light-emitting element 184, a light-emitting element utilizing electroluminescence (also referred to as an EL element) can be used. The EL element includes a layer containing a light-emitting compound (also referred to as an EL layer) between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, so that the light-emitting substance contained in the EL layer emits light. EL elements are classified depending on whether a light-emitting material is an organic compound or an inorganic compound. In general, the former is referred to as an organic EL element (or an organic light-emitting diode, OLED), and the latter is referred to as an inorganic EL element.

Although the transistor M0, the transistor 182, and the transistor 183 are n-channel transistors in FIG. 28A, one or some of the transistors may be p-channel transistors.

The transistor M0, the transistor 182, and the transistor 183 each include a first gate and a second gate. The second gate of the transistor M0 is electrically connected to the wiring BGL. The second gate of the transistor 182 is electrically connected to the first gate of the transistor 182. The second gate of the transistor 183 is electrically connected to the first gate of the transistor 183. The transistor 182 and the transistor 183 with such structures can have improved current drive capacity.

The transistor M0 is a pass transistor which connects the first gate of the transistor 183 (a node N8) and the wiring SL. The transistor 182 is a pass transistor which connects the wiring ML and the anode of the light-emitting element 184. The transistor 183 is a driving transistor which functions as a source of current supplied to the light-emitting element 184. In accordance with the amount of drain current of the transistor 183, the luminance of the light emitted from the light-emitting element 184 is adjusted. The capacitor 181 is a storage capacitor which holds voltage between the anode of the light-emitting element 184 and the node N8.

The wiring GL is a scan line, and has a function of selecting the transistor M0 and the transistor 182.

The wiring SL is a signal line, and has a function of supplying an image signal to the pixel 180.

The wiring ANL has a function of supplying a potential $V_{ano}$, and the wiring CTL has a function of supplying a potential $V_{cat}$. The light-emitting element 184 emits light when the potential $V_{ano}$ is higher than the sum of the potential $V_{cat}$, $V_{th}$ of the transistor 183, and the threshold voltage of the light-emitting element 184.

The pixel 180 has a function of supplying drain current ($I_{MON}$) of the transistor 183 to a monitor circuit through the wiring ML when the transistor 182 is turned on. The monitor circuit analyzes the current $I_{MON}$ and generates a correction signal on the basis of the analysis result. Variation in the drive capacity among the transistors 183 in the pixels 180 causes variation in the luminance of the light emitted from the light-emitting elements 184, which results in a decrease in display quality. The pixels 180 in FIG. 28A have a function of correcting variation in the luminance of the light emitted from the light-emitting elements 184 by monitoring drain current of the transistor 183.

A transistor having low off-state current is suitable for the transistor M0. An OS transistor can be used as a transistor having low off-state current.

Since the off-state current of the transistor M0 is extremely low, when the transistor M0 is turned off, the node N8 can hold a voltage applied immediately before turning off the transistor M0. While the voltage of the node N8 is held, the light-emitting element 184 can maintain its display state.

The pixel 180 can hold the voltage of the node N8 for a long time. Thus, the light-emitting element 184 can maintain its emission state even when supply of a power supply voltage is stopped. Consequently, it is possible to exclude rewrite operation or reduce the frequency of rewrite operation of the pixel 180 markedly, which can result in a reduction in power consumption of the display device.

Figure 28B:
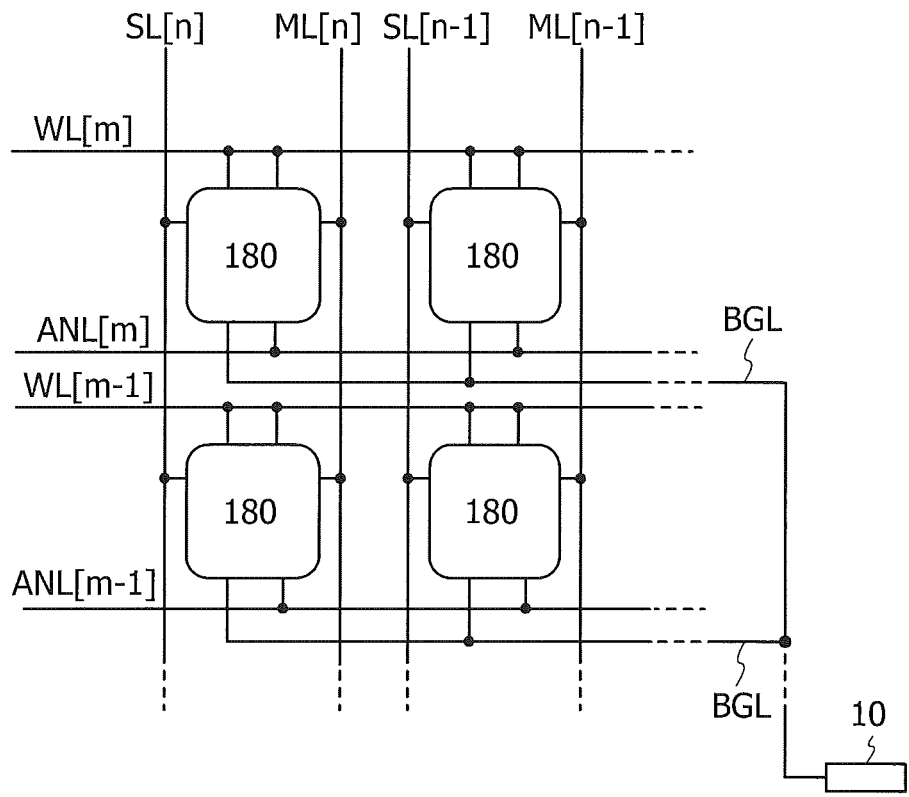

FIG. 28B illustrates the circuit structure of a display device 185 including the pixels 180 arranged in a matrix and the circuit 10 described in Embodiment 1.

The display device 185 includes the pixels 180 arranged in a matrix of m rows and n columns. The pixels 180 provided in the m-th row are electrically connected to the wiring GL[m] and a wiring ANL[m], and the pixels 180 provided in the n-th column are electrically connected to the wiring SL[n] and a wiring ML[n].

The second gates of the transistors M0 included in the pixels 180 are electrically connected to the circuit 10 through the wirings BGL. In other words, the circuit 10 has a function of controlling the second gates of the transistors M0 included in all the pixels.

When the circuit 10 controls the second gate of the transistor M0, the transistor M0 can have appropriate $V_{th}$ and can be prevented from being normally on. Consequently, the off-state current of the transistor M0 can be reduced, and charge given to the node N8 can be held.
(Embodiment 4)

In this embodiment, an embodiment of a semiconductor device that is one embodiment of the present invention will be described with reference to FIG. 29.
<Structure of Semiconductor Device>

Figure 29:
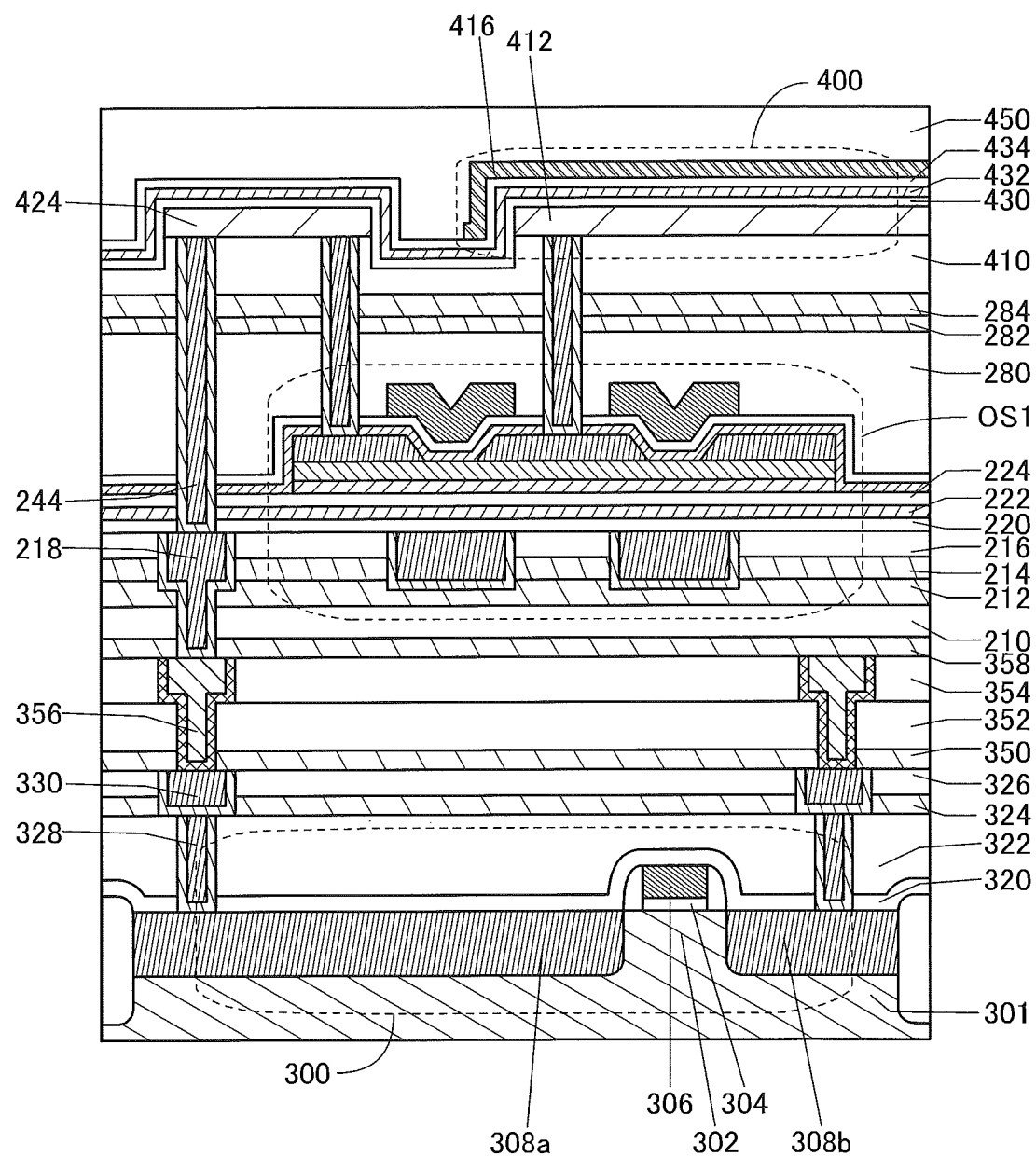
FIG. 29 is a cross-sectional view illustrating a structure example of a semiconductor device.

The semiconductor device of one embodiment of the present invention includes a transistor 300, the transistor OS1, and a capacitor 400 as illustrated in FIG. 29. The transistor OS1 is provided over the transistor 300, and the capacitor 400 is provided over the transistor 300 and the transistor OS1.

The transistor 300 is provided on a substrate 301 and includes a conductor 306, an insulator 304, a semiconductor region 302 that is a part of the substrate 301, and low-resistance regions 308*a* and 308*b* functioning as a source region and a drain region.

The transistor 300 may be a p-channel transistor or an n-channel transistor.

It is preferable that a region of the semiconductor region 302 where a channel is formed, a region in the vicinity thereof, the low-resistance regions 308*a* and 308*b* functioning as a source region and a drain region, and the like contain silicon, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs, GaAlAs, or the like.

The low-resistance regions 308*a* and 308*b* contain an element which imparts n-type conductivity, such as arsenic or phosphorus, or an element which imparts p-type conductivity, such as boron, in addition to a semiconductor material used for the semiconductor region 302.

The conductor 306 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistor 300 illustrated in FIG. 29 is only an example and is not limited to the structure illustrated therein; an appropriate transistor may be used in accordance with a circuit structure or a driving method.

An insulator 320, an insulator 322, an insulator 324, and an insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 functions as a planarization film for eliminating a level difference caused by the transistor 300 or the like underlying the insulator 322. A top surface of the insulator 322 may be planarized by planarization treatment using a chemical mechanical polishing (CMP) method or the like to increase the level of planarity.

The insulator 324 is preferably formed using, for example, a film having a barrier property that prevents hydrogen or impurities from diffusing from the substrate 301, the transistor 300, or the like into a region where the transistor OS1 is formed.

As an example of the film having a barrier property against hydrogen, silicon nitride formed by a CVD method can be given. Diffusion of hydrogen into a semiconductor element including an oxide semiconductor, such as the transistor OS1, degrades the characteristics of the semiconductor element in some cases. Therefore, a film that prevents hydrogen diffusion is preferably provided between the transistor OS1 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$ in IDS analysis in the range of 50° C. to 500° C., for example.

Note that the dielectric constant of the insulator 326 is preferably lower than that of the insulator 324. For example, the relative dielectric constant of the insulator 326 is preferably lower than 4, more preferably lower than 3. For example, the relative dielectric constant of the insulator 324 is preferably 0.7 times or less that of the insulator 326, more preferably 0.6 times or less that of the insulator 326. In the case where a material with a low dielectric constant is used as an interlayer film, the parasitic capacitance between wirings can be reduced.

A conductor 328, a conductor 330, and the like that are electrically connected to the capacitor 400 or the transistor OS1 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

Furthermore, the conductor 328 and the conductor 330 preferably include a conductor having a barrier property against hydrogen. The conductor having a barrier property against hydrogen is formed particularly in an opening of the insulator 324 having a barrier property against hydrogen. In such a structure, the transistor 300 and the transistor OS1 can be separated by a layer having a barrier property, so that diffusion of hydrogen from the transistor 300 to the transistor OS1 can be prevented.

Note that as the conductor having a barrier property against hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property against hydrogen is preferably in contact with the insulator 324 having a barrier property against hydrogen.

A wiring layer may be provided over the insulator 326 and the conductor 330. For example, in FIG. 29, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to that used for forming the conductor 328 and the conductor 330.

In addition, the conductor 356 is preferably formed using a low-resistance conductive material such as aluminum or copper. The use of a low-resistance conductive material can reduce wiring resistance. Note that in the case where copper is used for the conductor 356, a conductor which inhibits diffusion of copper and the conductor 356 are preferably stacked. Examples of the conductor which inhibits diffusion of copper include tantalum, an alloy containing tantalum such as tantalum nitride, ruthenium, and alloy containing ruthenium.

Furthermore, the insulator 350 is preferably formed using an insulator that inhibits diffusion of copper or an insulator barrier property against oxygen and hydrogen. As an example of a film which inhibits diffusion of copper, silicon nitride can be used. Thus, the material similar to that used for the insulator 324 can be used.

In particular, it is preferable that the conductor which inhibits diffusion of copper be provided in an opening of the insulator 350 which inhibits diffusion of copper, and copper be stacked over the conductor which inhibits diffusion of copper. With such a structure, diffusion of copper in the vicinity of the wiring can be inhibited.

An insulator 358, an insulator 210, an insulator 212, and an insulator 214 are stacked sequentially over the insulator 354. A material which inhibits diffusion of copper or which has a barrier property against oxygen or hydrogen is preferably used for one or all of the insulator 358, insulator 210, the insulator 212, and the insulator 214.

The insulator 358 and the insulator 212 are preferably formed using, for example, a film having a barrier property that inhibits copper or prevents hydrogen or impurities from diffusing from a region where the substrate 301 or the transistor 300 is formed or the like into a region where the transistor OS1 is formed. Therefore, the insulator 358 and the insulator 212 can be formed using a material similar to that used for forming the insulator 324.

The insulator 210 can be formed using a material similar to that used for the insulator 320. For example, a silicon oxide film, a silicon oxynitride film, or the like can be used as the insulator 210.

As the insulator 214, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor OS1 in and after a manufacturing process of the transistor. In addition, release of oxygen from oxide in the transistor OS1 can be prevented. Therefore, aluminum oxide is suitably used for a protective film for the transistor OS1.

An insulator 216 is provided over the insulator 214. The insulator 216 can be formed using a material similar to that used for forming the insulator 320. For example, a silicon oxide film, a silicon oxynitride film, or the like can be used for the insulator 216.

A conductor 218 and the like are embedded in the insulator 358, the insulator 210, the insulator 212, the insulator 214, and the insulator 216. Note that the conductor 218 functions as a plug or a wiring that is electrically connected to the capacitor 400 or the transistor 300. The conductor 218 can be formed using a material similar to that used for forming the conductor 328 and the conductor 330.

In particular, the conductor 218 in a region in contact with the insulator 358, the insulator 212, and the insulator 214 is preferably a conductor that inhibits diffusion of copper or that has a barrier property against oxygen, hydrogen, and water. In such a structure, the transistor 300 and the transistor OS1 can be completely separated by a layer that inhibits diffusion of copper or that has a barrier property against oxygen, hydrogen, and water. That is, diffusion of copper from the conductor 356 can be inhibited and diffusion of hydrogen from the transistor 300 into the transistor OS1 can be prevented.

The transistor OS1 and the insulator 280 are provided over the insulator 214. Note that the transistor OS1 illustrated in FIG. 29 is only an example and is not limited to the structure illustrated therein; an appropriate transistor may be used in accordance with a circuit structure or a driving method.

An insulator 282, an insulator 284, and an insulator 410 are sequentially stacked over the insulator 280. A conductor 244 and the like are embedded in the insulator 220, the insulator 222, the insulator 224, the insulator 280, the insulator 282, the insulator 284, and the insulator 410. Note that the conductor 244 functions as a plug or a wiring that is electrically connected to the capacitor 400, the transistor OS1, or the transistor 300. The conductor 244 can be formed using a material similar to that used for forming the conductor 328 and the conductor 330.

A material having a barrier property against oxygen or hydrogen is preferably used for one or both of the insulator 282 and the insulator 284.

As the insulator 282, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor OS1 in and after a manufacturing process of the transistor. In addition, release of oxygen from oxide in the transistor OS1 can be prevented. Therefore, aluminum oxide is suitably used for a protective film for the transistor OS1.

The insulator 284 is preferably formed using, for example, a film having a barrier property that prevents hydrogen or impurities from diffusing from a region where the capacitor 400 is formed into a region where the transistor OS1 is formed.

As an example of the film having a barrier property against hydrogen, silicon nitride formed by a CVD method can be given. Diffusion of hydrogen into a semiconductor element including an oxide semiconductor, such as the transistor OS1, degrades the characteristics of the semiconductor element in some cases. Therefore, a film that prevents hydrogen diffusion is preferably provided between the transistor OS1 and the transistor 300. Specifically, the film that prevents hydrogen diffusion is a film from which hydrogen is less likely to be released.

The capacitor 400 and a conductor 424 are provided over the insulator 410. The capacitor 400 is provided over the insulator 410 and includes a conductor 412, an insulator 430, an insulator 432, an insulator 434, and a conductor 416. Note that the conductor 424 functions as a plug or a wiring that is electrically connected to the capacitor 400, the transistor OS1, or the transistor 300.

The conductor 412 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 412 is formed concurrently with another component such as a conductor, copper, aluminum, or the like which is a low-resistance metal material may be used.

Note that the conductor 424 can be formed using a material similar to that used for forming the conductor 412 functioning as an electrode of the capacitor.

The insulator 430, the insulator 432, and the insulator 434 are provided over the conductor 424 and the conductor 412. The insulator 430, the insulator 432, and the insulator 434 may be formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like. Although a three-layer structure is illustrated in the figure, a single-layer structure or a stacked-layer structure of two layers, four layers, or more layers may be used.

For example, it is preferable that a high dielectric strength material such as silicon oxynitride be used for each of the insulator 430 and the insulator 434. Moreover, it is preferable that a high dielectric constant (high-k) material such as aluminum oxide is used for the insulator 432. In the capacitor 400 having the structure, a sufficient capacitance can be provided because of a high dielectric constant (high-k) insulator, and the dielectric strength can be increased and the electrostatic breakdown of the capacitor 400 can be prevented because of an insulator with high dielectric strength.

The conductor 416 is provided over the conductor 412 with the insulator 430, the insulator 432, and the insulator 434 provided therebetween. Note that the conductor 416 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 416 is formed concurrently with another component such as a conductor, copper, aluminum, or the like which is a low-resistance metal material may be used.

For example, as illustrated in FIG. 29, the insulator 430, the insulator 432, and the insulator 434 are provided to cover a top surface and side surfaces of the conductor 412. Furthermore, the conductor 416 is provided to cover the top surface and the side surfaces of the conductor 412 with the insulator 430, the insulator 432, and the insulator 434 provided therebetween.

That is, a capacitance is formed also on the side surfaces of the conductor 412, so that a capacitance per projected area of a capacitor can be increased. Thus, the semiconductor device can be reduced in area, highly integrated, and miniaturized.

An insulator 450 is provided over the conductor 416 and the insulator 434. The insulator 450 can be formed using a material similar to that used for forming the insulator 320. The insulator 450 covering the capacitor 400 may function as a planarization film that covers a roughness thereunder.

With the use of the above structure, a change in electrical characteristics can be prevented and reliability can be improved in a semiconductor device including an OS transistor. A semiconductor device with low power consumption can be provided.

(Embodiment 5)

In this embodiment, the structure of an oxide semiconductor that can be used for the transistor OS1 described in Embodiments 1 and 2 will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The terms "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

<CAAC-OS>

First, a CAAC-OS will be described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31°. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), a peak is not clearly observed. In contrast, in the case where single crystal InGaZnO$_4$ is subjected to φ scan with 2θ fixed at around 56°, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern including a spot derived from the (009) plane of the InGaZnO$_4$ crystal is obtained. Thus, the electron diffraction also indicates that pellets included in the CAAC-OS have c-axis alignment and that the c-axes are aligned in a direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. It is found that the a-axes and b-axes of the pellets included in the CAAC-OS do not have regular orientation.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

From the high-resolution TEM image, pellets in which metal atoms are arranged in a layered manner can be observed. The size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

The pellet having a hexagonal shape is observed. Note that the shape of the pellet is not always a regular hexagon but is a non-regular hexagon in many cases.

A clear crystal grain boundary cannot be observed in the CAAC-OS. In the CAAC-OS, a lattice arrangement is distorted so that formation of a crystal grain boundary is inhibited. This is probably because the CAAC-OS can tolerate distortion owing to a low density of arrangement of oxygen atoms in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS will be described.

Analysis of an nc-OS by XRD is described. When the structure of an nc-OS is analyzed by an out-of-plane method, a peak indicating orientation does not appear. That is, a crystal of an nc-OS does not have orientation.

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) is observed. When an electron beam with a probe diameter of 1 nm is incident on the same sample, a plurality of spots are observed in the ring-shaped region. In other words, ordering in an nc-OS is not observed with an electron beam with a probe diameter of 50 nm but is observed with an electron beam with a probe diameter of 1 nm.

Furthermore, an electron diffraction pattern in which spots are arranged in an approximately regular hexagonal shape is observed in some cases when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

The a-like OS contains a void and thus has an unstable structure.

Growth of the crystal part in the a-like OS might be induced by electron irradiation, for example. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

(Embodiment 6)

Described in this embodiment is a CPU in which the semiconductor device or the memory device described in the above embodiments can be used.

Figure 30:
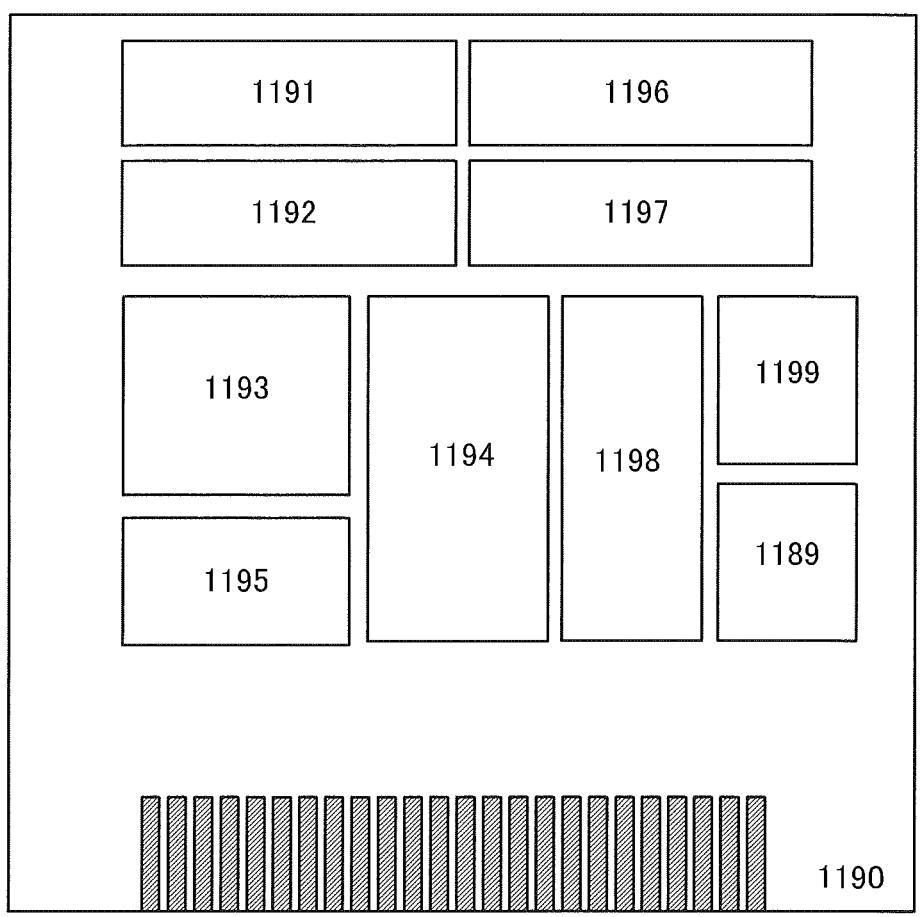
FIG. 30 is a block diagram illustrating a configuration example of a CPU.

FIG. 30 is a block diagram illustrating a structure example of a CPU. The CPU illustrated in FIG. 30 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM IX) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 30 is only an example in which the structure is simplified, and an actual CPU may have a variety of structures depending on the application. For example, the CPU may have the following structure: a structure including the CPU illustrated in FIG. 30 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 30, a memory cell is provided in the register 1196. For the memory cell of the register 1196, any of the semiconductor devices or the memory devices described in the above embodiments can be used.

In the CPU illustrated in FIG. 30, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of the power supply voltage to the memory cell in the register 1196 can be stopped. As a result, the power consumption of the CPU can be reduced.

(Embodiment 7)

In this embodiment, a programmable logic device (PLD) that can be formed using any of the semiconductor devices and the memory devices described in the above embodiments will be described.

A PLD has a structure in which adequate-scale logic circuits (logic blocks, or programmable logic elements) are electrically connected to each other by a routing resource, and the functions of the logic blocks and the connection between the logic blocks can be changed after manufacture. The functions of the logic blocks and the connection between the logic blocks formed using a routing resource are determined by structure data, and the structure data is stored in a register included in each logic block or a register included in the routing resource. A register for storing structure data is hereinafter referred to as a structure memory.

Figure 31A:
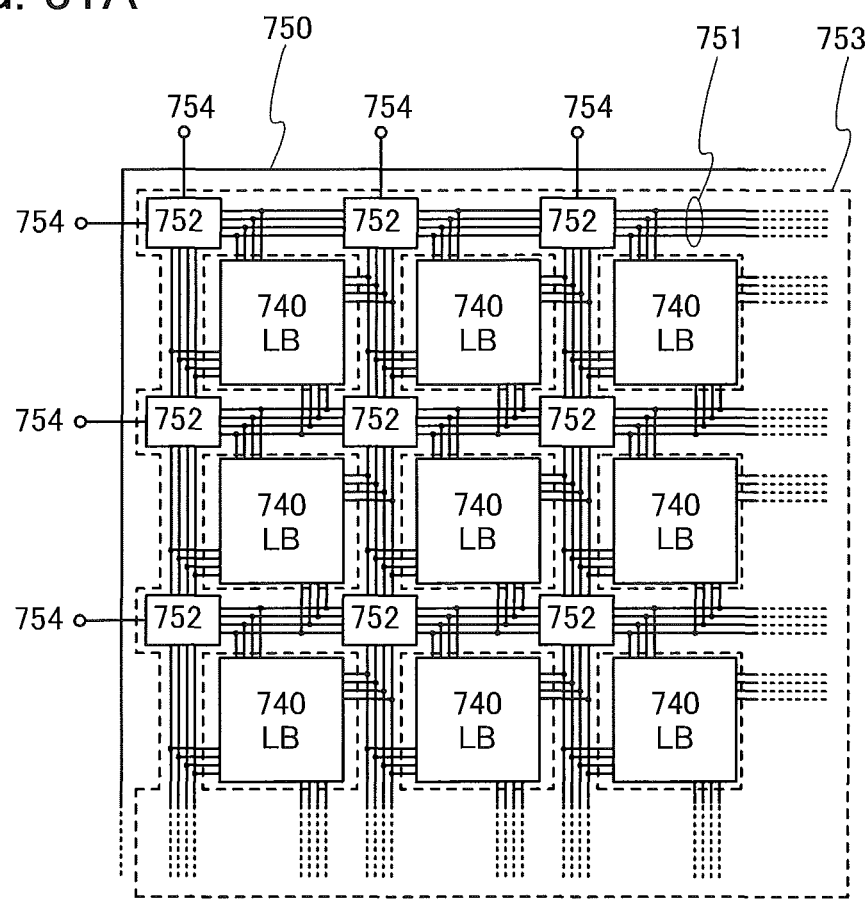
FIGS. 31A and 31B are a block diagram and a circuit diagram illustrating a configuration example of a PLD.

FIG. 31A schematically illustrates part of the structure of a PLD 750. The PLD 750 in FIG. 31A includes a plurality of logic blocks (LB) 740, a wiring group 751 connected to any of the plurality of logic blocks 740, switch circuits 752 for controlling the connection between the wirings of the wiring group 751, and terminals 754. The wiring group 751 and the switch circuits 752 constitute a routing resource 753.

Figure 31B:
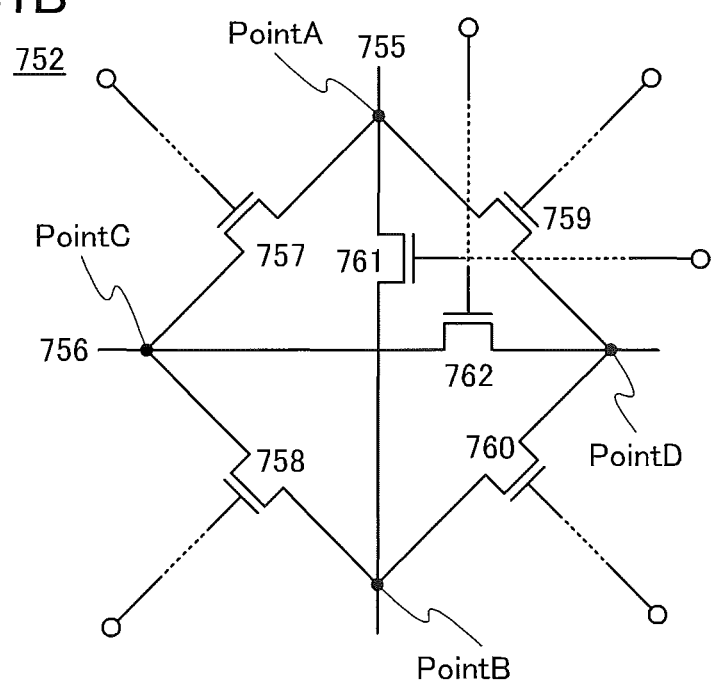

FIG. 31B illustrates a structure example of the switch circuit 752. The switch circuit 752 in FIG. 31B has a function of controlling connection between a wiring 755 and a wiring 756 included in the wiring group 751. Specifically, the switch circuit 752 includes transistors 757 to 762.

The transistor 757 has a function of controlling electrical connection between a point A of the wiring 755 and a point C of the wiring 756. The transistor 758 has a function of controlling electrical connection between a point B of the wiring 755 and the point C of the wiring 756. The transistor 759 has a function of controlling electrical connection between the point A of the wiring 755 and a point D of the wiring 756. The transistor 760 has a function of controlling electrical connection between the point B of the wiring 755 and the point D of the wiring 756. The transistor 761 has a function of controlling electrical connection between the point A and the point B of the wiring 755. The transistor 762 has a function of controlling electrical connection between the point C and the point D of the wiring 756.

The switch circuits 752 also have a function of controlling electrical connection between the wiring group 751 and the terminals 754 of the PLD 750.

Figure 32A:
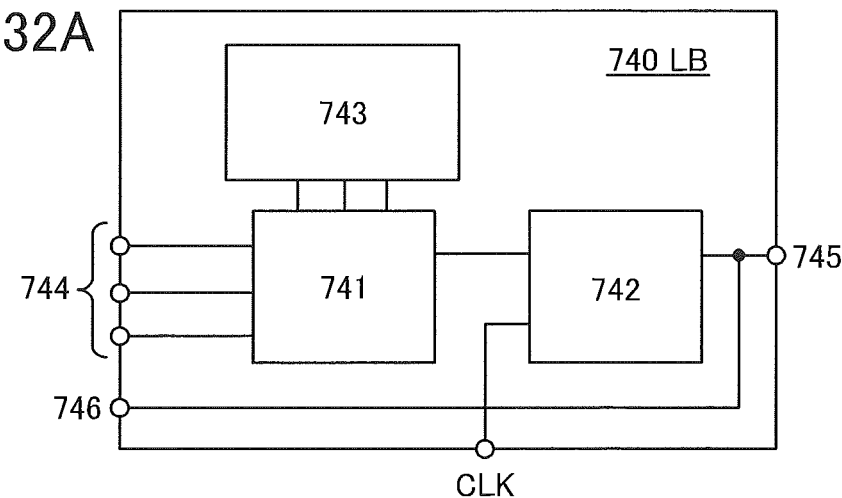
FIGS. 32A to 32C are block diagrams each illustrating a configuration example of a logic block.

FIG. 32A illustrates one mode of the logic block 740. The logic block 740 illustrated in FIG. 32A includes a look-up table (LUT) 741, a flip-flop 742, and a memory circuit 743. Logical operation of the LUT 741 is determined in accordance with structure data in the memory circuit 743. Specifically, one output value of the LUT 741 with respect to input values of a plurality of input signals supplied to input terminals 744 is determined. Then, the LUT 741 outputs a signal including the output value. The flip-flop 742 holds the signal output from the LUT 741 and outputs an output signal corresponding to the signal from a first output terminal 745 and a second output terminal 746 in synchronization with a signal CLK.

Note that the logic block 740 may further include a multiplexer circuit. The multiplexer circuit can select whether the output signal from the LUT 741 goes through the flip-flop 742.

The type of the flip-flop 742 may be determined by structure data. Specifically, the flip-flop 742 may have a function of any of a D flip-flop, a T flip-flop, a JK flip-flop, and an RS flip-flop, depending on the structure data.

Figure 32B:
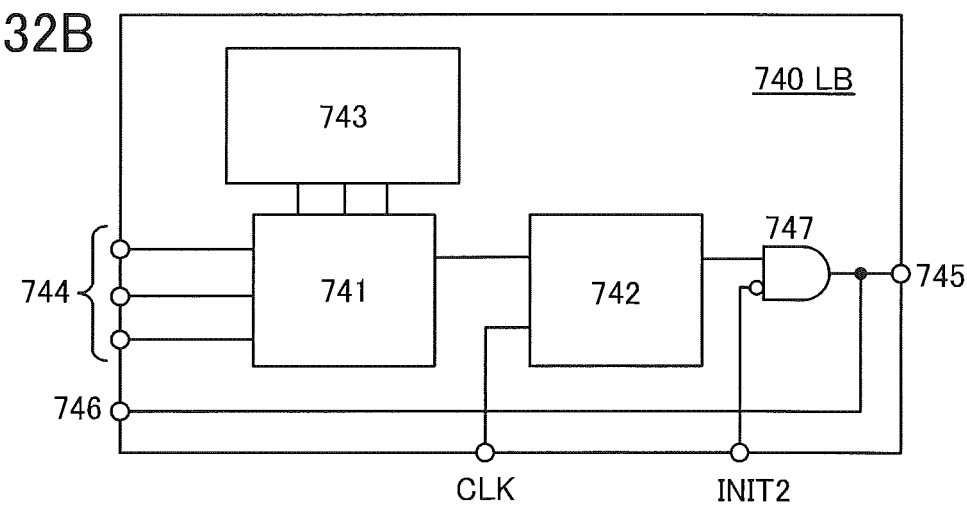

FIG. 32B illustrates another mode of the logic block 740. The logic block 740 in FIG. 32B has a structure in which an AND circuit 747 is added to the logic block 740 in FIG. 32A. To the AND circuit 747, a signal from the flip-flop 742 is supplied as a positive logic input, and a signal INIT2 is supplied as a negative logic input. With such a structure, the potential of a wiring to which a signal output from the logic block 740 is supplied can be initialized. Consequently, flow of a large amount of current between the logic blocks 740 can be prevented, so that breakage of the PLD can be prevented.

Figure 32C:
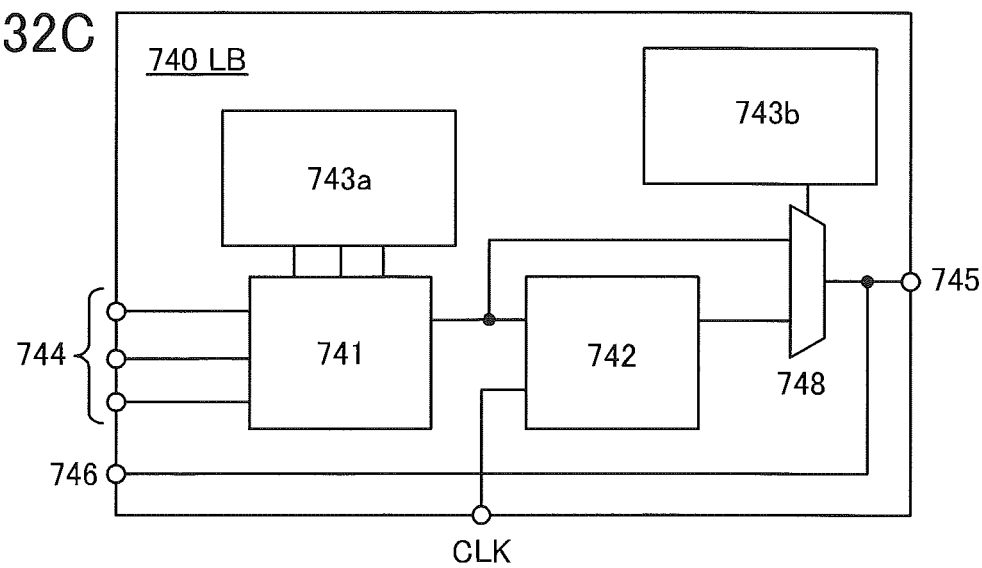

FIG. 32C illustrates another mode of the logic block 740. The logic block 740 in FIG. 32C has a structure in which a multiplexer 748 is added to the logic block 740 in FIG. 32A. The logic block 740 in FIG. 32C includes two memory circuits 743 (memory circuits 743a and 743b). Logical operation of the LUT 741 is determined in accordance with structure data in the memory circuit 743a. A signal output from the LUT 741 and a signal output from the flip-flop 742 are input to the multiplexer 748. The multiplexer 748 has functions of selecting and outputting one of the two output signals in accordance with structure data stored in the memory circuit 743b. The signal output from the multiplexer 748 is output from the first output terminal 745 and the second output terminal 746.

Figure 33:
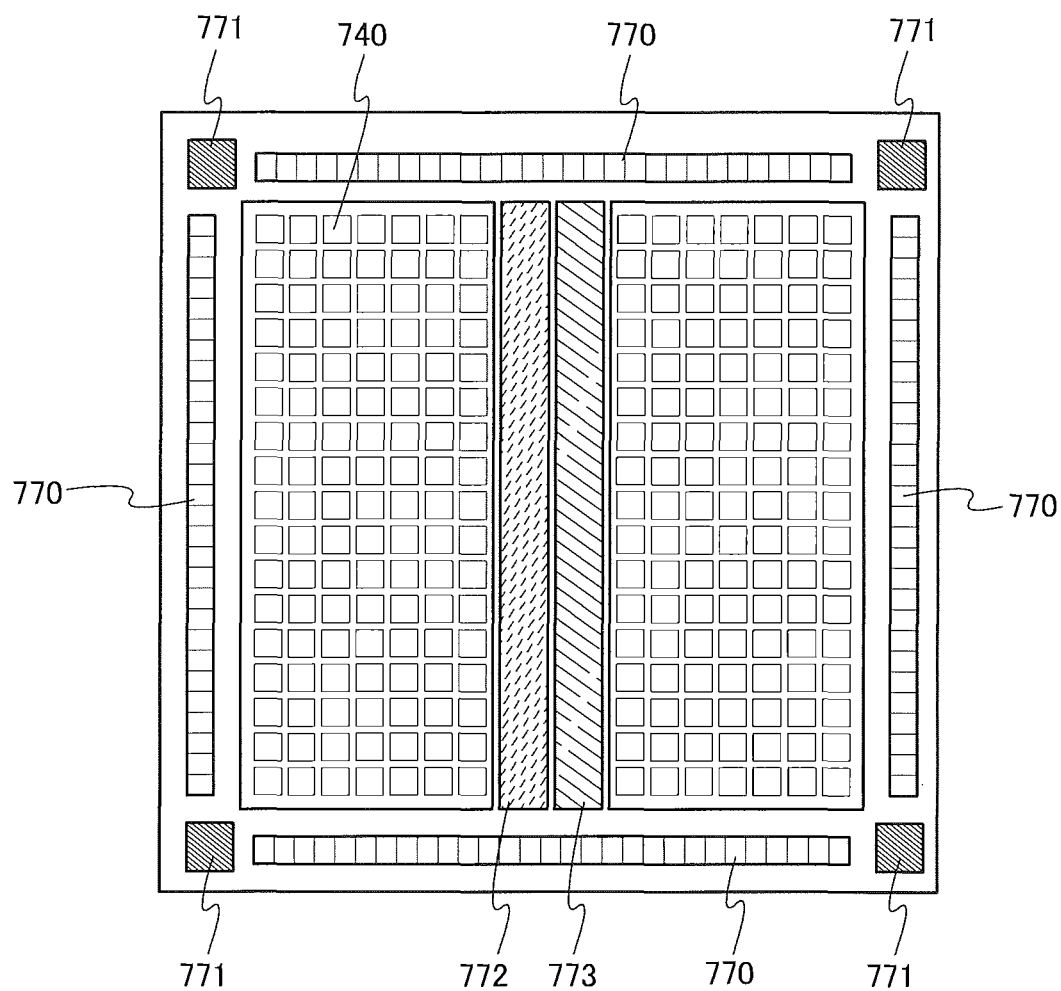
FIG. 33 is a block diagram illustrating a structure example of a PLD.

FIG. 33 illustrates an example of the entire structure of the PLD 750. In FIG. 33, I/O elements 770, phase lock loops (PLL) 771, a RAM 772, and a multiplier 773 are provided in the PLD 750. The I/O elements 770 function as interfaces that control input and output of signals from and to an external circuit of the PLD 750. The PLL 771 has a function of generating a signal CLK. The RAM 772 has a function of storing data used for logic operation. The multiplier 773 is a logic circuit dedicated to multiplication. When the PLD 750 has a function of executing multiplication, the multiplier 773 is not necessarily provided.

The memory circuits or the flip-flop in the logic block 740 can be formed using any of the semiconductor devices and the memory devices described in the above embodiments. With the use of any of the semiconductor devices and the memory devices described in the above embodiments, data can be retained even when the logic block 740 is powered off; thus, the power consumption can be reduced.

(Embodiment 8)

In this embodiment, application examples of the semiconductor device described in the foregoing embodiment to an electronic component and to an electronic device including the electronic component will be described with reference to FIGS. 34A and 34B and FIGS. 35A and 35B.

[Semiconductor Wafer and Chip]

Figure 34A:
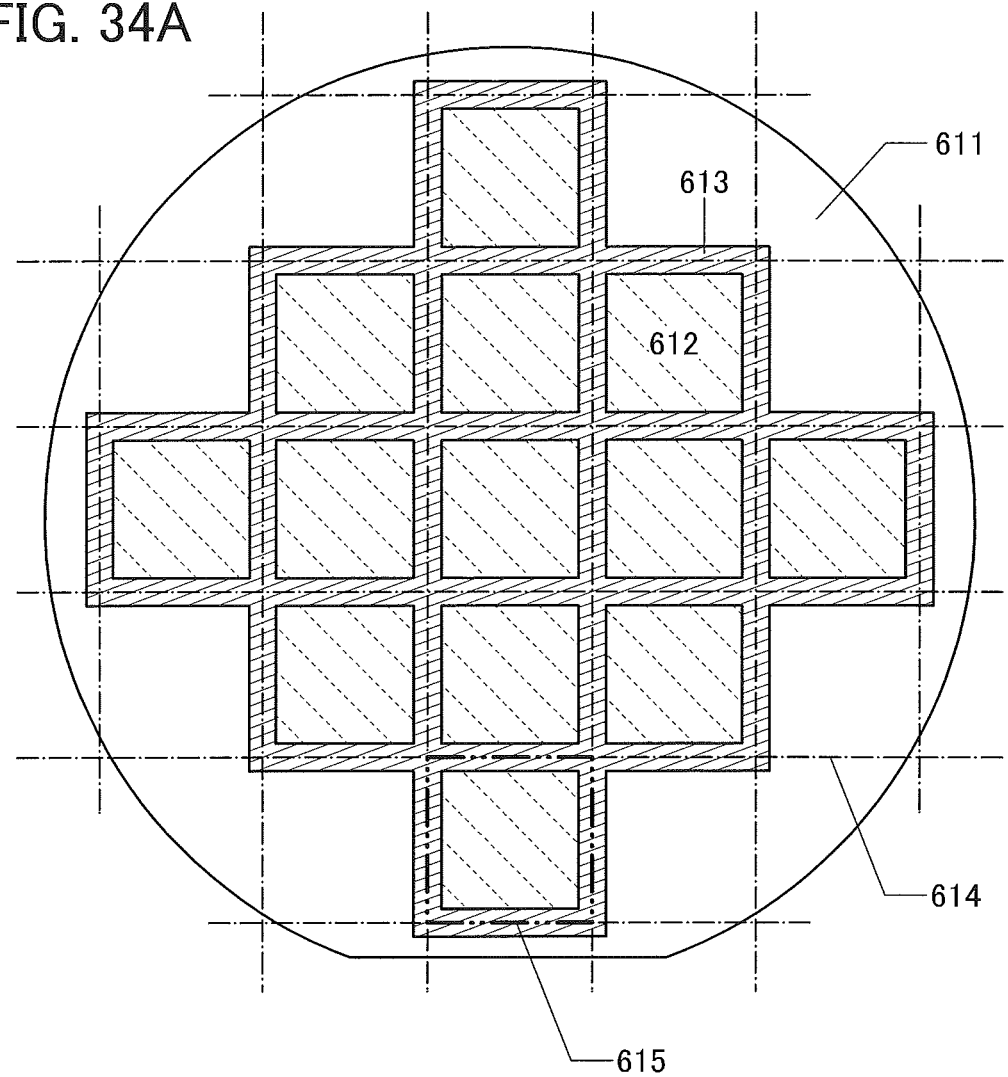
FIGS. 34A and 34B are top views of a semiconductor wafer.

FIG. 34A is a top view illustrating a substrate 611 before dicing treatment. As the substrate 611, a semiconductor substrate (also referred to as a "semiconductor wafer") can be used, for example. A plurality of circuit regions 612 are provided on the substrate 611. The semiconductor device or the like described in any of the above embodiments can be provided in the circuit regions 612.

Figure 34B:
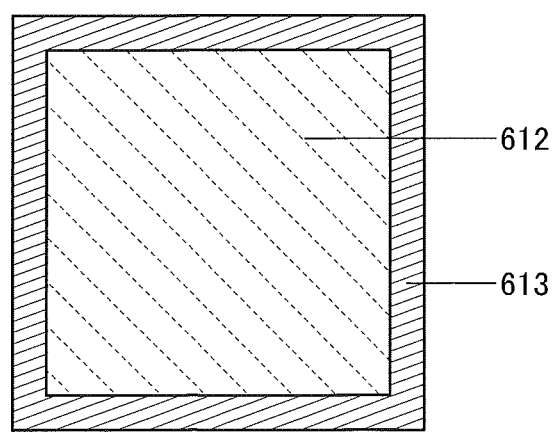

The circuit regions 612 are each surrounded by a separation region 613. Separation lines (also referred to as "dicing lines") 614 are set at a position overlapping with the separation regions 613. The substrate 611 can be cut along the separation lines 614 into chips 615 including the circuit regions 612. FIG. 34B is an enlarged view of the chip 615.

A conductive layer or a semiconductor layer may be provided in the separation regions 613. Providing a conductive layer or a semiconductor layer in the separation regions 613 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 613 allows a reduction in the usage of the pure water. Therefore, the cost of manufacturing semiconductor devices can be reduced. In addition, semiconductor devices can be manufactured with improved productivity.

For a semiconductor layer provided in the separation regions 613, a material whose band gap is greater than or equal to 2.5 eV and less than or equal to 4.2 eV, preferably greater than or equal to 2.7 eV and less than or equal to 3.5 eV is preferably used. The use of such a material allows accumulated charges to be released slowly; thus, the rapid move of charges due to ESD can be suppressed and electrostatic breakdown is less likely to occur.

[Electronic Component]

Figure 35A:
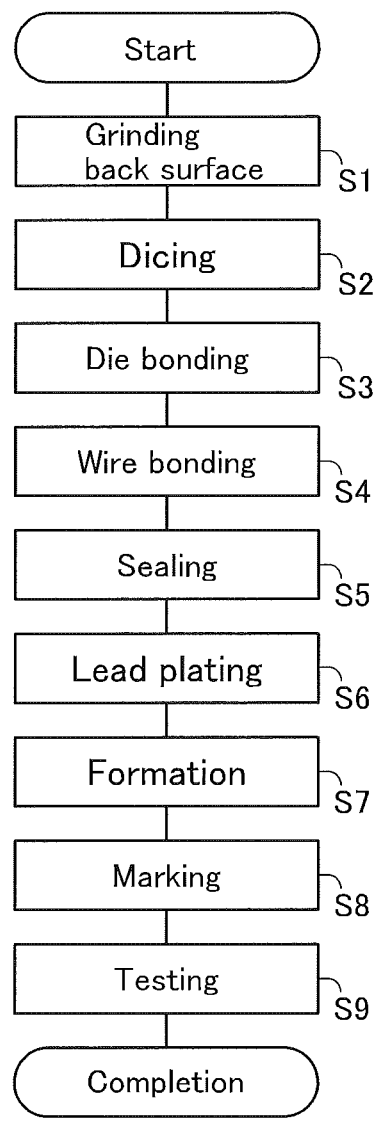
FIG. 35A is a flow chart showing manufacturing steps of a semiconductor device and FIG. 35B is a schematic perspective view of the semiconductor device.
Figure 35B:
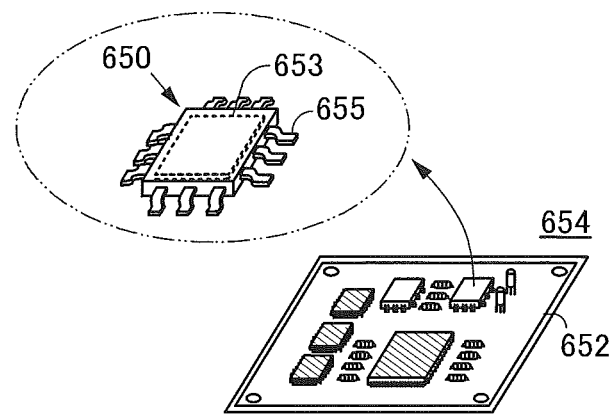

FIGS. 35A and 35B illustrate an example where the chip 615 is used to make an electronic component. Note that the electronic component is also referred to as a semiconductor package or an IC package. This electronic component has a plurality of standards and names depending on a terminal extraction direction and a terminal shape.

The electronic component is completed when the semiconductor device described in any of the above embodiments is combined with components other than the semiconductor device in an assembly process (post-process).

The post-process will be described with reference to a flow chart in FIG. 35A. After an element substrate including the semiconductor device described in any of the above embodiments is completed in a pre-process, a back surface grinding step in which a back surface (a surface where a semiconductor device and the like are not formed) of the element substrate is ground is performed (Step S1). When the element substrate is thinned by grinding, warpage or the like of the element substrate is reduced, so that the size of the electronic component can be reduced.

Next, the element substrate is divided into a plurality of chips in a dicing step (Step S2). Then, the separated chips are individually picked up to be bonded to a lead frame in a die bonding step (Step S3). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, the lead of the lead frame is plated in a lead plating step (Step S6). This plating process prevents rust of the lead and facilitates soldering at the time of providing the chip on a printed circuit board in a later step. Then, the lead is cut and processed in a formation step (Step S7).

Next, a printing (marking) step is performed on a surface of the package (Step S8). After a testing step (Step S9) for checking whether an external shape is good and whether there is a malfunction, for example, the electronic component is completed.

FIG. 35B is a perspective schematic diagram of a completed electronic component. FIG. 35B is a perspective schematic diagram illustrating a quad flat package (QFP) as an example of the electronic component. An electronic component 650 in FIG. 35B includes a lead 655 and a semiconductor device 653. As the semiconductor device 653, the semiconductor device described in any of the above embodiments can be used.

The electronic component 650 in FIG. 35B is provided on a printed circuit board 652, for example. A plurality of electronic components 650 that are combined and electrically connected to each other over the printed circuit board 652; thus, a substrate 654 on which the electronic components are provided is completed. The completed substrate 654 is provided in an electronic device or the like.

(Embodiment 9)

The semiconductor device of one embodiment of the present invention can be used for vehicles such as an automobile, a motorcycle, and a bicycle, aircrafts, ships, and the like. The semiconductor device of one embodiment of the present invention can also be used for electronic devices such as a cellular phone, a wristwatch, a portable game machine, a portable data terminal, an e-book reader, a video camera, a digital still camera, and a goggle-type display (head-mounted display). Specific examples of them are illustrated in FIGS. 36A to 36F.

Figure 36A:
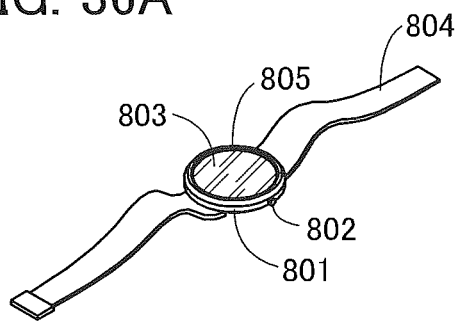
FIGS. 36A to 36F are perspective views each illustrating an example of an electronic device.

FIG. 36A illustrates a wristwatch-type terminal, which includes a housing 801, a winder 802, a display portion 803, a belt 804, a sensor portion 805, and the like. The display portion 803 may include a touch panel. A user can input data by using finger touching the touch panel as a pointer.

The sensor portion 805 is configured to acquire data by determining the surrounding state. For example, a camera, an acceleration sensor, a direction sensor, a pressure sensor, a temperature sensor, a humidity sensor, an illuminance sensor, or a global positioning system (GPS) signal receiving circuit can be used as the sensor portion 805.

For example, when an arithmetic device in the housing 801 determines that the ambient light level measured by an illuminance sensor of the sensor portion 805 is sufficiently higher than the predetermined illuminance, a reflective liquid crystal element is used as a display element of the display portion 803. In the case where the arithmetic device determines that the ambient light level is not sufficiently high, an organic EL element is used as a display element of the display portion 803. Thus, image data can be displayed in such a manner that, for example, a reflective display element is used in an environment with strong external light and a self-luminous display element is used in a dim environment. As a result, the power consumption of the electronic device can be reduced.

Figure 36B:
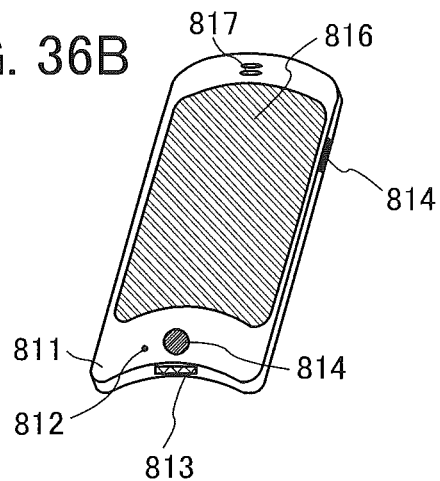

FIG. 36B illustrates a cellular phone, which includes a housing 811, a display portion 816, operation buttons 814, an external connection port 813, a speaker 817, a microphone 812, and the like. When the display portion 816 of the cellular phone illustrated in FIG. 36B is touched with a finger or the like, data can be input. Further, operations such as making a call and inputting a character can be performed by touch on the display portion 816 with a finger or the like. The power can be turned on or off with the operation button 814. In addition, types of images displayed on the display portion 816 can be switched; for example, switching images from a mail creation screen to a main menu screen is performed with the operation button 814.

Figure 36C:
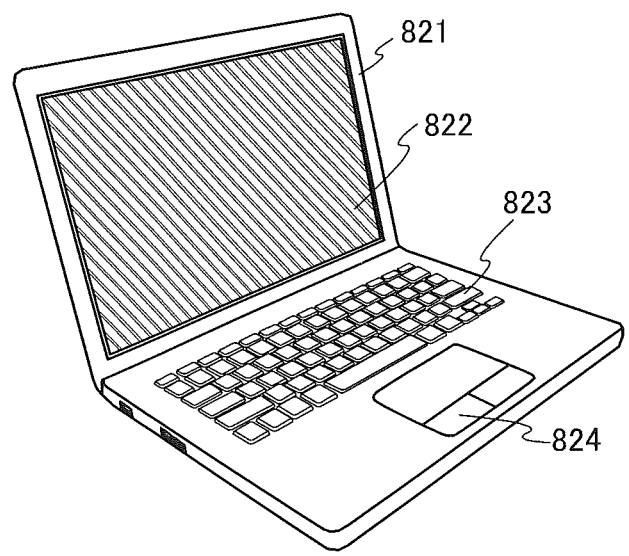

FIG. 36C illustrates a notebook personal computer, which includes a housing 821, a display portion 822, a keyboard 823, a pointing device 824, and the like.

Figure 36D:
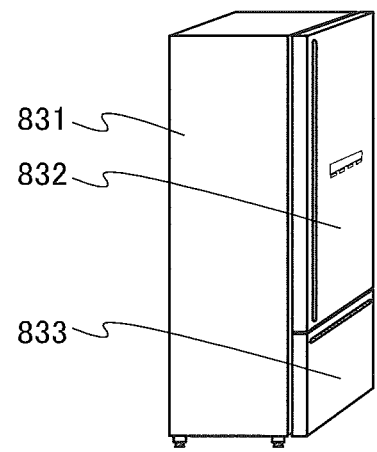

FIG. 36D illustrates an electric refrigerator-freezer, which includes a housing 831, a refrigerator door 832, a freezer door 833, and the like.

Figure 36E:
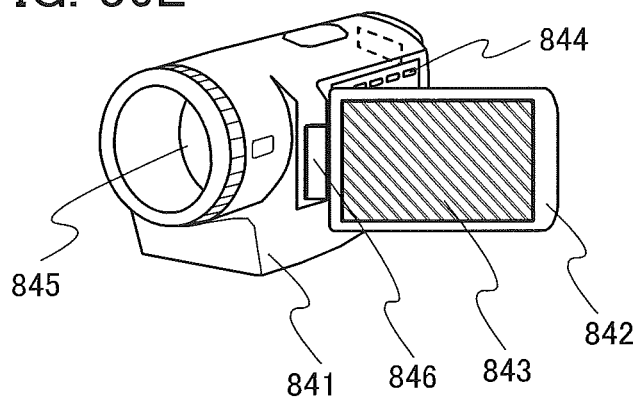

FIG. 36E illustrates a video camera, which includes a first housing 841, a second housing 842, a display portion 843, operation keys 844, a lens 845, a joint 846, and the like. The operation keys 844 and the lens 845 are provided for the first housing 841, and the display portion 843 is provided for the second housing 842. The first housing 841 and the second housing 842 are connected to each other with the joint 846, and the angle between the first housing 841 and the second housing 842 can be changed with the joint 846. Images displayed on the display portion 843 may be switched in accordance with the angle at the joint 846 between the first housing 841 and the second housing 842.

Figure 36F:
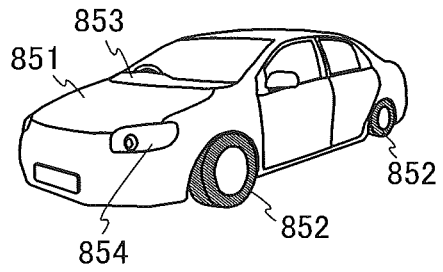
Figure 37A:
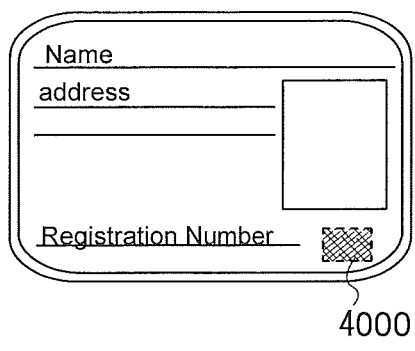
FIGS. 37A to 37F are perspective views each illustrating a usage example of an RF tag.
Figure 37B:
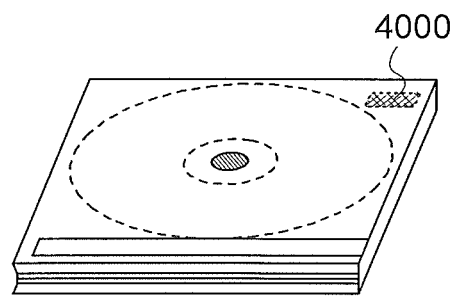
Figure 37C:
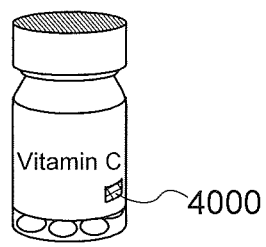
Figure 37D:
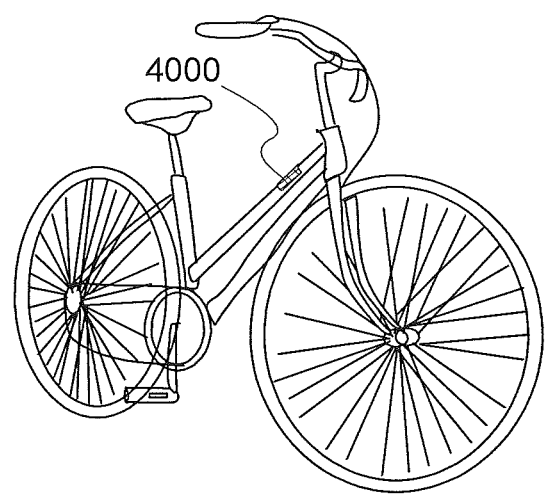
Figure 37E:
Figure 37F:
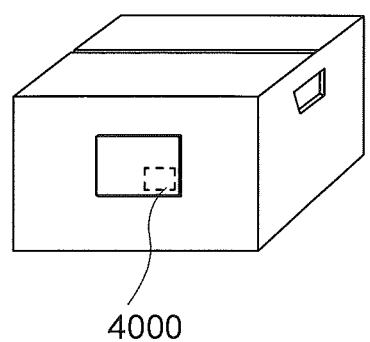

FIG. 36F illustrates a car, which includes a car body 851, wheels 852, a dashboard 853, lights 854, and the like.

(Embodiment 10)

In this embodiment, application examples of an RF tag that can be formed using the semiconductor device of one embodiment of the present invention will be described with reference to FIGS. 37A to 37F. The RF tag is widely used and can be provided for, for example, products such as bills, coins, securities, bearer bonds, documents (e.g., driver's licenses or resident's cards, see FIG. 37A), recording media (e.g., DVDs or video tapes, see FIG. 37B), packaging containers (e.g., wrapping paper or bottles, see FIG. 37C), vehicles (e.g., bicycles, see FIG. 37D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 37E and 37F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RF tag can be suitably used for application in which data is not frequently written or read.

In this specification and the like, ordinal numbers such as "first," "second," and "third" are used in order to avoid confusion among components. Thus, the terms do not limit the number or order of components. Thus, the terms do not limit the number or order of components. In the present specification and the like, a "first" component in one embodiment can be referred to as a "second" component in other embodiments or claims. Furthermore, in this specification and the like, for example, a "first" component in one embodiment can be omitted in other embodiments or claims.

In this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases.

In this specification and the like, a switch is in a conductive state (on state) or in a non-conductive state (off state) to determine whether current flows therethrough or not. Alternatively, a switch has a function of selecting and changing a current path. Examples of the switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using micro electro mechanical systems (MEMS) technology, such as a digital micromirror device (DMD). Such a switch includes an electrode which can be moved mechanically, and operates by controlling conduction and non-conduction in accordance with movement of the electrode.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship illustrated in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path," and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial no. 2016-005991 filed with Japan Patent Office on Jan. 15, 2016, the entire contents of which are hereby incorporated by reference.

What is claimed is:

1. A semiconductor device comprising:
a first transistor comprising a first gate, a first electrode, and a second electrode,
wherein the first transistor comprises an oxide semiconductor in a channel formation region,
wherein the first gate is electrically connected to the first electrode,
wherein a negative potential is applied to the second electrode,
wherein the first electrode comprises a first end portion,
wherein the second electrode comprises a second end portion,
wherein the first gate comprises a third end portion,
wherein the first end portion and the second end portion face each other,
wherein the first end portion comprises a first arc portion when seen from the top,
wherein the second end portion comprises a second arc portion when seen from the top,
wherein the third end portion comprises a third arc portion when seen from the top,
wherein the second electrode and the third arc portion overlap with each other when seen from the top,
wherein a radius of curvature of the second arc portion is larger than a radius of curvature of the first arc portion,
wherein the first electrode is one of a source electrode and a drain electrode, and
wherein the second electrode is the other of the source electrode and the drain electrode.

2. The semiconductor device according to claim 1,
wherein the first transistor further comprises a second gate,
wherein the second gate and the first gate overlap with each other with the oxide semiconductor positioned therebetween, and
wherein the second gate comprises an In—Ga—Zn oxide to which nitrogen is added.

3. A semiconductor wafer comprising:
a plurality of the semiconductor devices according to claim 1; and
a separation region.

4. An electronic device comprising;
the semiconductor device according to claim 1, and
at least one of a display device, a microphone, a speaker, an operation key, and a housing.

5. A semiconductor device comprising:
a first transistor comprising a first gate, a first electrode, and a second electrode, wherein the first transistor comprises an oxide semiconductor in a channel formation region,
wherein the first gate is electrically connected to the first electrode,
wherein a negative potential is applied to the second electrode,
wherein the first electrode comprises a first end portion,
wherein the second electrode comprises a second end portion,
wherein the first gate comprises a third end portion,
wherein the first end portion and the second end portion face each other,
wherein the first end portion comprises a first arc portion when seen from the top,
wherein the second end portion comprises a second arc portion when seen from the top,
wherein the third end portion comprises a third arc portion when seen from the top,
wherein the second electrode and the third arc portion overlap with each other when seen from the top,
wherein the first gate is provided over the first end portion,
wherein a radius of curvature of the second arc portion is larger than a radius of curvature of the first arc portion,
wherein the first electrode is one of a source electrode and a drain electrode, and wherein the second electrode is the other of the source electrode and the drain electrode.

6. The semiconductor device according to claim 5,
wherein the first transistor further comprises a second gate,
wherein the second gate and the first gate overlap with each other with the oxide semiconductor positioned therebetween, and
wherein the second gate comprises an In—Ga—Zn oxide to which nitrogen is added.

7. A semiconductor wafer comprising:
a plurality of the semiconductor devices according to claim 5; and
a separation region.

8. An electronic device comprising;
the semiconductor device according to claim 5, and
at least one of a display device, a microphone, a speaker, an operation key, and a housing.

9. The semiconductor device according to claim 1,
wherein the first transistor further comprises a second gate,
wherein the second gate and the first gate overlap with each other, and
wherein the second gate is electrically connected to the first gate.

10. The semiconductor device according to claim 1, wherein a radius of curvature of the third arc portion is larger than the radius of curvature of the first arc portion.

11. The semiconductor device according to claim 5,
wherein the first transistor further comprises a second gate,
wherein the second gate and the first gate overlap with each other, and
wherein the second gate is electrically connected to the first gate.

12. The semiconductor device according to claim 5, wherein a radius of curvature of the third arc portion is larger than the radius of curvature of the first arc portion.

* * * * *